(12) United States Patent
Osada

(10) Patent No.: US 12,068,101 B2
(45) Date of Patent: Aug. 20, 2024

(54) ELECTRONIC COMPONENT

(71) Applicant: ROHM CO., LTD., Kyoto (JP)

(72) Inventor: Kosei Osada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/331,736

(22) Filed: Jun. 8, 2023

(65) Prior Publication Data

US 2023/0317354 A1    Oct. 5, 2023

Related U.S. Application Data

(63) Continuation of application No. 18/081,327, filed on Dec. 14, 2022, now Pat. No. 11,742,132, which is a (Continued)

(30) Foreign Application Priority Data

Mar. 8, 2019 (JP) ................................ 2019-043036

(51) Int. Cl.
*H01F 27/28* (2006.01)
*H01F 27/06* (2006.01)
*H01F 27/29* (2006.01)

(52) U.S. Cl.
CPC ......... *H01F 27/2804* (2013.01); *H01F 27/06* (2013.01); *H01F 27/29* (2013.01); *H01F 2027/2809* (2013.01)

(58) Field of Classification Search
CPC ...... H01F 27/2804; H01F 27/06; H01F 27/29; H01F 2027/2809

(Continued)

(56) References Cited

U.S. PATENT DOCUMENTS 9,576,891 B1 * 2/2017 Tao .................... H01L 23/5223
11,557,422 B2 * 1/2023 Osada ................ H01L 23/5225
(Continued)

FOREIGN PATENT DOCUMENTS

CN    103378072 A    10/2013
JP    2005340658 A    12/2005
(Continued)

OTHER PUBLICATIONS

Chinese Patent Office: First Office Action of CN 201980022970.2 (related application); Sun Lu Jie; May 9, 2023; 15 pages.

(Continued)

*Primary Examiner* — Alfonso Perez Borroto
(74) *Attorney, Agent, or Firm* — XSENSUS LLP

(57) ABSTRACT

An electronic component includes an insulating layer that has a principal surface, a passive device that includes a low voltage pattern that is formed in the insulating layer and a high voltage pattern that is formed in the insulating layer such as to oppose the low voltage pattern in a normal direction to the principal surface and to which a voltage exceeding a voltage to be applied to the low voltage pattern is to be applied, and a shield conductor layer that is formed in the insulating layer such as to be positioned in a periphery of the high voltage pattern in plan view, shields an electric field formed between the low voltage pattern and the high voltage pattern, and suppresses electric field concentration with respect to the high voltage pattern.

31 Claims, 25 Drawing Sheets

Related U.S. Application Data continuation of application No. 17/044,676, filed as application No. PCT/JP2019/050949 on Dec. 25, 2019, now Pat. No. 11,557,422.

(58) Field of Classification Search
USPC .......................................................... 307/104
See application file for complete search history.

(56) References Cited

U.S. PATENT DOCUMENTS

| | | | |
|---|---|---|---|
| 11,742,132 B2* | 8/2023 | Osada ................ | H01L 23/5227 307/104 |
| 2008/0001186 A1 | 1/2008 | Shastri et al. | |
| 2009/0244866 A1 | 10/2009 | Kawano et al. | |
| 2013/0135076 A1 | 5/2013 | Nasase | |
| 2013/0278372 A1* | 10/2013 | Stecher ............... | H01L 23/5227 336/200 |
| 2015/0115407 A1 | 4/2015 | Tao et al. | |
| 2015/0137314 A1 | 5/2015 | Osada et al. | |
| 2015/0348919 A1 | 12/2015 | Sun et al. | |
| 2016/0300907 A1 | 10/2016 | Selvaraj et al. | |
| 2017/0117217 A1* | 4/2017 | Tao ......................... | H01L 24/46 |
| 2017/0287624 A1 | 10/2017 | Osada et al. | |
| 2018/0068946 A1* | 3/2018 | Ho ......................... | H01L 23/528 |
| 2018/0226920 A1 | 8/2018 | Mukherjee et al. | |
| 2018/0308795 A1 | 10/2018 | Uchida et al. | |
| 2019/0057942 A1 | 2/2019 | Male et al. | |

FOREIGN PATENT DOCUMENTS

| | | |
|---|---|---|
| JP | 2007165343 A | 6/2007 |
| JP | 2010016142 A | 1/2010 |
| JP | 2013115131 A | 6/2013 |
| JP | 2013149940 A | 8/2013 |
| JP | 2016028407 A | 2/2016 |
| JP | 2018078169 A | 5/2018 |
| JP | 2018517283 A | 6/2018 |
| JP | 2018182223 A | 11/2018 |

OTHER PUBLICATIONS

German Patent and Trademark Office; Office Action for related application DE 11 2019 002 216.4; Dr. Fritsch; Oct. 20, 2022; 32 pages.

Japanese Patent Office: Decision to Grant a Patent of JP Patent Application No. 2020-541827 (Related Application); May 13, 2021; 5 Pgs.

Japanese Patent Office: Notice of Reasons for Refusal of JP Patent Application 2020-541827 (related application); Dec. 17, 2020; 3 pages.

Patent Cooperation Treaty International Preliminary Report on Patentability of PCT/JP2019/050949 (related application); Yukari Nakamura; Sep. 23, 2021; 13 pages.

Patent Cooperation Treaty, Japanese Patent Office Searching Authority: International Search Report and Written Opinion of PCT/JP2019/050949; Mar. 24, 2020; 10 pages.

* cited by examiner

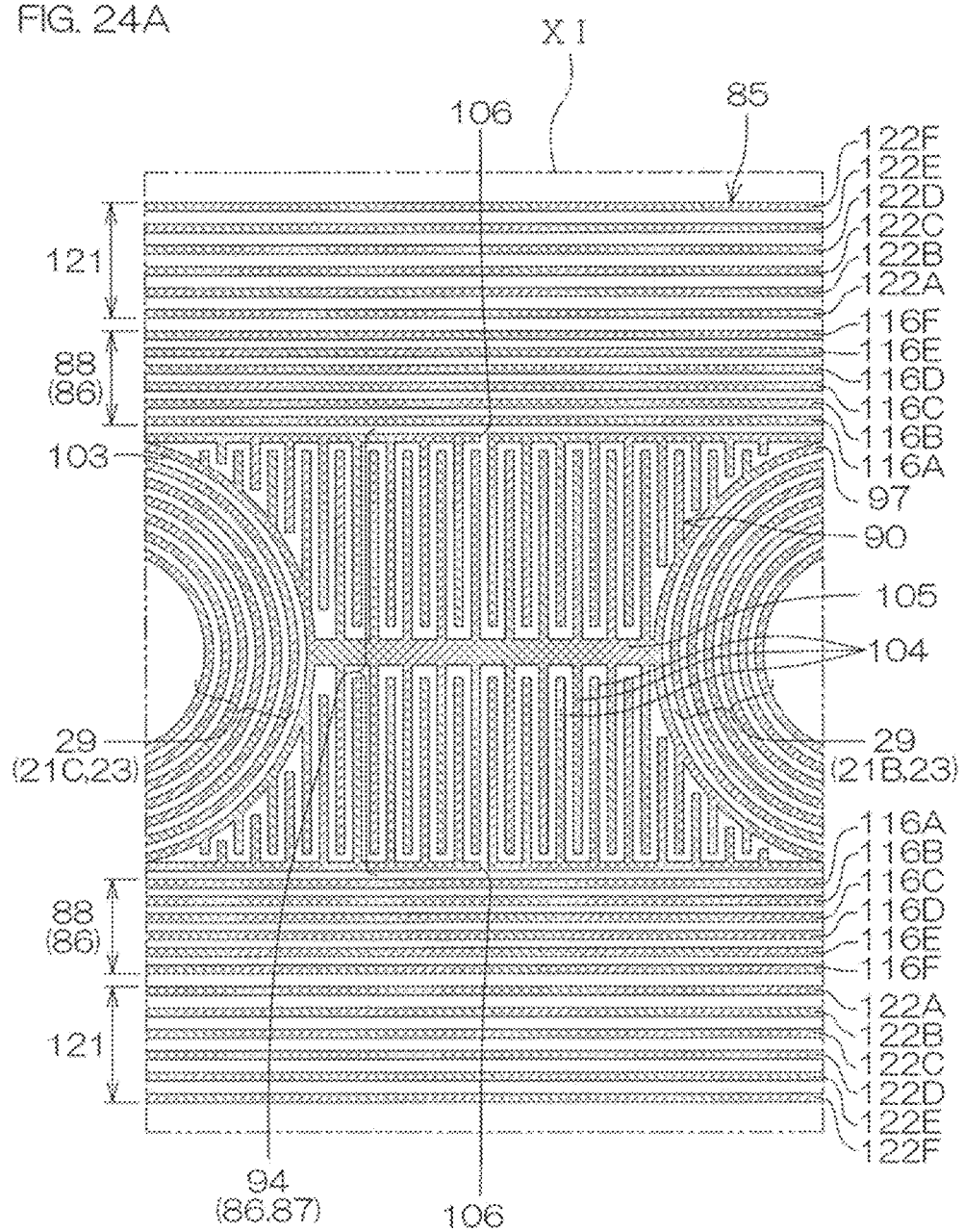

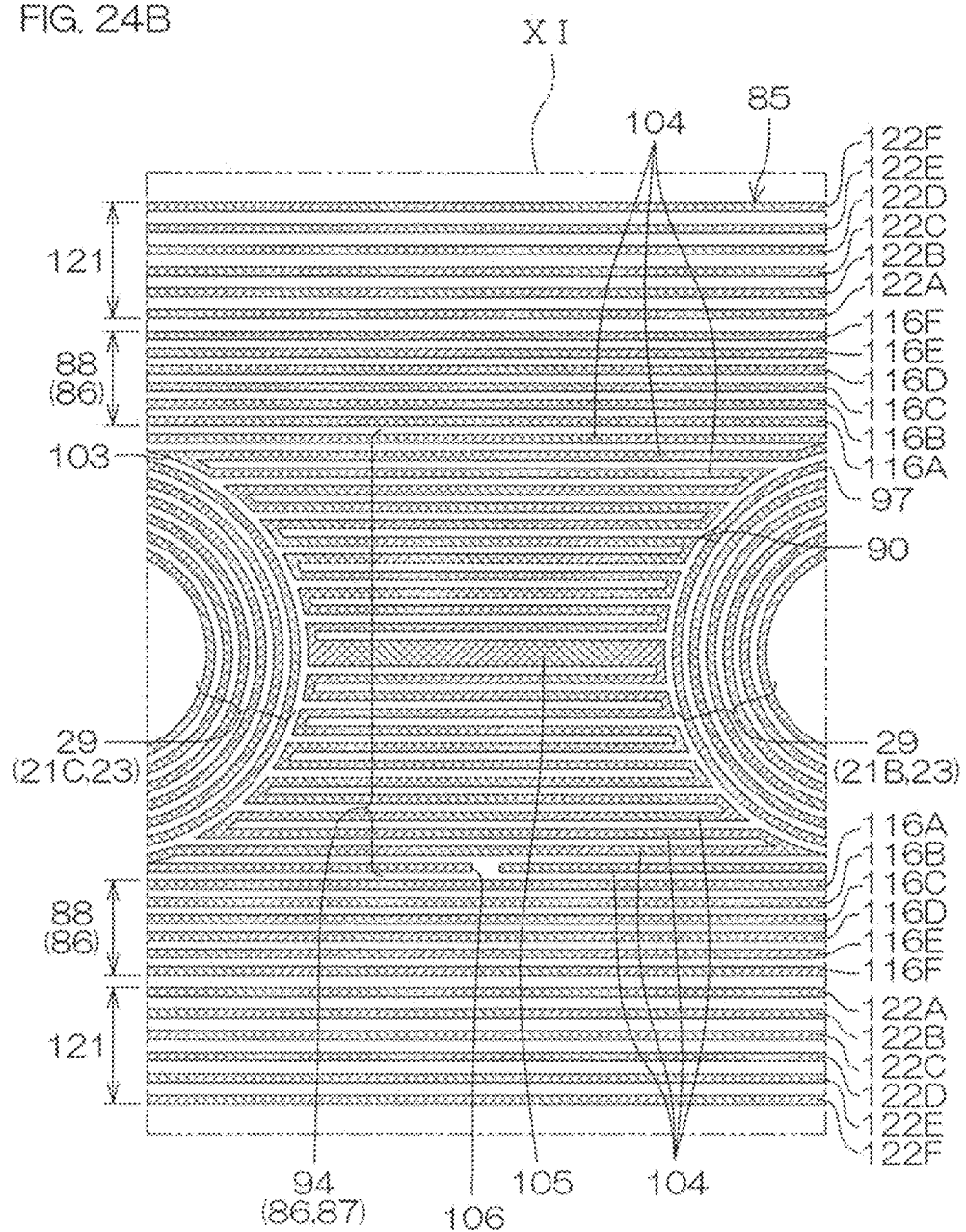

ELECTRONIC COMPONENT

CROSS-REFERENCE TO RELATED APPLICATIONS

This is a continuation of U.S. application Ser. No. 18/081,327, filed Dec. 14, 2022, entitled ELECTRONIC COMPONENT, which is a continuation of U.S. application Ser. No. 17/044,676, filed on Oct. 1, 2020, entitled ELECTRONIC COMPONENT, issued as U.S. Pat. No. 11,557,422 on Jan. 17, 2023, which is a U.S. National Phase application submitted under 35 U.S.C. § 371 of Patent Cooperation Treaty application serial no. PCT/JP2019/050949, filed on Dec. 25, 2019, entitled ELECTRONIC COMPONENT. The prior US patent applications and the present continuation application claim the benefit of priority of Japanese application No. 2019-043036, filed on Mar. 8, 2019. The disclosures of these prior US and foreign applications are incorporated herein by reference.

TECHNICAL FIELD

The present invention relates to an electronic component.

BACKGROUND ART

Patent Literature 1 discloses a transformer (passive device) having a pair of inductors (a low voltage pattern and a high voltage pattern) opposing each other in an up/down direction across an insulating layer. A low voltage is applied to one of the inductors and a high voltage is applied to the other inductor.

CITATION LIST

Patent Literature

Patent Literature 1: Japanese Patent Application Publication No. 2013-115131

SUMMARY OF INVENTION

Technical Problem

An electric field formed between a low voltage pattern and a high voltage pattern tends to concentrate at the high voltage pattern. This type of electric field concentration becomes a starting point of decrease in withstand voltage.

A preferred embodiment of the present invention provides an electronic component that enables suppression of electric field concentration at a high voltage pattern and improvement of withstand voltage.

Solution to Problem

A preferred embodiment of the present invention provides an electronic component including an insulating layer that has a principal surface, a passive device that includes a low voltage pattern that is formed in the insulating layer and a high voltage pattern that is formed in the insulating layer such as to oppose the low voltage pattern in a normal direction to the principal surface and to which a voltage exceeding a voltage to be applied to the low voltage pattern is to be applied, and a shield conductor layer that is formed in the insulating layer such as to be positioned in a periphery of the high voltage pattern in plan view, shields an electric field formed between the low voltage pattern and the high voltage pattern, and suppresses electric field concentration with respect to the high voltage pattern.

A preferred embodiment of the present invention provides an electronic component comprising, an insulating layer that has a principal surface, a plurality of passive devices that are formed in the insulating layer at an interval from each other and each include a low voltage pattern that is formed in the insulating layer and a high voltage pattern that is formed in the insulating layer such as to oppose the low voltage pattern in a normal direction to the principal surface and to which a voltage exceeding a voltage to be applied to the low voltage pattern is to be applied, and a high voltage dummy pattern that is formed in peripheries of a plurality of the high voltage patterns such as to be interposed in a region between mutually adjacent ones of the plurality of high voltage patterns in the insulating layer and to which a voltage exceeding the voltage to be applied to the low voltage patterns is to be applied.

According to these electronic components, electric field concentration at the high voltage pattern can be suppressed and withstand voltage can be improved.

The aforementioned as well as yet other objects, features, and effects of the present invention will be made clear by the following description of the preferred embodiments, with reference to the accompanying drawings.

BRIEF DESCRIPTION OF DRAWINGS

FIG. 24A is an enlarged view of a region corresponding to FIG. 11 and is a diagram of a first high voltage dummy pattern according to a first modification example.

FIG. 24B is an enlarged view of a region corresponding to FIG. 11 and is a diagram of a first high voltage dummy pattern according to a second modification example.

DESCRIPTION OF EMBODIMENTS

Figure 1:
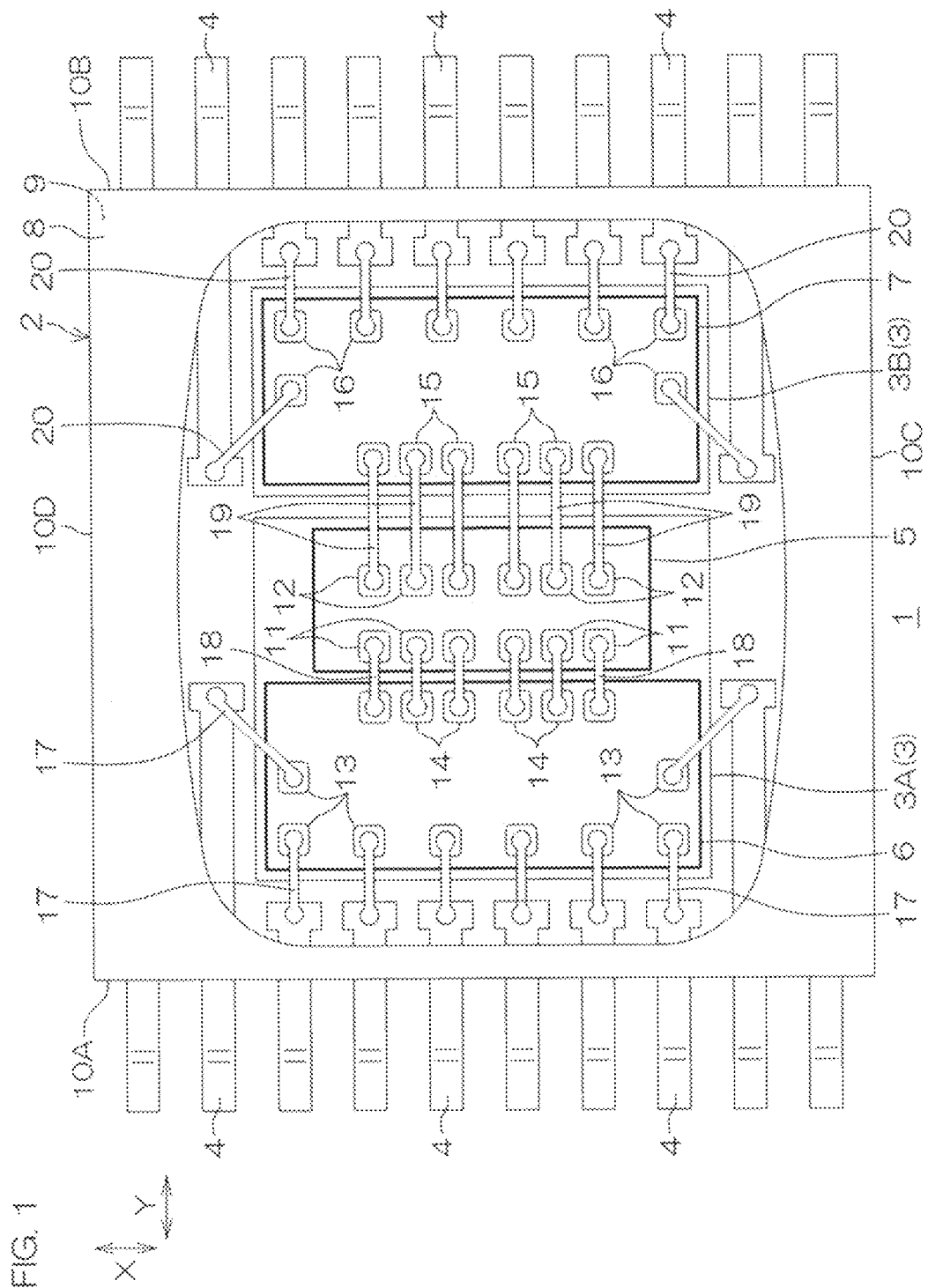
FIG. 1 is a plan view of an electronic component module in which an electronic component according to a first preferred embodiment of the present invention is incorporated.

FIG. 1 is a plan view of an electronic component module 1 in which an electronic component 5 according to a first preferred embodiment of the present invention is incorporated. In FIG. 1, a central portion of a package main body 2 is shown transparently for clarification of the internal structure.

Referring to FIG. 1, in this embodiment, a package type of the electronic component module 1 is an SOP (small outline package). The package type of the electronic component module 1 is not restricted to an SOP and any of various forms similar thereto can be adopted. The package type of the electronic component module 1 may, for example, be a QFN (quad for non lead package), a DFP (dual flat package), a DIP (dual inline package), a QFP (quad flat package), an SIP (single inline package), or an SOJ (small outline J-lead package).

In this embodiment, the electronic component module 1 is a composite type module that includes a plurality of chips. The electronic component module 1 includes the package main body 2, a plurality of die pads 3, a plurality of lead terminals 4, the electronic component 5, a controller IC chip 6, and a driver IC chip 7.

The package main body 2 includes a sealing resin. The sealing resin may include an epoxy resin. The package main body 2 is formed to a rectangular parallelepiped shape. The package main body 2 has a first surface 8 at one side, a second surface 9 at another side, and side surfaces 10A, 10B, 10C, and 10D that connect the first surface 8 and the second surface 9.

The side surface 10A and the side surface 10B extend along a first direction X and oppose each other in a second direction Y that intersects the first direction X. The side surface 10C and the side surface 10D extend along the second direction Y and oppose each other in the first direction X. More specifically, the second direction Y is orthogonal to the first direction X.

The plurality of die pads 3 are sealed in the package main body 2. In this embodiment, the plurality of die pads 3 are respectively formed to rectangular parallelepiped shapes. In this embodiment, the plurality of die pads 3 include a first die pad 3A and a second die pad 3B that are disposed at an interval along the first direction X. The first die pad 3A is disposed at the side surface 10A side of the package main body 2. The second die pad 3B is disposed at the side surface 10B side of the package main body 2.

The plurality of lead terminals 4 are respectively provided at the side surface 10A side and the side surface 10B side of the package main body 2. Each lead terminal 4 has one end portion positioned in the package main body 2 and another end portion positioned outside the package main body 2. The other end portion of each lead terminal 4 is formed as an external connection portion connected to a connection object such as a mounting substrate, etc.

The electronic component 5 is a transformer chip that boosts and outputs an electric signal that has been input. In this embodiment, the electronic component 5 is formed to a rectangular shape in plan view. The electronic component 5 is disposed at a central portion of the package main body 2.

More specifically, the electronic component 5 is disposed on the first die pad 3A in an orientation where long sides oppose the side surface 10A. On the first die pad 3A, the electronic component 5 is disposed in a region at the side surface 10B side. The positioning of the electronic component 5 is arbitrary and is not restricted to the positioning shown in FIG. 1.

The electronic component 5 has a plurality of low voltage pads 11 and a plurality of high voltage pads 12. The plurality of low voltage pads 11 are aligned at intervals along the long side of the electronic component 5 at the side surface 10A side. The plurality of high voltage pads 12 are aligned at intervals along the long side of the electronic component 5 at the side surface 10B side.

The controller IC chip 6 is a device for driving and controlling the electronic component 5. The controller IC chip 6 is a low voltage device with respect to the electronic component 5. In this embodiment, the controller IC chip 6 is formed to a rectangular shape in plan view. The controller IC chip 6 is disposed in a region at the side surface 10A side with respect to the electronic component 5.

More specifically, the controller IC chip 6 is disposed on the first die pad 3A at an interval from the electronic component 5 and in an orientation where long sides oppose the side surface 10A. On the first die pad 3A, the controller IC chip 6 is disposed in a region at the side surface 10A side. The positioning of the controller IC chip 6 is arbitrary and is not restricted to the positioning shown in FIG. 1.

The controller IC chip 6 has a plurality of first input pads 13 and a plurality of first output pads 14. The plurality of first input pads 13 are aligned at intervals along the long side of the controller IC chip 6 at the side surface 10A side. The plurality of first output pads 14 are aligned at intervals along the long side of the controller IC chip 6 at the side surface 10B side. The positioning of the plurality of first input pads 13 and the plurality of first output pads 14 is arbitrary and is not restricted to the positioning shown in FIG. 1.

The driver IC chip 7 is a device arranged to drive and control a load (for example, a switching device, etc.) by generating an electric signal that is in accordance with the electric signal from the electronic component 5. The driver IC chip 7 is a high voltage device with respect to the electronic component 5. In this embodiment, the driver IC chip 7 is formed to a rectangular shape in plan view. The driver IC chip 7 is disposed in a region at the side surface 10B side with respect to the electronic component 5.

More specifically, the driver IC chip 7 is disposed on the second die pad 3B in an orientation where long sides oppose the side surface 10B. The positioning of the driver IC chip 7 is arbitrary and is not restricted to the positioning shown in FIG. 1.

The driver IC chip 7 has a plurality of second input pads 15 and a plurality of second output pads 16. The plurality of second input pads 15 are aligned at intervals along the long side of the driver IC chip 7 at the side surface 10A side. The plurality of second output pads 16 are aligned at intervals along the long side of the driver IC chip 7 at the side surface 10B side. The positioning of the plurality of second input pads 15 and the plurality of second output pads 16 is arbitrary and is not restricted to the positioning shown in FIG. 1.

The plurality of first input pads 13 of the controller IC chip 6 are electrically connected via first lead wires 17 to one end portions of arbitrary lead terminals 4 disposed at the side surface 10A side. The plurality of first output pads 14 of the controller IC chip 6 are electrically connected via second lead wires 18 to arbitrary low voltage pads 11 of the electronic component 5. That is, the controller IC chip 6 is connected to a primary side (input side) of the electronic component 5.

The high voltage pads 12 of the electronic component 5 are electrically connected via third lead wires 19 to arbitrary second input pads 15 of the driver IC chip 7. That is, the driver IC chip 7 is connected to a secondary side (output side) of the electronic component 5. The plurality of second output pads 16 of the driver IC chip 7 are electrically connected via fourth lead wires 20 to one end portions of arbitrary lead terminals 4 disposed at the side surface 10B side. The first lead wires 17, the second lead wires 18, the third lead wires 19, and the fourth lead wires 20 may be bonding wires.

Figure 2:
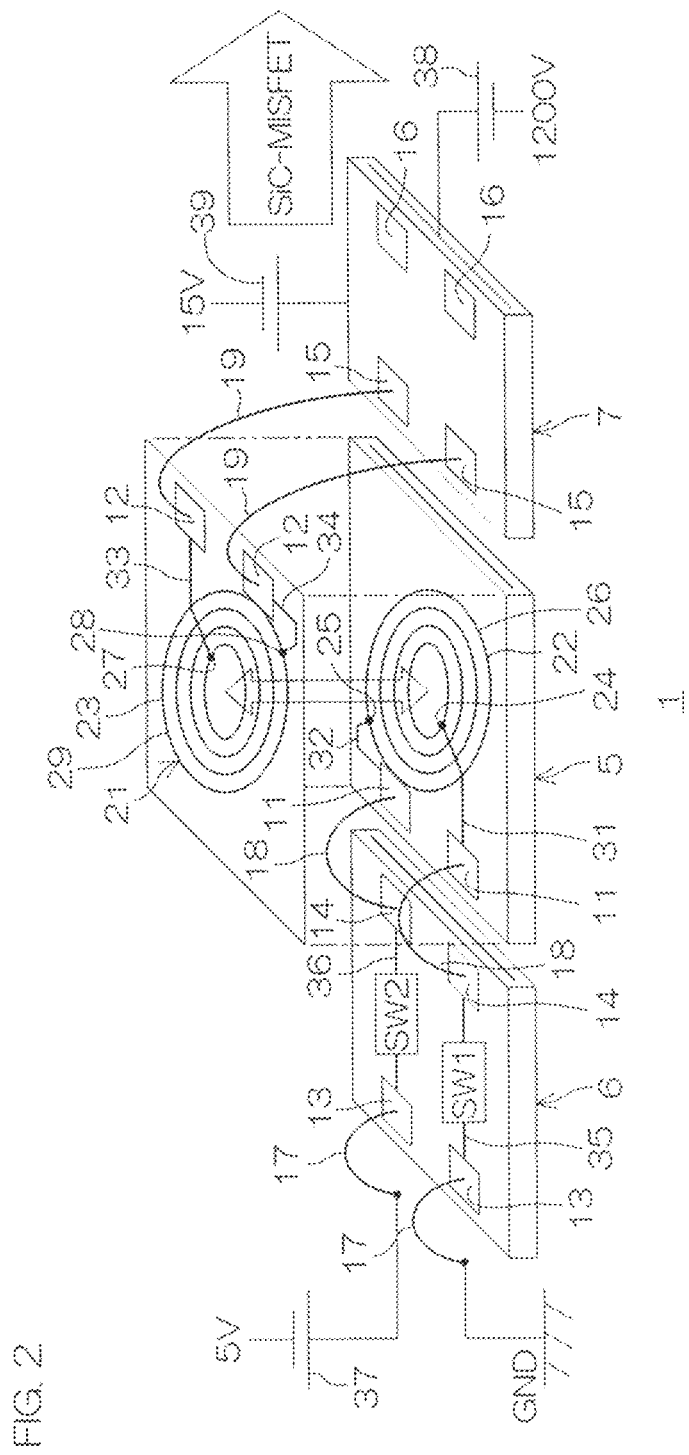
FIG. 2 is a general arrangement diagram for describing an operation of the electronic component module shown in FIG. 1.
Figure 3:
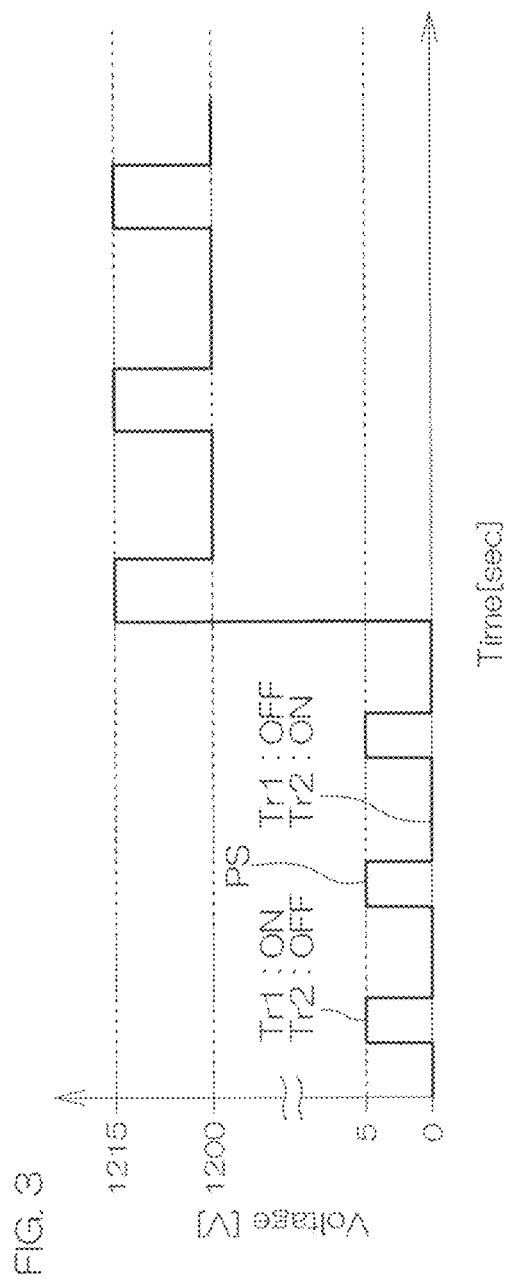
FIG. 3 is a voltage waveform diagram for describing the operation of the electronic component module shown in FIG. 1.

FIG. 2 is a general arrangement diagram for describing an operation of the electronic component module 1 shown in FIG. 1. FIG. 3 is a voltage waveform diagram for describing the operation of the electronic component module 1 shown in FIG. 1.

Referring to FIG. 2, the electronic component 5 includes a transformer 21. The transformer 21 includes a low voltage coil 22 (low voltage conductor pattern) at the primary side and a high voltage coil 23 (high voltage conductor pattern) at the secondary side that oppose each other in an up/down direction. The high voltage coil 23 is disposed at an upper side with respect to the low voltage coil 22 and opposes the low voltage coil 22.

The high voltage coil 23 is AC-connected to the low voltage coil 22 by magnetic coupling and, at the same time, is DC-isolated from the low voltage coil 22. That is, the driver IC chip 7 is AC connected to the controller IC chip 6 via the electronic component 5 and, at the same time, is DC isolated from the controller IC chip 6.

The low voltage coil 22 includes a first inner terminal end 24, a first outer terminal end 25, and a first spiral portion 26 that is routed in a spiral between the first inner terminal end 24 and the first outer terminal end 25. The high voltage coil 23 includes a second inner terminal end 27, a second outer terminal end 28, and a second spiral portion 29 that is routed in a spiral between the second inner terminal end 27 and the second outer terminal end 28.

A first low voltage wiring 31 is connected between the first inner terminal end 24 of the low voltage coil 22 and an arbitrary low voltage pad 11. A second low voltage wiring 32 is connected to the first outer terminal end 25 of the low voltage coil 22 and an arbitrary low voltage pad 11.

A first high voltage wiring 33 is connected between the second inner terminal end 27 of the high voltage coil 23 and an arbitrary high voltage pad 12. A second high voltage wiring 34 is connected to the second outer terminal end 28 of the high voltage coil 23 and an arbitrary high voltage pad 12.

The controller IC chip 6 includes a first wiring and a second wiring 36. Each of the first wiring 35 and the second wiring 36 is connected to an arbitrary first input pad 13 and an arbitrary first output pad 14. The controller IC chip 6 further includes a first switching device Sw1 and a second switching device Sw2.

The first switching device Sw1 is interposed in the first wiring 35. The first switching device Sw1 controls conduction and interruption of an electric signal transmitted to the first wiring 35. The first switching device Sw1 may be a transistor.

The second switching device Sw2 is interposed in the second wiring 36. The second switching device Sw2 controls conduction and interruption of an electric signal transmitted to the second wiring 36. The second switching device Sw2 may be a transistor.

The first input pad 13 connected to the first wiring 35 is electrically connected to a ground via a first lead wire 17. The first output pad 14 connected to the first wiring 35 is electrically connected to a low voltage pad 11 at the first inner terminal end 24 side via a second lead wire 18.

The first input pad 13 connected to the second wiring 36 is electrically connected to a power supply 37 via a first lead wire 17. The power supply 37 applies a voltage, for example, of 5 V to the controller IC chip 6. The first output pad 14 connected to the second wiring 36 is electrically connected to a low voltage pad 11 at the first outer terminal end 25 side via a second lead wire 18.

The high voltage pad 12 at the second inner terminal end 27 side is electrically connected via a third lead wire 19 to an arbitrary second input pad 15 of the driver IC chip 7. The high voltage pad 12 at the second outer terminal end 28 side is electrically connected via a third lead wire 19 to an arbitrary second input pad 15 of the driver IC chip 7.

A reference voltage power supply 38 and a power supply 39 are connected to the driver IC chip 7. The reference voltage power supply 38 applies a reference voltage of, for example, 1200 V to the driver IC chip 7. The reference voltage is also to be applied to the high voltage coil 23. The power supply 39 applies a voltage of, for example, 15 V to the driver IC chip 7.

Also, an SiC-MISFET (metal insulator semiconductor field effect transistor) is connected as an example of a load to the driver IC chip 7. The driver IC chip 7 drives and controls the SiC-MISFET with 1200 V as the reference voltage.

Referring to FIG. 3, the controller IC chip 6 performs on-off control of the first switching device Sw1 and the second switching device Sw2 in a predetermined switching pattern to generate a periodic pulse signal PS.

In this example, the predetermined switching pattern includes a first application state (Sw1: ON, Sw2: OFF) and a second application state (Sw1: OFF, Sw2: ON). FIG. 3 shows an example where the pulse signal PS of 5 V with 0 V (ground potential) as a reference is generated.

The pulse signal PS generated by the controller IC chip 6 is input into the electronic component 5. The electronic component 5 transmits the pulse signal PS from the low voltage coil 22 to the high voltage coil 23. The pulse signal PS is thereby boosted by just an amount corresponding to a winding ratio (transformer ratio) of the low voltage coil 22 and the high voltage coil 23. An example where the pulse signal PS is boosted to 15 V is shown in FIG. 3.

The boosted pulse signal PS is input into the driver IC chip 7. The driver IC chip 7 generates an electric signal that is in accordance with the boosted pulse signal PS and drives and controls the SiC-MISFET. Numerical values shown in FIG. 2 and FIG. 3 are all merely an example. For example, the reference voltage at the secondary side (high voltage side) may be not less than 500 V and not more than 2000 V.

Figure 4:
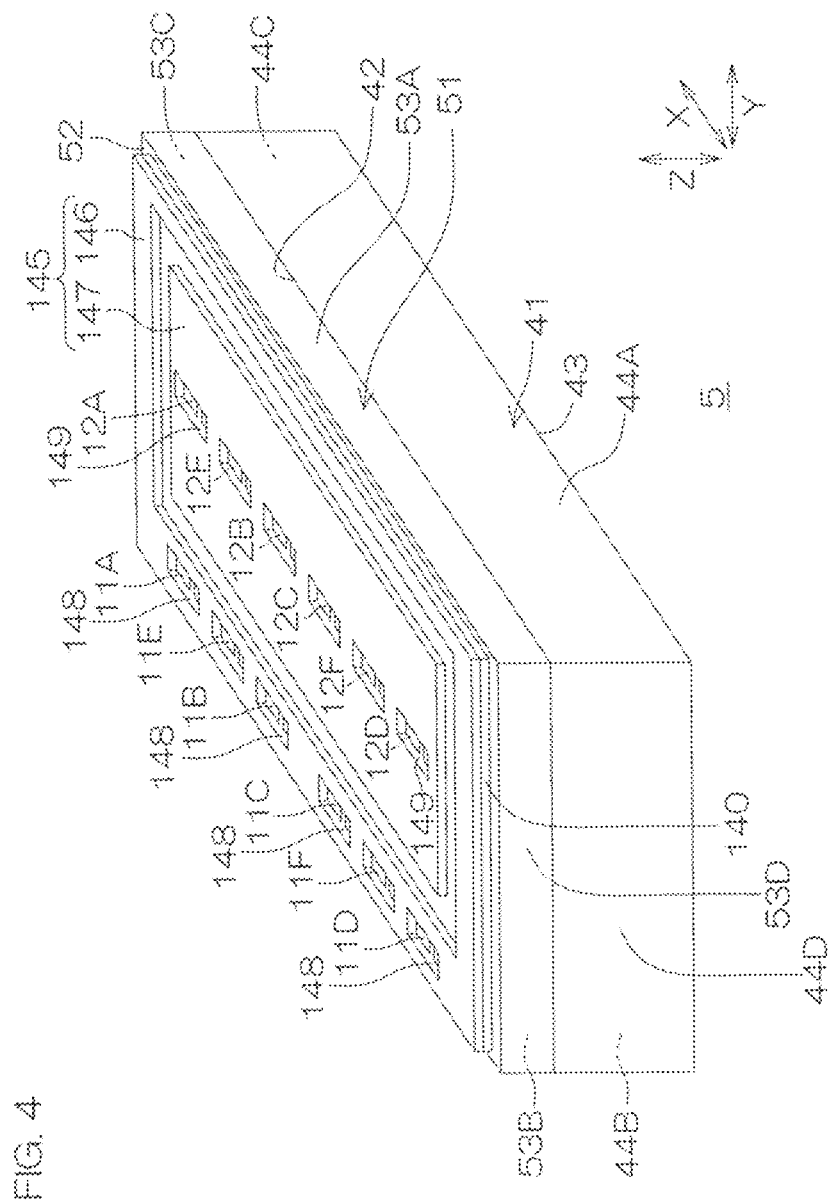
FIG. 4 is a perspective view of the electronic component shown in FIG. 1.
Figure 5:
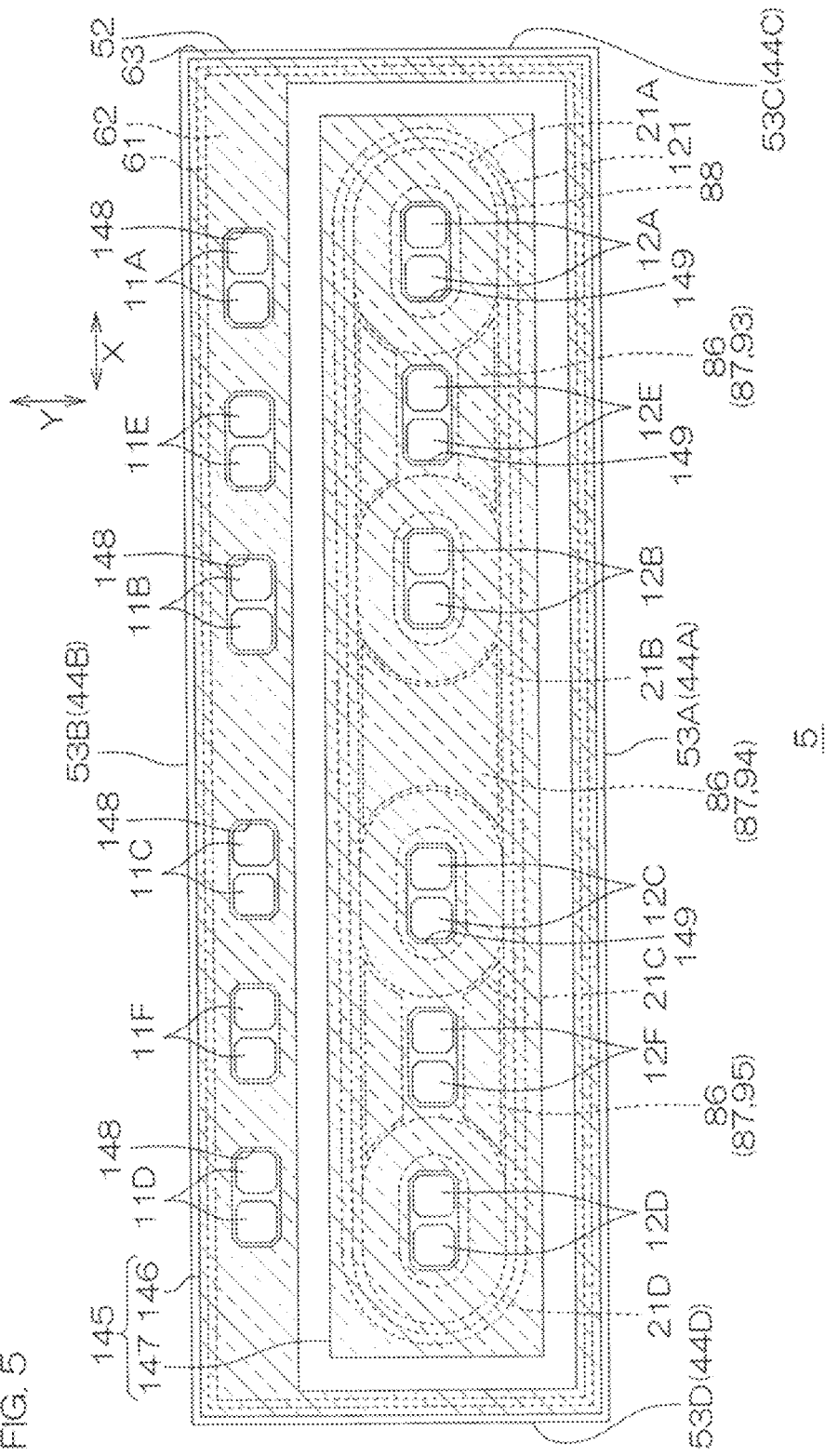
FIG. 5 is a plan view of the electronic component shown in FIG. 4.
Figure 6:
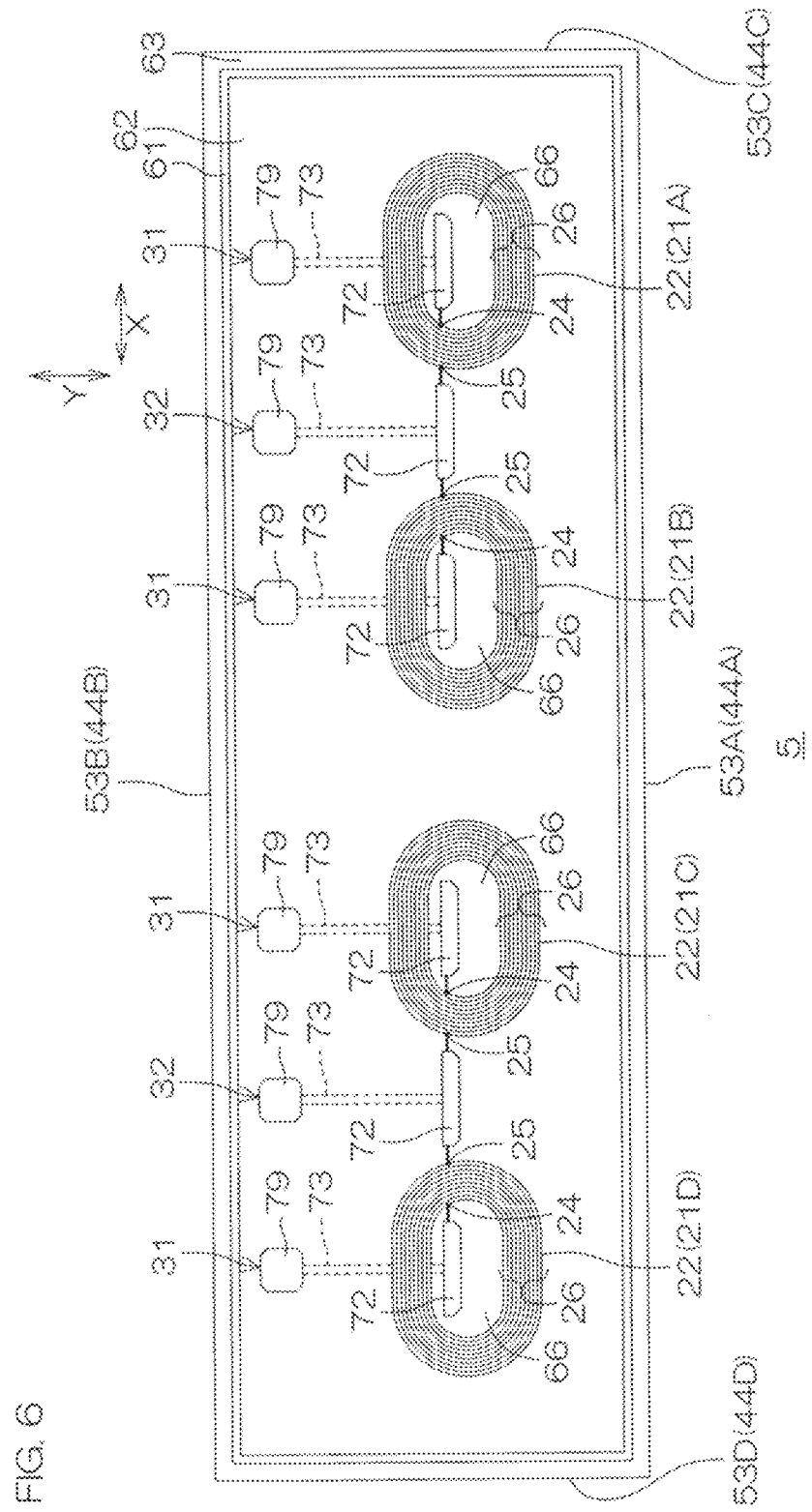
FIG. 6 is a plan view of a layer of the electronic component shown in FIG. 4 in which low voltage coils are formed.
Figure 7:
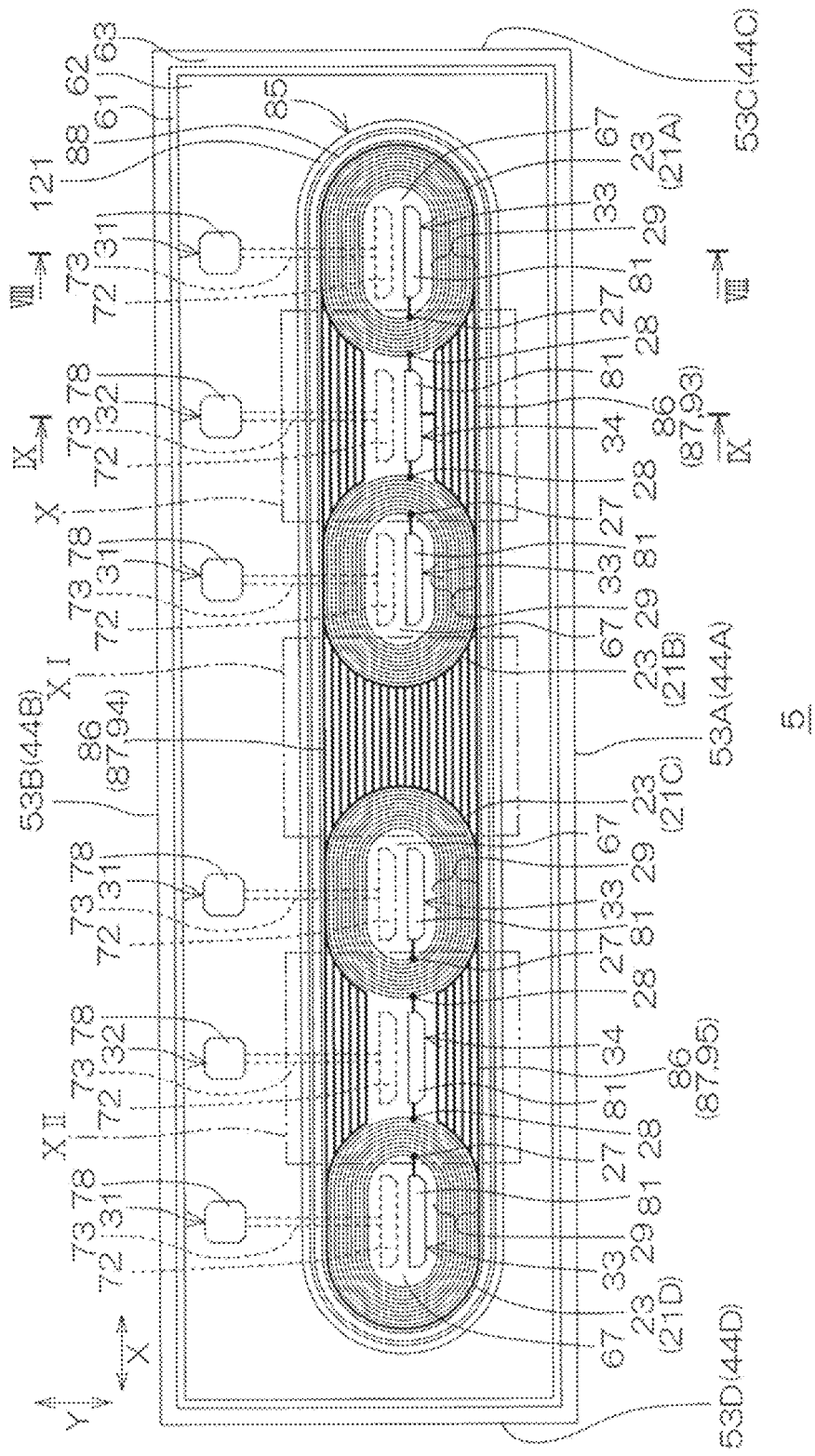
FIG. 7 is a plan view of a layer of the electronic component shown in FIG. 4 in which high voltage coils are formed.

FIG. 4 is a perspective view of the electronic component 5 shown in FIG. 1. FIG. 5 is a plan view of the electronic component 5 shown in FIG. 4. FIG. 6 is a plan view of a layer of the electronic component 5 shown in FIG. 4 in which low voltage coils 22 are formed. FIG. 7 is a plan view of a layer of the electronic component 5 shown in FIG. 4 in which high voltage coils 23 are formed.

Figure 8:
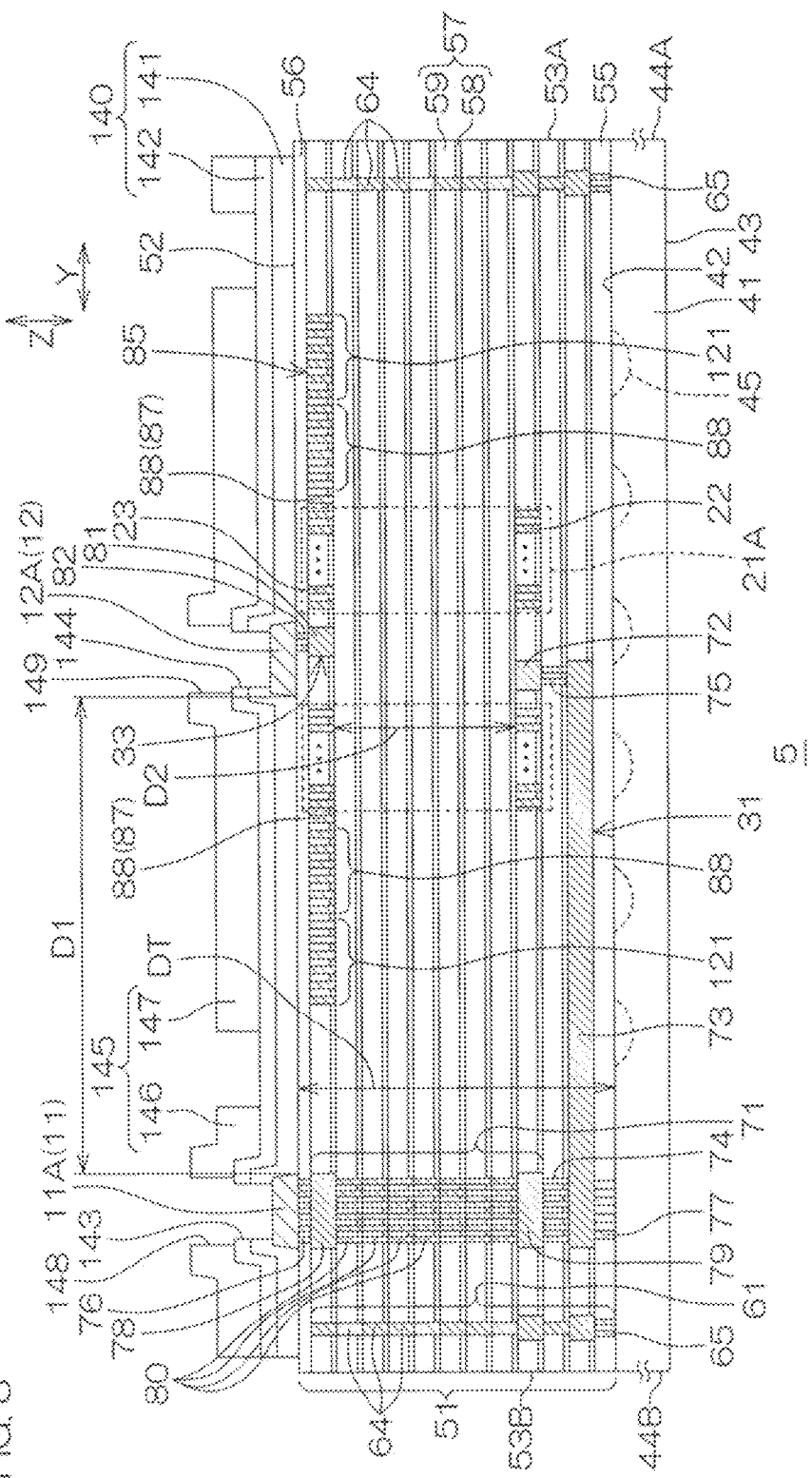
FIG. 8 is a sectional view taken along line VIII-VIII shown in FIG. 7.
Figure 9:
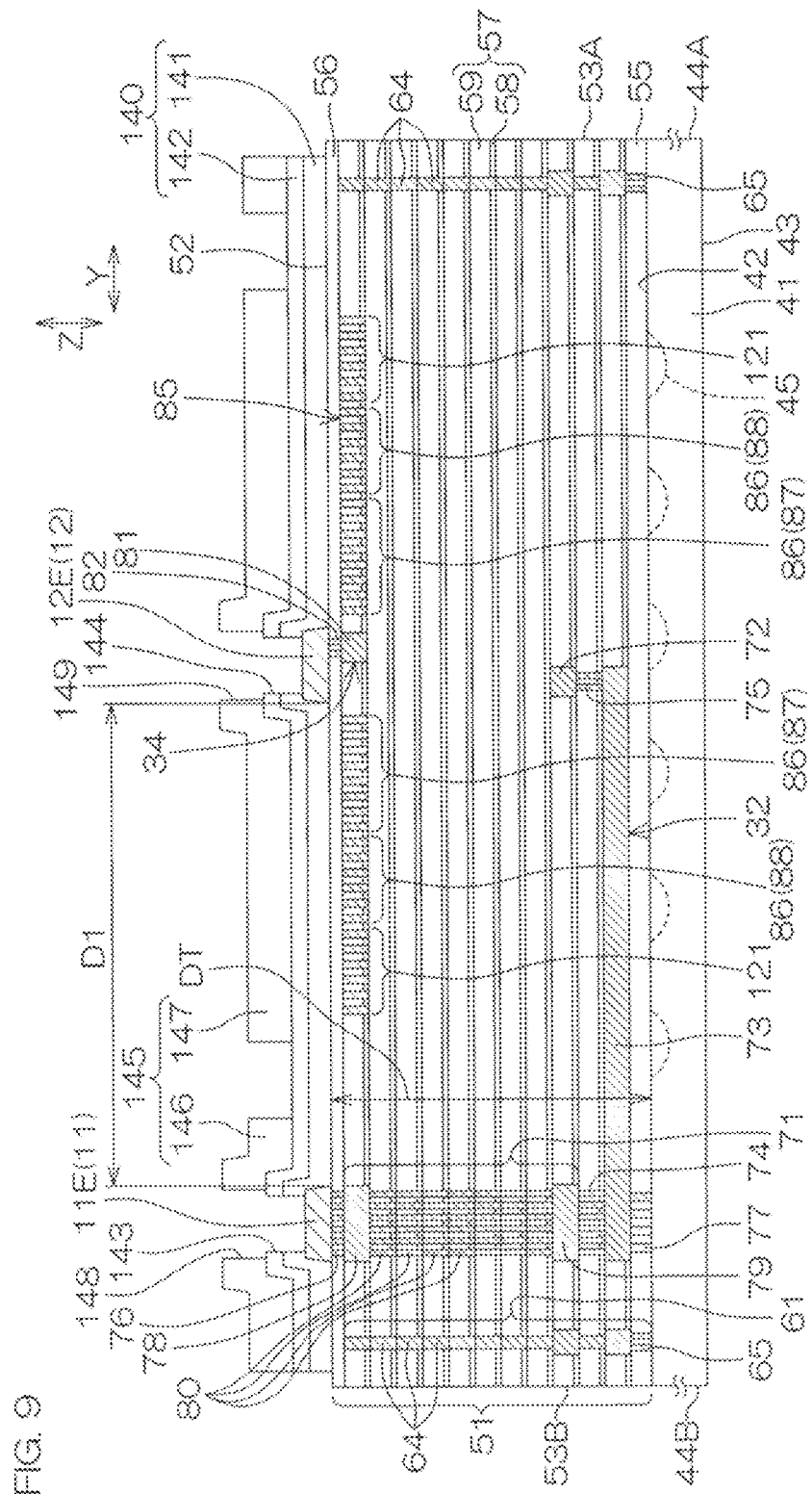
FIG. 9 is a sectional view taken along line IX-IX shown in FIG. 7.
Figure 10:
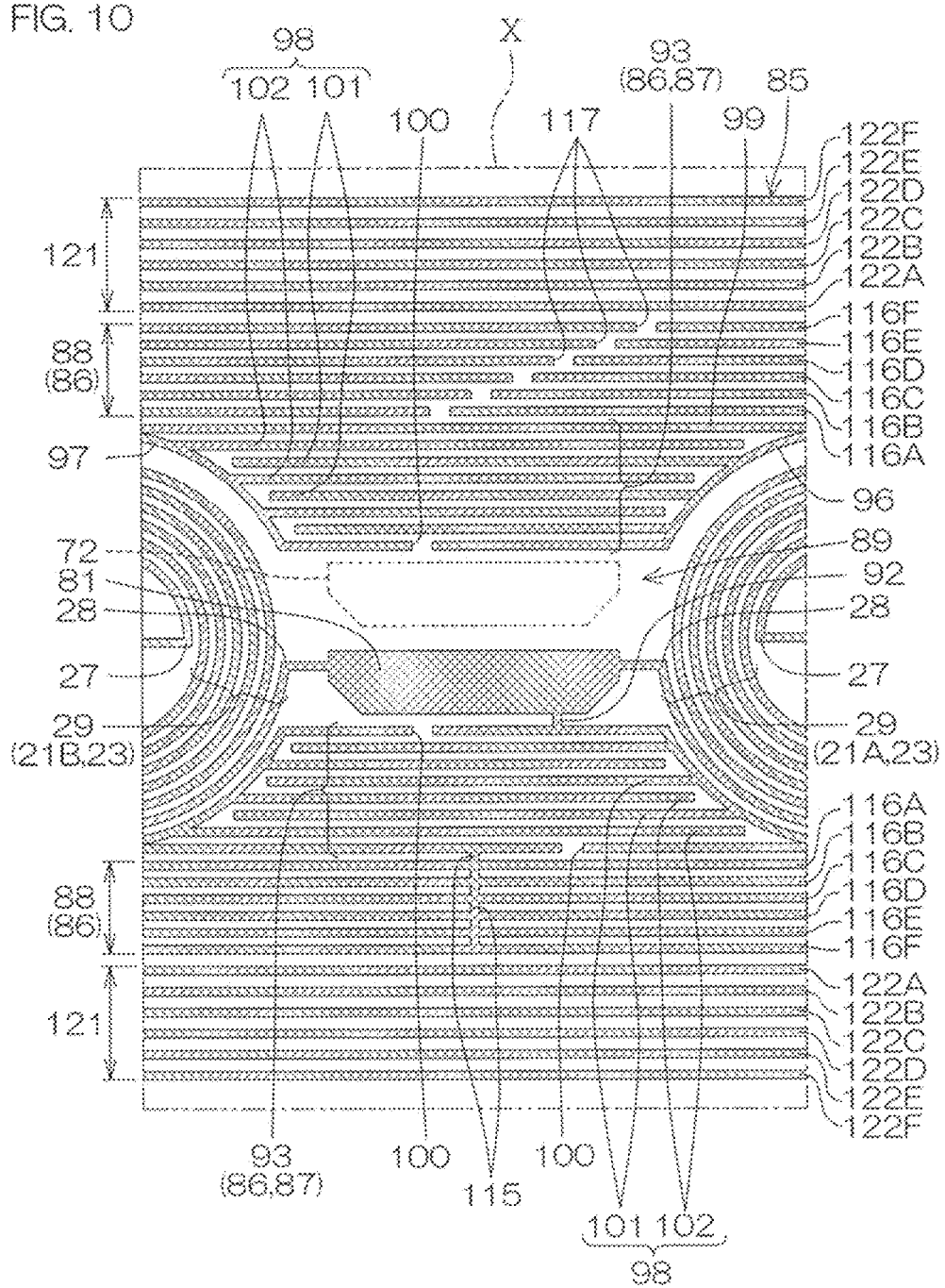
FIG. 10 is an enlarged view of a region X shown in FIG. 7.
Figure 11:
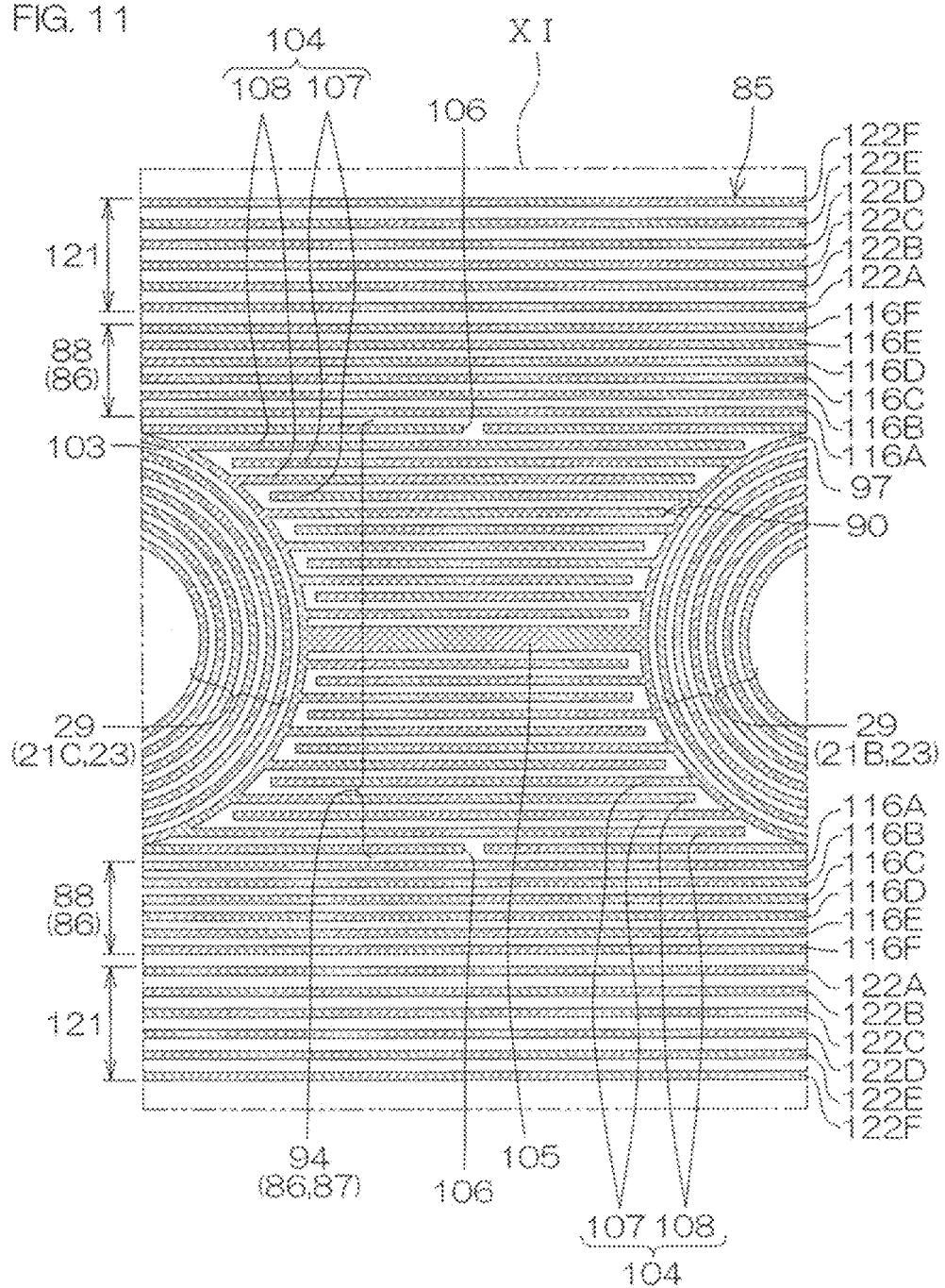
FIG. 11 is an enlarged view of a region XI shown in FIG. 7.
Figure 12:
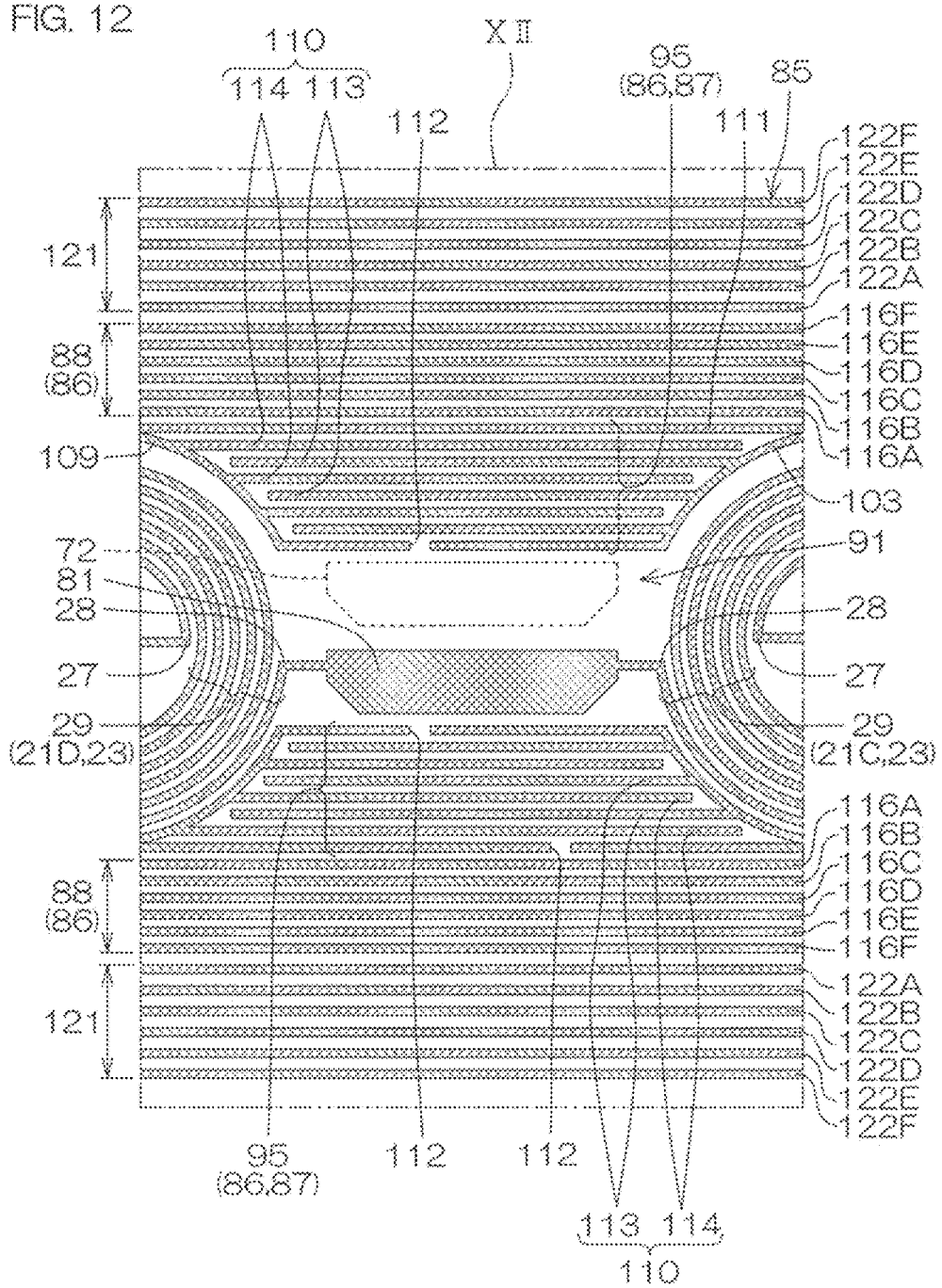
FIG. 12 is an enlarged view of a region XII shown in FIG. 7.

FIG. 8 is a sectional view taken along line VIII-VIII shown in FIG. 7. FIG. 9 is a sectional view taken along line IX-IX shown in FIG. 7. FIG. 10 is an enlarged view of a region X shown in FIG. 7. FIG. 11 is an enlarged view of a region XI shown in FIG. 7. FIG. 12 is an enlarged view of a region XII shown in FIG. 7.

Referring to FIG. 4 to FIG. 9, the electronic component 5 includes a substrate 41 of rectangular parallelepiped shape. In this embodiment, the substrate 41 is constituted of a semiconductor substrate. As a semiconductor material forming the semiconductor substrate, Si (silicon), a wide bandgap semiconductor, a compound semiconductor, etc., can be cited.

The wide bandgap semiconductor is a semiconductor having a bandgap of not less than 2.0 eV. The wide bandgap semiconductor may be SiC (silicon carbide). The compound semiconductor may be a group III-V compound semiconductor. The compound semiconductor may include at least one among AlN (aluminum nitride), InN (indium nitride), GaN (gallium nitride), and GaAs (gallium arsenide).

In this embodiment, the substrate 41 includes a silicon substrate. The substrate 41 may be an epitaxial substrate having a laminated structure that includes a silicon substrate and a silicon epitaxial layer. The silicon substrate may be an n-type silicon substrate or a p-type silicon substrate.

The substrate 41 has a first principal surface 42 at one side, a second principal surface 43 at another side, and substrate side surfaces 44A, 44B, 44C, and 44D that connect the first principal surface 42 and the second principal surface 43. The first principal surface 42 and the second principal surface 43 are formed to quadrilateral shapes (rectangular shapes in this embodiment) in a plan view as viewed from a normal direction Z to the surfaces (hereinafter referred to simply as "plan view").

The substrate side surface 44A and the substrate side surface 44B form long sides of the substrate 41. The substrate side surface 44A and the substrate side surface 44B extend along the first direction X and oppose each other along the second direction Y. The substrate side surface 44C and the substrate side surface 44D form short sides of the substrate 41. The substrate side surface 44C and the substrate side surface 44D extend along the second direction Y and oppose each other along the first direction X.

The first principal surface 42 may be a device forming surface in which main portions of functional devices are formed. The main portions of the functional devices are formed using a surface layer portion of the first principal surface 42 of the substrate 41 and/or a region on the first principal surface 42 of the substrate 41. In FIG. 8 and FIG. 9, the functional devices 45 are shown in simplified manner by broken lines indicated in the surface layer portion of the first principal surface 42 of the substrate 41.

The functional devices 45 may include at least one among a passive device, a semiconductor rectifying device, and a semiconductor switching device. The passive device may include a semiconductor passive device. The passive device may include either or both of a resistor and a capacitor. The semiconductor rectifying device may include at least one among a pn junction diode, a Zener diode, a Schottky barrier diode, and a fast recovery diode.

The semiconductor switching device may include at least one among a BJT (bipolar junction transistor), a MISFET (metal insulator field effect transistor), an IGBT (insulated gate bipolar junction transistor), and a JFET (junction field effect transistor).

The functional devices 45 may include a circuit network in which any two or more types of devices among the passive device, the semiconductor rectifying device, and the semiconductor switching device are selectively combined. The circuit network may form a portion or an entirety of an integrated circuit. The integrated circuit may include an SSI (small scale integration), an LSI (large scale integration), an MSI (medium scale integration), a VLSI (very large scale integration), or a ULSI (ultra-very large scale integration).

The electronic component 5 further includes an insulating laminated structure 51 (insulating layer) formed on the first principal surface 42 of the substrate 41. The insulating laminated structure 51 has an insulating principal surface 52 and insulating side surfaces 53A, 53B, 53C, and 53D. The insulating principal surface 52 is formed to a quadrilateral shape (a rectangular shape in this embodiment) matching the first principal surface 42 in plan view. The insulating principal surface 52 extends in parallel to the first principal surface 42.

The insulating side surfaces 53A to 53D extend toward the substrate 41 from peripheral edges of the insulating principal surface 52. The insulating side surfaces 53A to 53D are continuous to the substrate side surfaces 44A to 44D. More specifically, the insulating side surfaces 53A to 53D are formed flush with the substrate side surfaces 44A to 44D.

The insulating laminated structure 51 includes a lowermost insulating layer 55, an uppermost insulating layer 56, and a plurality (eleven layers in this embodiment) of interlayer insulating layers 57. The lowermost insulating layer 55 is an insulating layer that contacts the first principal surface 42. The uppermost insulating layer 56 is an insulating layer that forms the insulating principal surface 52. The plurality of interlayer insulating layers 57 are insulating layers that are interposed between the lowermost insulating layer 55 and the uppermost insulating layer 56. In this embodiment, the lowermost insulating layer 55 has a single layer structure that includes silicon oxide. In this embodiment, the uppermost insulating layer 56 has a single layer structure that includes silicon oxide.

The plurality of interlayer insulating layers 57 each have a first insulating layer 58 at the lowermost insulating layer 55 side and a second insulating layer 59 at the uppermost insulating layer 56 side. The first insulating layer 58 constitutes a base layer of the second insulating layer 59. More specifically, the first insulating layer 58 is formed as an etching stopping layer with respect to the lowermost insulating layer 55 and the second insulating layer 59. The first insulating layer 58 may include silicon nitride. The second insulating layer 59 includes an insulating material differing from the first insulating layer 58. The second insulating layer 59 may include silicon oxide.

A thickness of the first insulating layer 58 may be not less than 100 nm and less than 1000 nm (for example, approximately 300 nm). A thickness of the second insulating layer 59 exceeds the thickness of the first insulating layer 58. The thickness of the second insulating layer 59 may be not less than 1 μm and not more than 3 μm (for example, approximately 2 μm).

A total thickness DT of the insulating laminated structure 51 may be not less than 5 μm and not more than 50 μm. The number of layers of the interlayer insulating layers 57 and the total thickness DT of the insulating laminated structure 51 are adjusted in accordance with a dielectric breakdown resistance to be realized. Insulating materials of the lowermost insulating layer 55, the uppermost insulating layer 56, and the interlayer insulating layers 57 are arbitrary and not restricted to a specific insulating material. Also, the number of layers of the interlayer insulating layers 57 is arbitrary and not restricted to the mode shown in FIG. 8 and FIG. 9.

The electronic component 5 further includes a field electrode 61 formed in the insulating laminated structure 51. The field electrode 61 demarcates the insulating laminated structure 51 into a device forming region 62 and an outer region 63. The field electrode 61 suppresses entry of moisture into the device forming region 62 and cracking of the insulating laminated structure 51.

The field electrode 61 is formed in the insulating laminated structure 51 at intervals from the insulating side surfaces 53A to 53D in plan view. The field electrode 61 extends as a band along the insulating side surfaces 53 to 53D in plan view. In this embodiment, the field electrode 61 is formed to a quadrilateral annular shape (more specifically, a rectangular annular shape) in plan view.

The device forming region 62 is thereby demarcated in a quadrilateral shape (more specifically, a rectangular shape) in plan view. Also, the outer region 63 is demarcated in a quadrilateral annular shape (more specifically, a rectangular annular shape) surrounding the device forming region 62 in plan view.

The field electrode 61 is formed as a wall extending along the normal direction Z in the insulating laminated structure 51. The field electrode 61 has an upper end portion at the uppermost insulating layer 56 side, a lower end portion at the lowermost insulating layer 55 side, and wall portions extending as walls between the upper end portion and the lower end portion. The upper end portion of the field electrode 61 is covered by the uppermost insulating layer 56. The lower end portion of the field electrode 61 is electrically connected to the substrate 41.

A voltage less than a voltage to be applied to the high voltage pads 12 described above is to be applied to the field electrode 61. In this embodiment, a voltage (reference voltage) to be applied to the low voltage pads 11 described above is to be applied to the field electrode 61. That is, the field electrode 61 is equipotential to the low voltage pads 11.

Referring to FIG. 8 and FIG. 9, the field electrode 61 includes a plurality of field plug electrodes 64 and a field plug electrode 65. The plurality of field plug electrodes 64 are embedded respectively in the plurality of interlayer insulating layers 57. The plurality of field plug electrodes 64 are layered from the lowermost insulating layer 55 side to the uppermost insulating layer 56 side such as to be electrically connected to each other. The number of layers of the plurality of field plug electrodes 64 matches the number of layers of the interlayer insulating layers 57.

Each field plug electrode 64 may include at least one among titanium, titanium nitride, gold, silver, copper, aluminum, and tungsten. Each field plug electrode 64 may have a laminated structure that includes a base electrode layer and a principal electrode layer.

The base electrode layer demarcates a recess space in the corresponding interlayer insulating layer 57. The base electrode layer may include at least one among titanium and titanium nitride. The principal electrode layer is embedded in the recess space demarcated by the base electrode layer. The principal electrode layer may include at least one among gold, silver, copper, aluminum, and tungsten. The principal electrode layer preferably includes copper or aluminum from standpoints of cost and mass productivity.

The field plug electrode 65 is formed in a region of the lowermost insulating layer 55 between the substrate 41 and the field plug electrodes 64. The field plug electrode 65 is electrically connected to the first principal surface 42 of the substrate 41 and the field plug electrodes 64. The field plug electrode 65 may have the same structure as the field plug electrodes 64.

In this embodiment, the electronic component 5 includes a plurality (four in this embodiment) of the transformers 21 formed in the insulating laminated structure 51. That is, the electronic component 5 is a multichannel type device that includes the plurality of transformers 21.

The plurality of transformers 21 are formed in the device forming region 62 at intervals from the field electrode 61. The plurality of transformers 21 are aligned at intervals from each other along the first direction X. More specifically, the plurality of transformers 21 include a first transformer 21A, a second transformer 21B, a third transformer 21C, and a fourth transformer 21D that are aligned in that order from the insulating side surface 53C side to the insulating side surface 53D side in plan view.

The plurality of transformers 21A to 21D each have the same structure. In the following, the structure of the first transformer 21A shall be described as an example. The descriptions of the structures of the second transformer 21B, the third transformer 21C, and the fourth transformer 21D shall be omitted since the description of the structure of the first transformer 21A applies respectively thereto.

Referring to FIG. 6 to FIG. 9, the first transformer 21A includes the low voltage coil 22 and the high voltage coil 23. The low voltage coil 22 is formed in the insulating laminated structure 51. The high voltage coil 23 is formed in the insulating laminated structure 51 such as to oppose the low voltage coil 22 in the normal direction Z to the insulating principal surface 52. In this embodiment, the low voltage coil 22 and the high voltage coil 23 are formed in a region in the insulating laminated structure 51 that is sandwiched by the lowermost insulating layer 55 and the uppermost insulating layer 56.

The low voltage coil 22 is formed at the lowermost insulating layer 55 side in the insulating laminated structure 51 and the high voltage coil 23 is formed at the uppermost insulating layer 56 side with respect to the low voltage coil 22 in the insulating laminated structure 51. In this embodiment, the low voltage coil 22 is formed in the interlayer insulating layer 57 of the third layer as counted from the lowermost insulating layer 55 side. The high voltage coil 23 opposes the low voltage coil 22 across one or more interlayer insulating layers 57. In this embodiment, the high voltage coil 23 is formed in the interlayer insulating layer 57 of the first layer as counted from the uppermost insulating layer 56 side.

The high voltage coil 23 suffices to oppose the low voltage coil 22 across one or more interlayer insulating layers 57. The interlayer insulating layers 57 in which the low voltage coil 22 and the high voltage coil 23 are formed are arbitrary. However, it should be taken into consideration that a dielectric withstand voltage and an electric field strength between the low voltage coil 22 and the high voltage coil 23 are determined by the total number (thickness) of the interlayer insulating layers 57.

More specifically, the low voltage coil 22 penetrates through and is embedded in the first insulating layer 58 and the second insulating layer 59 of the corresponding insulating layer 57. The low voltage coil 22 has a first coil surface at one side, a second coil surface at another side, and a coil side surface connecting the first coil surface and the second coil surface.

The first coil surface of the low voltage coil 22 is exposed from the interlayer insulating layer 57 in which the low voltage coil 22 is embedded and is covered by the interlayer insulating layer 57 (first insulating layer 58) of the upper layer. The second coil surface of the low voltage coil 22 is exposed from the interlayer insulating layer 57 in which the low voltage coil 22 is embedded and contacts the interlayer insulating layer 57 (second insulating layer 59) of the lower layer. The coil side surface of the low voltage coil 22 contacts the interlayer insulating layer 57 in which the low voltage coil 22 is embedded.

The low voltage coil 22 includes the first inner terminal end 24, the first outer terminal end 25, and the first spiral portion 26 that is routed in a spiral between the first inner terminal end 24 and the first outer terminal end 25. The first spiral portion 26 is routed in a spiral that extends in an elliptical shape in plan view. In this embodiment, a portion of the first spiral portion 26 that forms an innermost peripheral edge demarcates a first inner region 66 of elliptical shape in plan view.

A winding shape of the first spiral portion 26 and a planar shape of the first inner region 66 are arbitrary and are not restricted to the forms shown in FIG. 6, etc. The first spiral portion 26 may, for example, be wound in a polygonal shape, such as a triangular shape, a quadrilateral shape, etc., or in a circular shape in plan view. The first inner region 66 may, for example, be demarcated in a polygonal shape, such as a triangular shape, a quadrilateral shape, etc., or in a circular shape in plan view.

The number of turns of the first spiral portion 26 may be not less than 5 and not more than 30. The number of turns of the first spiral portion 26 may be not less than and not more than 10, not less than 10 and not more than 15, not less than 15 and not more than 20, not less than 20 and not more than 25, or not less than 25 and not more than 30.

A width of the first spiral portion 26 may be not less than 0.1 μm and not more than 5 μm. The width of the first spiral portion 26 is defined by a width in a direction orthogonal to a spiral direction. The width of the first spiral portion 26 may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. The width of the first spiral portion 26 is preferably not less than 1 μm and not more than 3 μm.

A winding pitch of the first spiral portion 26 may be not less than 0.1 μm and not more than 5 μm. The winding pitch of the first spiral portion 26 is defined by a distance between two portions of the first spiral portion 26 that are mutually adjacent in the direction orthogonal to the spiral direction. The winding pitch of the first spiral portion 26 may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. The winding pitch of the first spiral portion 26 is preferably not less than 1 μm and not more than 3 μm.

The low voltage coil 22 may include at least one among titanium, titanium nitride, gold, silver, copper, aluminum, and tungsten. The low voltage coil 22 may have a laminated structure that includes a base electrode layer and a principal electrode layer.

The base electrode layer demarcates a recess space in the corresponding interlayer insulating layer 57. The base electrode layer may include at least one among titanium and titanium nitride. The principal electrode layer is embedded in the recess space demarcated by the base electrode layer. The principal electrode layer may include at least one among gold, silver, copper, aluminum, and tungsten. The principal electrode layer preferably includes copper or aluminum from standpoints of cost and mass productivity. The low voltage coil 22 is preferably formed of the same conductive material as the field plug electrodes 64.

The high voltage coil 23 penetrates through and is embedded in the first insulating layer 58 and the second insulating layer 59 of the corresponding insulating layer 57. The high voltage coil 23 has a first coil surface at one side, a second coil surface at another side, and a coil side surface connecting the first coil surface and the second coil surface.

The first coil surface of the high voltage coil 23 is exposed from the interlayer insulating layer 57 in which the high voltage coil 23 is embedded and is covered by the uppermost insulating layer 56. The second coil surface of the high voltage coil 23 is exposed from the interlayer insulating layer 57 in which the high voltage coil 23 is embedded and contacts the interlayer insulating layer 57 of the lower layer. The coil side surface of the high voltage coil 23 contacts the interlayer insulating layer 57 in which the high voltage coil 23 is embedded.

The high voltage coil 23 contacts the uppermost insulating layer 56 and two interlayer insulating layers 57. If the high voltage coil 23 is formed in the interlayer insulating layer 57 of the second layer or more as counted from the uppermost insulating layer 56, the high voltage coil 23 has a structure that contacts three interlayer insulating layers 57.

The high voltage coil 23 includes the second inner terminal end 27, the second outer terminal end 28, and the second spiral portion 29 that is routed in a spiral between the second inner terminal end 27 and the second outer terminal end 28. The second spiral portion 29 is routed in a spiral that extends in an elliptical shape in plan view. In this embodiment, a portion of the second spiral portion 29 that forms an innermost peripheral edge demarcates a second inner region 67 of elliptical shape in plan view. The second inner region 67 of the second spiral portion 29 overlaps with the first inner region 66 of the first spiral portion 26 in plan view.

A winding shape of the second spiral portion 29 and a planar shape of the second inner region 67 are arbitrary and are not restricted to the forms shown in FIG. 7, etc. The second spiral portion 29 may, for example, be wound in a polygonal shape, such as a triangular shape, a quadrilateral shape, etc., or in a circular shape in plan view. The second inner region 67 may, for example, be demarcated in a polygonal shape, such as a triangular shape, a quadrilateral shape, etc., or in a circular shape in plan view.

The number of turns of the second spiral portion 29 may be not less than 5 and not more than 30. The number of turns of the second spiral portion 29 with respect to the number of turns of the first spiral portion 26 is adjusted in accordance with a voltage value to be boosted. The number of turns of the first spiral portion 26 preferably exceeds the number of turns of the second spiral portion 29. The number of turns of the second spiral portion 29 may be not less than 5 and not more than 10, not less than 10 and not more than 15, not less than 15 and not more than 20, not less than 20 and not more than 25, or not less than 25 and not more than 30. Obviously, the second spiral portion 29 having the number of turns that is the same as the number of turns of the first spiral portion 26 may be formed.

A width of the second spiral portion 29 may be not less than 0.1 μm and not more than 5 μm. The width of the second spiral portion 29 is defined by a width in a direction orthogonal to a spiral direction. The width of the second spiral portion 29 may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm.

The width of the second spiral portion 29 is preferably not less than 1 μm and not more than 3 μm. The width of the second spiral portion 29 is preferably equal to the width of the first spiral portion 26. That the width of the second spiral portion 29 and the width of the first spiral portion 26 are equal means that the width of the second spiral portion 29 falls in a range of within ±20% of the width of the first spiral portion 26.

A winding pitch of the second spiral portion 29 may be not less than 0.1 μm and not more than 5 μm. The winding pitch of the second spiral portion 29 is defined by a distance between two portions of the second spiral portion 29 that are mutually adjacent in the direction orthogonal to the spiral direction. The winding pitch of the second spiral portion 29 may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm.

The winding pitch of the second spiral portion 29 is preferably not less than 1 μm and not more than 3 μm. The winding pitch of the second spiral portion 29 is preferably equal to the winding pitch of the first spiral portion 26. That the winding pitch of the second spiral portion 29 and the winding pitch of the first spiral portion 26 are equal means that the winding pitch of the second spiral portion 29 falls in a range of within ±20% of the winding pitch of the first spiral portion 26.

The high voltage coil 23 may include at least one among titanium, titanium nitride, gold, silver, copper, aluminum, and tungsten. The high voltage coil 23 may have a laminated structure that includes a base electrode layer and a principal electrode layer.

The base electrode layer demarcates a recess space in the corresponding interlayer insulating layer 57. The base electrode layer may include at least one among titanium and titanium nitride. The principal electrode layer is embedded in the recess space demarcated by the base electrode layer. The principal electrode layer may include at least one among gold, silver, copper, aluminum, and tungsten. The principal electrode layer preferably includes copper or aluminum from standpoints of cost and mass productivity. The high voltage coil 23 is preferably formed of the same conductive material as the low voltage coils 22 and the field plug electrodes 64.

Referring to FIG. 5, the electronic component 5 includes the plurality (twelve in this embodiment) of low voltage pads 11 and the plurality (twelve in this embodiment) of high voltage pads 12 mentioned above. The plurality of low voltage pads 11 are electrically connected respectively to the low voltage coils 22 of the corresponding transformers 21A to 21D. The plurality of high voltage pads 12 are electrically connected respectively to the high voltage coils 23 of the corresponding transformers 21A to 21D.

The plurality of low voltage pads 11 are formed on the insulating principal surface 52 of the insulating laminated structure 51 in the device forming region 62. More specifically, the plurality of low voltage pads 11 are formed in a region at the insulating side surface 53B side at intervals in the second direction Y from the plurality of transformers 21A to 21D and are aligned at intervals from each other along the first direction X.

The plurality of low voltage pads 11 include first low voltage pads 11A, second low voltage pads 11B, third low voltage pads 11C, fourth low voltage pads 11D, fifth low voltage pads 11E, and sixth low voltage pads 11F. In this embodiment, the plurality of low voltage pads 11A to 11F are respectively formed in twos. The numbers of the plurality of low voltage pads 11A to 11F are arbitrary and are not restricted to the numbers shown in FIG. 5, etc.

The first low voltage pads 11A oppose the first transformer 21A in the second direction Y in plan view. The second low voltage pads 11B oppose the second transformer 21B in the second direction Y in plan view. The third low voltage pads 11C oppose the third transformer 21C in the second direction Y in plan view. The fourth low voltage pads 11D oppose the fourth transformer 21D in the second direction Y in plan view.

The fifth low voltage pads 11E are formed in a region between the first low voltage pads 11A and the second low voltage pads 11B in plan view. The sixth low voltage pads 11F are formed in a region between the third low voltage pads 11C and the fourth low voltage pads 11D in plan view.

The first low voltage pads 11A are electrically connected to the first inner terminal end 24 of the first transformer 21A (low voltage coil 22). The second low voltage pads 11B are electrically connected to the first inner terminal end 24 of the second transformer 21B (low voltage coil 22). The third low voltage pads 11C are electrically connected to the first inner terminal end 24 of the third transformer 21C (low voltage coil 22). The fourth low voltage pads 11D are electrically connected to the first inner terminal end 24 of the fourth transformer 21D (low voltage coil 22).

The fifth low voltage pads 11E are electrically connected to the first outer terminal end 25 of the first transformer 21A (low voltage coil 22) and the first outer terminal end 25 of the second transformer 21B (low voltage coil 22). The sixth low voltage pads 11F are electrically connected to the first outer terminal end 25 of the third transformer 21C (low voltage coil 22) and the first outer terminal end 25 of the fourth transformer 21D (low voltage coil 22).

The plurality of high voltage pads 12 are formed on the insulating principal surface 52 of the insulating laminated structure 51 at intervals from the plurality of low voltage pads 11 in the device forming region 62. More specifically, the plurality of high voltage pads 12 are formed in a region at the insulating side surface 53A side at intervals in the second direction Y from the plurality of low voltage pads 11 and are aligned at intervals from each other along the first direction X.

The plurality of high voltage pads 12 are formed in a region in proximity to the plurality of transformers 21A to 21D in plan view. That the plurality of high voltage pads 12 are in proximity to the plurality of transformers 21A to 21D in plan view means that in plan view, a distance between a high voltage pad 12 and the corresponding transformer 21 is less than a distance between a low voltage pad 11 and the high voltage pad 12.

More specifically, the plurality of high voltage pads 12 are formed at intervals along the first direction X such as to oppose the plurality of transformers 21A to 21D along the first direction X in plan view.

Even more specifically, the plurality of high voltage pads 12 are formed at intervals along the first direction X such as to be positioned in the second inner regions 67 of the high voltage coils 23 and regions between mutually adjacent high voltage coils 23 in plan view. The plurality of high voltage pads 12 and the plurality of transformers 21A to 21D are thereby aligned in a single column along the first direction X in plan view.

The plurality of high voltage pads 12 include first high voltage pads 12A, second high voltage pads 12B, third high voltage pads 12C, fourth high voltage pads 12D, fifth high voltage pads 12E, and sixth high voltage pads 12F. In this embodiment, the plurality of high voltage pads 12A to 12F are respectively formed in twos. The numbers of the plurality of high voltage pads 12A to 12F are arbitrary and are not restricted to the number shown in FIG. 5, etc.

The first high voltage pads 12A are formed in the second inner region 67 of the first transformer 21A (high voltage coil 23) in plan view. The second high voltage pads 12B are formed in the second inner region 67 of the second transformer 21B (high voltage coil 23) in plan view. The third high voltage pads 12C are formed in the second inner region 67 of the third transformer 21C (high voltage coil 23) in plan view. The fourth high voltage pads 12D are formed in the second inner region 67 of the fourth transformer 21D (high voltage coil 23) in plan view.

The fifth high voltage pads 12E are formed in a region between the first transformer 21A and the second transformer 21B in plan view. The sixth high voltage pads 12F are formed in a region between the third transformer 21C and the fourth transformer 21D in plan view.

The first high voltage pads 12A are electrically connected to the second inner terminal end 27 of the first transformer 21A (high voltage coil 23). The second high voltage pads 12B are electrically connected to the second inner terminal end 27 of the second transformer 21B (high voltage coil 23). The third high voltage pads 12C are electrically connected to the second inner terminal end 27 of the third transformer 21C (high voltage coil 23). The fourth high voltage pads 12D are electrically connected to the second inner terminal end 27 of the fourth transformer 21D (high voltage coil 23).

The fifth high voltage pads 12E are electrically connected to the second outer terminal end 28 of the first transformer 21A (high voltage coil 23) and the second outer terminal end 28 of the second transformer 21B (high voltage coil 23). The sixth high voltage pads 12F are electrically connected to the second outer terminal end 28 of the third transformer 21C (high voltage coil 23) and the second outer terminal end 28 of the fourth transformer 21D (high voltage coil 23).

Referring to FIG. 6 to FIG. 9, the electronic component 5 includes the first low voltage wiring 31, the second low voltage wiring 32, the first high voltage wiring 33, and the second high voltage wiring 34 mentioned above. In this embodiment, a plurality of first low voltage wirings 31, a plurality of the second low voltage wirings 32, a plurality of the first high voltage wirings 33, and a plurality of the second high voltage wirings 34 are formed. The plurality of first low voltage wirings 31, the plurality of second low voltage wirings 32, the plurality of first high voltage wirings 33, and the plurality of second high voltage wirings 34 are respectively formed in the insulating laminated structure 51.

Referring to FIG. 8 and FIG. 9, the plurality of first low voltage wirings 31 are more specifically electrically connected respectively to the corresponding low voltage pads 11A to 11D and the first inner terminal ends 24 of the corresponding transformers 21A to 21D (low voltage coils 22).

The plurality of first low voltage wirings 31 each have the same structure. In the following, the structure of the first low voltage wiring 31 connected to the first low voltage pad 11A and the first transformer 21A shall be described as an example. The descriptions of the structures of the other first low voltage wirings 31 shall be omitted since the description of the structure of the first low voltage wiring 31 connected to the first transformer 21A applies thereto.

The first low voltage wiring 31 includes a penetrating wiring 71, a low voltage connection wiring 72, a lead-out wiring 73, a first connecting plug electrode 74, a second connecting plug electrode 75, a pad plug electrode 76, and a substrate plug electrode 77.

In the insulating laminated structure 51, the penetrating wiring 71 penetrates through a plurality of the interlayer insulating layers 57 and extends in a column extending along the normal direction Z. In this embodiment, the penetrating wiring 71 is formed in a region of the insulating laminated structure 51 between the lowermost insulating layer 55 and the uppermost insulating layer 56.

The penetrating wiring 71 has an upper end portion at the uppermost insulating layer 56 side and a lower end portion at the lowermost insulating layer 55 side. The upper end portion of the penetrating wiring 71 is formed in the same interlayer insulating layer 57 as the high voltage coils 23 and is covered by the uppermost insulating layer 56. The lower end portion of the penetrating wiring 71 is formed in the same interlayer insulating layer 57 as the low voltage coils 22.

In this embodiment, the penetrating wiring 71 includes a first electrode layer 78, a second electrode layer 79, and a plurality of wiring plug electrodes 80. The first electrode layer 78 forms the upper end portion of the penetrating wiring 71. The second electrode layer 79 forms the lower end portion of the penetrating wiring 71.

The first electrode layer 78 is an electrode layer of island shape having a planar area that exceeds a planar area of the wiring plug electrodes 80. The first electrode layer 78 overlaps with the corresponding low voltage pad 11 (first low voltage pad 11A) in plan view. The second electrode layer 79 is an electrode layer of island shape having a planar area that exceeds the planar area of the wiring plug electrodes 80. The second electrode layer 79 overlaps with the first electrode layer 78 in plan view.

The plurality of wiring plug electrodes 80 electrically connect the first electrode layer 78 and the second electrode layer 79. The plurality of wiring plug electrodes 80 are respectively embedded in a plurality of the interlayer insulating layers 57 in a region between the first electrode layer 78 and the second electrode layer 79.

One or a plurality (six in this embodiment) of the wiring plug electrodes 80 are formed in each interlayer insulating layer 57. The number of wiring plug electrodes 80 formed in each interlayer insulating layer 57 is arbitrary and is not restricted to the mode shown in FIG. 8 and FIG. 9. The plurality of wiring plug electrodes 80 are layered from the lowermost insulating layer 55 side to the uppermost insulating layer 56 side such as to be electrically connected to each other. The number of layers of the plurality of wiring plug electrodes 80 matches the number of layers of the plurality of interlayer insulating layers 57.

The first electrode layer 78, the second electrode layer 79, and the wiring plug electrodes 80 may each include at least one among titanium, titanium nitride, gold, silver, copper, aluminum, and tungsten. The first electrode layer 78, the second electrode layer 79, and the wiring plug electrodes 80 may each have a laminated structure that includes a base electrode layer and a principal electrode layer.

The base electrode layer demarcates a recess space in the corresponding interlayer insulating layer 57. The base electrode layer may include at least one among titanium and titanium nitride. The principal electrode layer is embedded in the recess space demarcated by the base electrode layer. The principal electrode layer may include at least one among gold, silver, copper, aluminum, and tungsten. The principal electrode layer preferably includes copper or aluminum from standpoints of cost and mass productivity. The first electrode layer 78, the second electrode layer 79, and the wiring plug electrodes 80 are preferably formed of the same conductive material as the field plug electrodes 64, the low voltage coils 22, the high voltage coils 23, etc.

The low voltage connection wiring 72 is formed in the same interlayer insulating layer 57 as the low voltage coils 22 and in the first inner region 66 of the first transformer 21A (low voltage coil 22). The low voltage connection wiring 72 is an electrode layer of island shape having a planar area that exceeds the planar area of the wiring plug electrodes 80.

The low voltage connection wiring 72 overlaps with the corresponding high voltage pad 12 (first high voltage pad 12A) in plan view. The low voltage connection wiring 72 is electrically connected to the first inner terminal end 24 of the corresponding low voltage coil 22. The low voltage connection wiring 72 is preferably formed of the same conductive material as the field plug electrodes 64, the low voltage coils 22, the high voltage coils 23, etc.

The lead-out wiring 73 is formed in a region in an interlayer insulating layer 57 between the substrate 41 and the penetrating wiring 71. In this embodiment, the lead-out wiring 73 is formed in the interlayer insulating layer 57 of the first layer as counted from the lowermost insulating layer 55. The lead-out wiring 73 is electrically connected to the penetrating wiring 71 and the low voltage connection wiring 72.

More specifically, the lead-out wiring 73 includes a first end portion at one side, a second end portion at another side, and a wiring portion extending in a region between the first end portion and the second end portion. The first end portion of the lead-out wiring 73 is positioned in a region between the substrate 41 and the lower end portion of the penetrating wiring 71. The second end portion of the lead-out wiring 73 is positioned in a region between the substrate 41 and the low voltage connection wiring 72. The wiring portion extends along the first principal surface 42 of the substrate 41 and connects the first end portion and the second end portion.

The first connecting plug electrode 74 is formed in a region in an interlayer insulating layer 57 between the penetrating wiring 71 and the lead-out wiring 73. In this embodiment, the first connecting plug electrode 74 is positioned in the interlayer insulating layer 57 of the second layer as counted from the lowermost insulating layer 55. The first connecting plug electrode 74 is electrically connected to the penetrating wiring 71 and the first end portion of the lead-out wiring 73. The first connecting plug electrode 74 is preferably formed of the same conductive material as the field plug electrodes 64, the low voltage coils 22, the high voltage coils 23, etc.

The second connecting plug electrode 75 is formed in a region in an interlayer insulating layer 57 between the low voltage connection wiring 72 and the lead-out wiring 73. In this embodiment, the second connecting plug electrode 75 is positioned in the interlayer insulating layer 57 of the second layer as counted from the lowermost insulating layer 55. The second connecting plug electrode 75 is electrically connected to the low voltage connection wiring 72 and the second end portion of the lead-out wiring 73. The second connecting plug electrode 75 is preferably formed of the same conductive material as the field plug electrodes 64, the low voltage coils 22, the high voltage coils 23, etc.

The pad plug electrode 76 is formed in a region in the uppermost insulating layer 56 between the low voltage pad 11 (first low voltage pad 11A) and the penetrating wiring 71. The pad plug electrode 76 is electrically connected to the low voltage pad 11 and the upper end portion of the penetrating wiring 71. The pad plug electrode 76 is preferably formed of the same conductive material as the field plug electrodes 64, the low voltage coils 22, the high voltage coils 23, etc.

The substrate plug electrode 77 is formed in a region in the lowermost insulating layer 55 between the substrate 41 and the lead-out wiring 73. In this embodiment, the substrate plug electrode 77 is formed in a region between the substrate 41 and the first end portion of the lead-out wiring 73. The substrate plug electrode 77 is electrically connected to the substrate 41 and the first end portion of the lead-out wiring 73. The low voltage pad 11 (first low voltage pad 11A) is thereby electrically connected to the field electrode 61 via the first low voltage wiring 31 and the substrate 41. The substrate plug electrode 77 is preferably formed of the same conductive material as the field plug electrodes 64, the low voltage coils 22, the high voltage coils 23, etc.

Referring to FIG. 9, the plurality of second low voltage wirings 32 are electrically connected respectively to the corresponding low voltage pads 11E and 11F and the first outer terminal ends 25 of the low voltage coils 22 of the corresponding transformers 21A to 21D.

The plurality of second low voltage wirings 32 each have the same structure. In the following, the structure of the second low voltage wiring 32 connected to the fifth low voltage pad 11E and the first transformer 21A (and the second transformer 21B) shall be described as an example. The description of the structure of the other second low voltage wiring 32 shall be omitted since the description of the structure of the second low voltage wiring 32 connected to the first transformer 21A (and the second transformer 21B) applies thereto.

As with each first low voltage wiring 31, the second low voltage wiring 32 includes a penetrating wiring 71, a low voltage connection wiring 72, a lead-out wiring 73, a first connecting plug electrode 74, a second connecting plug electrode 75, a pad plug electrode 76, and a substrate plug electrode 77. With the exception of the point that the low voltage connection wiring 72 is electrically connected to the first outer terminal end 25 of the first transformer 21A (low voltage coil 22) and the first outer terminal end 25 of the second transformer 21B (low voltage coil 22), the second low voltage wiring 32 has the same structure as the first low voltage wiring 31.

More specifically, the low voltage connection wiring 72 of the second low voltage wiring 32 is formed in the same interlayer insulating layer 57 as the low voltage coils 22. The low voltage connection wiring 72 is formed in peripheries of the corresponding low voltage coils 22 in plan view. More specifically, the low voltage connection wiring 72 is formed in a region between the two corresponding mutually adjacent low voltage coils 22 in plan view.

The pad plug electrode 76 is formed in a region in the uppermost insulating layer 56 between the corresponding low voltage pad 11 (fifth low voltage pad 11E) and the low voltage connection wiring 72. The pad plug electrode 76 is electrically connected to the low voltage pad 11 and the low voltage connection wiring 72.

The plurality of first low voltage wirings 31 are thus electrically connected respectively to the corresponding low voltage pads 11A to 11D and the first inner terminal ends 24 of the corresponding transformers 21A to 21D (low voltage coils 22). Also, the plurality of second low voltage wirings 32 are electrically connected respectively to the corresponding low voltage pads 11E and 11F and the first outer terminal ends 25 of the corresponding transformers 21A to 21D (low voltage coils 22).

The low voltage coil 22 of the first transformer 21A and the low voltage coil 22 of the second transformer 21B are fixed at the same potential. The low voltage coil 22 of the third transformer 21C and the low voltage coil 22 of the fourth transformer 21D are fixed at the same potential. In this embodiment, the low voltage coils 22 of all of the transformers 21A to 21D are fixed at the same potential.

Referring to FIG. 8, the plurality of first high voltage wirings 33 are electrically connected respectively to the corresponding high voltage pads 12A to 12D and the second inner terminal ends 27 of the corresponding transformers 21A to 21D (high voltage coils 23).

The plurality of first high voltage wirings 33 each have the same structure. In the following, the structure of the first high voltage wiring 33 connected to the first high voltage pad 12A and the first transformer 21A shall be described as an example. The descriptions of the structures of the other first high voltage wirings 33 shall be omitted since the description of the structure of the first high voltage wiring 33 connected to the first transformer 21A applies thereto.

The first high voltage wiring 33 includes a high voltage connection wiring 81 and a pad plug electrode 82. The high voltage connection wiring 81 is formed in the same interlayer insulating layer 57 as the high voltage coils 23 and in the second inner region 67 of the corresponding high voltage coil 23. The high voltage connection wiring 81 is an electrode layer of island shape having a planar area that exceeds a planar area of the pad plug electrode 82.

The high voltage connection wiring 81 overlaps with the high voltage pad 12 (first high voltage pad 12A) in plan view. In this embodiment, the high voltage connection wiring 81 is formed at an interval from the corresponding low voltage connection wiring 72 in plan view. The high voltage connection wiring 81 does not oppose the low voltage connection wiring 72 in regard to the normal direction Z. An insulation distance between the low voltage connection wiring 72 and the high voltage connection wiring 81 can thereby be increased in regard to the normal direction Z and a dielectric withstand voltage of the insulating laminated structure 51 can thus be increased.

The high voltage connection wiring 81 is electrically connected to the second inner terminal end 27 of the corresponding high voltage coil 23. The high voltage connection wiring 81 is preferably formed of the same conductive material as the field plug electrodes 64, the low voltage coils 22, the high voltage coils 23, etc.

The pad plug electrode 82 is formed in a region in the uppermost insulating layer 56 between the corresponding high voltage pad 12 (first high voltage pad 12A) and the high voltage connection wiring 81. The pad plug electrode 82 is electrically connected to the high voltage pad 12 and the high voltage connection wiring 81. The pad plug electrode 82 is preferably formed of the same conductive material as the field plug electrodes 64, the low voltage coils 22, the high voltage coils 23, etc.

Referring to FIG. 9, the plurality of second high voltage wirings 34 are electrically connected respectively to the corresponding high voltage pads 12E and 12F and the second outer terminal ends 28 of the corresponding transformers 21A to 21D (high voltage coils 23).

The plurality of second high voltage wirings 34 each have the same structure. In the following, the structure of the second high voltage wiring 34 connected to the fifth high voltage pad 12E and the first transformer 21A (and the second transformer 21B) shall be described as an example. The description of the structure of the other second high voltage wiring 34 shall be omitted since the description of the structure of the second high voltage wiring 34 connected to the first transformer 21A (and the second transformer 21B) applies thereto.

As with each first high voltage wiring 33, the second high voltage wiring 34 includes a high voltage connection wiring 81 and a pad plug electrode 82. With the exception of the point that the high voltage connection wiring 81 is electrically connected to the second outer terminal end 28 of the first transformer 21A (high voltage coil 23) and the second outer terminal end 28 of the second transformer 21B (high voltage coil 23), the second high voltage wiring 34 has the same structure as the first high voltage wiring 33.

The high voltage connection wiring 81 of the second high voltage wiring 34 is formed in the same interlayer insulating layer 57 as the high voltage coils 23. The high voltage connection wiring 81 is formed in peripheries of the corresponding high voltage coils 23 in plan view. More specifically, the high voltage connection wiring 81 is formed in a region between the two corresponding mutually adjacent high voltage coils 23 in plan view.

The high voltage connection wiring 81 overlaps with the corresponding high voltage pad 12 (fifth high voltage pad 12E) in the region between the two corresponding mutually adjacent high voltage coils 23 in plan view. In this embodiment, the high voltage connection wiring 81 is formed at an interval from the corresponding low voltage connection wiring 72 in plan view. The high voltage connection wiring 81 does not oppose the low voltage connection wiring 72 in regard to the normal direction Z.

The pad plug electrode 82 is formed in a region in the uppermost insulating layer 56 between the corresponding high voltage pad 12 (fifth high voltage pad 12E) and the high voltage connection wiring 81. The pad plug electrode 76 is electrically connected to the high voltage pad 12 and the high voltage connection wiring 81. The pad plug electrode 76 is preferably formed of the same conductive material as the field plug electrodes 64, the low voltage coils 22, the high voltage coils 23, etc.

The plurality of first high voltage wirings 33 are thus electrically connected respectively to the corresponding high voltage pads 12A to 12D and the second inner terminal ends 27 of the corresponding transformers 21A to 21D (high voltage coils 23). Also, the plurality of second high voltage wirings 34 are electrically connected respectively to the corresponding high voltage pads 12A to 12D and the second outer terminal ends 28 of the corresponding transformers 21A to 21D (high voltage coils 23).

The high voltage coil 23 of the first transformer 21A and the high voltage coil 23 of the second transformer 21B are fixed at the same potential. The high voltage coil 23 of the third transformer 21C and the high voltage coil 23 of the fourth transformer 21D are fixed at the same potential. In this embodiment, the high voltage coils 23 of all of the transformers 21A to 21D are fixed at the same potential.

Referring to FIG. 8 and FIG. 9, a distance D1 between a low voltage pad 11 and a corresponding high voltage pad 12 preferably exceeds a distance D2 between a low voltage coil 22 and a corresponding high voltage coil 23 (D2<D1). Also, the distance D1 preferably exceeds a total thickness DT of the plurality of interlayer insulating layers 57 (DT<D1).

A ratio D2/D1 of the distance D2 with respect to the distance D1 may be not less than 0.01 and not more than 0.1. The ratio D2/D1 may be not less than 0.01 and not more than 0.025, not less than 0.025 and not more than 0.05, not less than 0.05 and not more than 0.075, or not less than 0.075 and not more than 0.1.

The distance D1 may be not less than 100 μm and not more than 500 μm. The distance D1 may be not less than 100 μm and not more than 200 μm, not less than 200 μm and not more than 300 μm, not less than 300 μm and not more than 400 μm, or not less than 400 μm and not more than 500 μm. The distance D2 may be not less than 1 μm and not more than 50 μm. The distance D2 is preferably not less than 5 μm and not more than 25 μm. The values of the distance D1 and the distance D2 are arbitrary and are adjusted as appropriate in accordance with the dielectric breakdown resistance to be realized.

Referring to FIG. 7 to FIG. 12, the electronic component 5 includes a shield conductor layer 85 formed in the insulating laminated structure 51 such as to be positioned in peripheries of the transformers 21A to 21D in plan view. In FIG. 10 to FIG. 12, the shield conductor layer 85 is indicated by hatching.

The shield conductor layer 85 is formed of a pattern (discontinuous pattern) differing from the high voltage coils 23 and the low voltage coils 22 and is independent of the transformers 21A to 21D. That is, the shield conductor layer 85 does not function as the transformers 21A to 21D. The shield conductor layer 85 shields electric fields between the low voltage coils 22 and the high voltage coils 23 in the transformers 21A to 21D and suppresses electric field concentration with respect to the high voltage coils 23.

In this embodiment, the shield conductor layer 85 is routed in a form of dense lines such as to partially cover and partially expose a region of a periphery of one or a plurality of the high voltage coils 23 in plan view. In this embodiment, the shield conductor layer 85 is routed at a line density equal to a line density of the high voltage coils 23 per unit area. That the line density of the shield conductor layer 85 is equal to the line density of the high voltage coils 23 means that the line density of the shield conductor layer 85 falls within a range of ±20% of the line density of the high voltage coils 23.

The shield conductor layer 85 is preferably formed in a region in closer proximity to a high voltage coil 23 than a low voltage pad 11 in plan view. That the shield conductor layer 85 is in proximity to the high voltage coil 23 in plan view means that a distance between the shield conductor layer 85 and the high voltage coil 23 is less than a distance between the shield conductor layer 85 and the low voltage pad 11.

A depth position of the shield conductor layer 85 in an interior of the insulating laminated structure 51 is arbitrary and is adjusted in accordance with electric field strengths to be relaxed. The shield conductor layer 85 is preferably formed in a region in closer proximity to a high voltage coil 23 than a low voltage coil 22 in regard to the normal direction Z.

That the shield conductor layer 85 is in proximity to the high voltage coil 23 in regard to the normal direction Z means that in regard to the normal direction Z, a distance between the shield conductor layer 85 and the high voltage coil 23 is less than a distance between the shield conductor layer 85 and the low voltage coil 22.

In this case, the electric field concentration with respect to the high voltage coil 23 can be suppressed appropriately. The more the distance between the shield conductor layer 85 and the high voltage coil 23 in regard to the normal direction Z is decreased, the more the electric field concentration with respect to the high voltage coil 23 can be suppressed. The shield conductor layer 85 is preferably formed in the same interlayer insulating layer 57 as the high voltage coil 23. In this case, the electric field concentration with respect to the high voltage coil 23 can be suppressed even more appropriately.

The shield conductor layer 85 is preferably formed in peripheries of the plurality of high voltage coils 23 such as to be interposed in regions between mutually adjacent ones of the plurality of high voltage coils 23 in plan view. In this case, undesirable electric field concentration with respect to the plurality of high voltage coils 23 can be suppressed by using the regions between the mutually adjacent ones of the plurality of high voltage coils 23.

The shield conductor layer 85 is preferably interposed in a region between a low voltage pad 11 and a high voltage coil 23 in plan view. In this case, undesirable conduction between the low voltage pad 11 and the high voltage coil 23 due to the electric field concentration at the high voltage coil 23 can be suppressed.

The shield conductor layer 85 is preferably interposed in a region between a low voltage pad 11 and a high voltage pad 12 in plan view. In this case, undesirable conduction between the low voltage pad 11 and the high voltage pad 12 due to the electric field concentration at the corresponding high voltage coil 23 can be suppressed.

The shield conductor layer 85 is preferably interposed in a region between the field electrode 61 and a high voltage coil 23 in plan view. In this case, undesirable conduction between the field electrode 61 and the high voltage coil 23 due to the electric field concentration at the high voltage coil 23 can be suppressed.

The shield conductor layer 85 is preferably interposed in a region between the field electrode 61 and a high voltage pad 12 in plan view. In this case, undesirable conduction between the field electrode 61 and the high voltage pad 12 due to the electric field concentration at the corresponding high voltage coil 23 can be suppressed.

In this embodiment, the shield conductor layer 85 is interposed in the regions between the mutually adjacent ones of the plurality of high voltage coils 23 in plan view. Also, the shield conductor layer 85 is formed such as to be oriented along at least one high voltage coil 23 in a region outside the regions between the mutually adjacent ones of the plurality of high voltage coils 23 in plan view.

More specifically, the shield conductor layer 85 is formed such as to be oriented along the plurality of high voltage coils 23 in plan view. Even more specifically, the shield conductor layer 85 entirely surrounds a region including the plurality of high voltage coils 23 and the plurality of high voltage pads 12 in plan view.

Thereby, the shield conductor layer 85 is interposed in the regions between the plurality of high voltage coils 23 in plan view. Also, the shield conductor layer 85 is interposed in a region between the plurality of low voltage pads 11A to 11F and the plurality of high voltage coils 23 in plan view. Also, the shield conductor layer 85 is interposed in a region between the plurality of low voltage pads 11A to 11F and the plurality of high voltage pads 12A to 12F in plan view.

Also, the shield conductor layer 85 is interposed in a region between the field electrode 61 and the plurality of high voltage coils 23 in plan view. Also, the shield conductor layer 85 is interposed in a region between the field electrode 61 and the plurality of high voltage pads 12A to 12F.

The shield conductor layer 85 may include at least one among titanium, titanium nitride, gold, silver, copper, aluminum, and tungsten. The shield conductor layer 85 may have a laminated structure that includes a base electrode layer and a principal electrode layer.

The base electrode layer demarcates a recess space in the corresponding interlayer insulating layer 57. The base electrode layer may include at least one among titanium and titanium nitride. The principal electrode layer is embedded in the recess space demarcated by the base electrode layer. The principal electrode layer may include at least one among gold, silver, copper, aluminum, and tungsten. The principal electrode layer preferably includes copper or aluminum from standpoints of cost and mass productivity.

The shield conductor layer 85 is preferably formed of the same conductive material as the high voltage coils 23. In this case, the high voltage coils 23 and the shield conductor layer 85 can be formed at the same time using the same resist mask and photomask.

In this embodiment, the shield conductor layer 85 includes a plurality of dummy patterns differing from each other in electrical state. The forms of the dummy patterns shall now be described with reference to FIG. 7 to FIG. 12.

Referring to FIG. 7 to FIG. 12, the shield conductor layer 85 includes a high voltage dummy pattern 86. The high voltage dummy pattern 86 is formed in the insulating laminated structure 51 such as to be positioned in the peripheries of the transformers 21A to 21D in plan view. The high voltage dummy pattern 86 is formed of a pattern (discontinuous pattern) differing from the high voltage coils 23 and the low voltage coils 22 and is independent of the transformers 21A to 21D. That is, the high voltage dummy pattern 86 does not function as the transformers 21A to 21D.

In this embodiment, the high voltage dummy pattern 86 is routed in a form of dense lines such as to partially cover and partially expose regions of the peripheries of the high voltage coils 23 in plan view. In this embodiment, the high voltage dummy pattern 86 is routed at a line density equal to the line density of the high voltage coils 23 per unit area. That the line density of the high voltage dummy pattern 86 is equal to the line density of the high voltage coils 23 means that the line density of the high voltage dummy pattern 86 falls within a range of ±20% of the line density of the high voltage coils 23.

The high voltage dummy pattern 86 shields the electric fields between the low voltage coils 22 and the high voltage coils 23 in the transformers 21A to 21D and suppresses the electric field concentration with respect to the high voltage coils 23. More specifically, the high voltage dummy pattern 86 shields the electric fields between the low voltage coils 22 and the high voltage coils 23 to keep electric fields leaking out to upper sides of the high voltage coils 23 away from the high voltage coils 23. Electric field concentration at the high voltage coils 23 due to the electric fields leaking out to the upper sides of the high voltage coils 23 is thereby suppressed.

A voltage exceeding the voltage to be applied to the low voltage coils 22 is to be applied to the high voltage dummy pattern 86. Voltage drops between the high voltage coils 23 and the high voltage dummy pattern 86 can thereby be suppressed and therefore, the electric field concentration with respect to the high voltage coils 23 can be suppressed.

Preferably, the voltage to be applied to the high voltage coils 23 is to be applied to the high voltage dummy pattern 86. That is, the high voltage dummy pattern 86 is preferably made equipotential to the high voltage coils 23. The voltage drops between the high voltage coils 23 and the high voltage dummy pattern 86 can thereby be suppressed reliably and therefore, the electric field concentration with respect to the high voltage coils 23 can be suppressed appropriately.

A depth position of the high voltage dummy pattern 86 in the interior of the insulating laminated structure 51 is arbitrary and is adjusted in accordance with the electric field strengths to be relaxed. The high voltage dummy pattern 86 is preferably formed in a region in closer proximity to a high voltage coil 23 than a low voltage coil 22 in regard to the normal direction Z.

That the high voltage dummy pattern 86 is in proximity to the high voltage coil 23 in regard to the normal direction Z means that in regard to the normal direction Z, a distance between the high voltage dummy pattern 86 and the high voltage coil 23 is less than a distance between the high voltage dummy pattern 86 and the low voltage coil 22.

In this case, the electric field concentration with respect to the high voltage coil 23 can be suppressed appropriately. The more the distance between the high voltage dummy pattern 86 and the high voltage coil 23 in regard to the normal direction Z is decreased, the more the electric field concentration with respect to the high voltage coil 23 can be suppressed. The high voltage dummy pattern 86 is preferably formed in the same interlayer insulating layer 57 as the high voltage coil 23. In this case, the electric field concentration with respect to the high voltage coil 23 can be suppressed even more appropriately.

The high voltage dummy pattern 86 is preferably formed in a region in closer proximity to a high voltage coil 23 than a low voltage pad 11 in plan view. That the high voltage dummy pattern 86 is in proximity to the high voltage coil 23 in plan view means that a distance between the high voltage dummy pattern 86 and the high voltage coil 23 is less than a distance between the high voltage dummy pattern 86 and the low voltage pad 11.

The high voltage dummy pattern 86 is preferably formed in the peripheries of the plurality of high voltage coils 23 such as to be interposed in regions between the mutually adjacent ones of the plurality of high voltage coils 23 in plan view. In this case, undesirable electric field concentration with respect to the plurality of high voltage coils 23 can be suppressed by using the regions between the mutually adjacent ones of the plurality of high voltage coils 23.

The high voltage dummy pattern 86 is preferably interposed in a region between a low voltage pad 11 and a high voltage coil 23 in plan view. In this case, undesirable conduction between the low voltage pad 11 and the high voltage coil 23 due to the electric field concentration at the high voltage coil 23 can be suppressed.

The high voltage dummy pattern 86 is preferably interposed in a region between a low voltage pad 11 and a high voltage pad 12 in plan view. In this case, undesirable conduction between the low voltage pad 11 and the high voltage pad 12 due to the electric field concentration at the corresponding high voltage coil 23 can be suppressed.

The high voltage dummy pattern 86 is preferably interposed in a region between the field electrode 61 and a high voltage coil 23 in plan view. In this case, undesirable conduction between the field electrode 61 and the high voltage coil 23 due to the electric field concentration at the high voltage coil 23 can be suppressed.

The high voltage dummy pattern 86 is preferably interposed in a region between the field electrode 61 and a high voltage pad 12 in plan view. In this case, undesirable conduction between the field electrode 61 and the high voltage pad 12 due to the electric field concentration at the corresponding high voltage coil 23 can be suppressed.

In this embodiment, the high voltage dummy pattern 86 is interposed in the regions between the mutually adjacent ones of the plurality of high voltage coils 23 in plan view. Also, the high voltage dummy pattern 86 is formed such as to be oriented along at least one high voltage coil 23 in a region outside the regions between the mutually adjacent ones of the plurality of high voltage coils 23 in plan view.

More specifically, the high voltage dummy pattern 86 is formed such as to be oriented along the plurality of high voltage coils 23 in plan view. Even more specifically, the high voltage dummy pattern 86 entirely surrounds a region including the plurality of high voltage coils 23 and the plurality of high voltage pads 12 in plan view.

Thereby, the high voltage dummy pattern 86 is interposed in the regions between the plurality of high voltage coils 23 in plan view. Also, the high voltage dummy pattern 86 is interposed in a region between the plurality of low voltage pads 11A to 11F and the plurality of high voltage coils 23 in plan view. Also, the high voltage dummy pattern 86 is interposed in a region between the plurality of low voltage pads 11A to 11F and the plurality of high voltage pads 12A to 12F in plan view.

Also, the high voltage dummy pattern 86 is interposed in a region between the field electrode 61 and the plurality of high voltage coils 23 in plan view. Also, the high voltage dummy pattern 86 is interposed in a region between the field electrode 61 and the plurality of high voltage pads 12A to 12F.

In the regions between the mutually adjacent ones of the plurality of high voltage coils 23 in plan view, the high voltage dummy pattern 86 is routed around peripheries of the high voltage pads 12E and 12F such as to expose regions directly below the high voltage pads 12E and 12F. Portions of the high voltage dummy pattern 86 may oppose the high voltage pads 12A to 12F in the normal direction Z.

In this case, the high voltage pads 12E and 12F, like the high voltage dummy pattern 86, shields the electric fields to suppress the electric fields leaking out to the upper sides of the high voltage coils 23. That is, the high voltage pads 12E and 12F are formed as shield conductor layers that suppress the electric field concentration with respect to the high voltage coils 23.

The high voltage dummy pattern 86 is preferably formed to a shape having ends. In this case, forming of a loop circuit (closed circuit) of current in the high voltage dummy pattern 86 can be suppressed. Noise due to current flowing through the high voltage dummy pattern 86 is thereby suppressed. Consequently, undesirable electric field concentration due to the noise can be suppressed and, at the same time, fluctuations in electrical characteristics of the transformers 21A to 21D can be suppressed.

More specifically, the high voltage dummy pattern 86 includes a first high voltage dummy pattern 87 and a second high voltage dummy pattern 88. The first high voltage dummy pattern 87 is formed in regions between mutually adjacent ones of the plurality of transformers 21A to 21D (plurality of high voltage coils 23) in plan view. The second high voltage dummy pattern 88 is formed in a region outside the regions between mutually adjacent ones of the plurality of transformers 21A to 21D (plurality of high voltage coils 23) in plan view.

In the following, a region between the first transformer 21A (high voltage coil 23) and the second transformer 21B (high voltage coil 23) that are mutually adjacent shall be called the first region 89. Also, a region between the second transformer 21B (high voltage coil 23) and the third transformer 21C (high voltage coil 23) shall be called the second region 90. Also, a region between the third transformer 21C (high voltage coil 23) and the fourth transformer 21D (high voltage coil 23) shall be called the third region 91.

In this embodiment, the first high voltage dummy pattern 87 is electrically connected via a first high voltage wiring 33 to high voltage pads 12 (the fifth high voltage pads 12E). More specifically, the first high voltage dummy pattern 87 includes a first connection portion 92 connected to the first high voltage wiring 33. The position of the first connection portion 92 is arbitrary. The first high voltage dummy pattern 87 is thereby fixed at the same potential as the plurality of high voltage coils 23.

The first high voltage dummy pattern 87 suppresses the electric fields leaking out to the upper sides of the high voltage coils 23 and suppresses the electric field concentration with respect to the mutually adjacent ones of the plurality of high voltage coils 23 in the first region 89, the second region 90, and the third region 91.

The first high voltage dummy pattern 87 includes a first pattern 93, a second pattern 94, and a third pattern 95. The first pattern 93 is formed in the first region 89. The second pattern 94 is formed in the second region 90. The third pattern 95 is formed in the third region 91.

In this embodiment, the first pattern 93, the second pattern 94, and the third pattern 95 are formed integrally and are equipotential to each other. As long as the first pattern 93, the second pattern 94, and the third pattern 95 are fixed at the same potential, the patterns may be formed to be separated from each other.

Referring to FIG. 7 and FIG. 10, the first pattern 93 is connected to the first high voltage wiring 33 via the first connection portion 92. The first pattern 93 is routed in a form of dense lines such as to cover and hide a region of a portion of the first region 89 in plan view.

The first pattern 93 is formed in the first region 89 at intervals from the high voltage pads 12 (fifth high voltage pads 12E) in plan view. That is, the first pattern 93 does not overlap with the high voltage pads 12 in plan view.

Also, the first pattern 93 is formed at intervals from the low voltage connection wirings 72 in plan view. That is, the first pattern 93 does not overlap with the low voltage connection wirings 72 in plan view. An insulation distance between the first pattern 93 and the low voltage connection wirings 72 can thereby be increased in regard to the normal direction Z and the dielectric withstand voltage of the insulating laminated structure 51 can thus be increased.

The first pattern 93 includes a first outer peripheral line 96, a second outer peripheral line 97, and a plurality of first intermediate lines 98. The first outer peripheral line 96 is a portion that extends as a band along a periphery of the high voltage coil 23 of the first transformer 21A. The second outer peripheral line 97 is a portion that extends as a band along a periphery of the high voltage coil 23 of the second transformer 21B. The first intermediate lines 98 are portions extending as bands in the first region 89.

In this embodiment, the first outer peripheral line 96 is formed in a ring shape having an open portion in the first region 89 in plan view. A width of the open portion of the first outer peripheral line 96 is less than a width along the second direction Y of each high voltage coil 23.

A width of the first outer peripheral line 96 may be not less than 0.1 µm and not more than 5 µm. The width of the first outer peripheral line 96 is defined by a width in a direction orthogonal to a direction in which the first outer peripheral line 96 extends. The width of the first outer peripheral line 96 may be not less than 0.1 µm and not more than 1 µm, not less than 1 µm and not more than 2 µm, not less than 2 µm and not more than 3 µm, not less than 3 µm and not more than 4 µm, or not less than 4 µm and not more than 5 µm. The width of the first outer peripheral line 96 is preferably not less than 1 µm and not more than 3 µm.

A pitch between the first outer peripheral line 96 and the high voltage coil 23 (the first transformer 21A) may be not less than 0.1 µm and not more than 5 µm. The pitch between the first outer peripheral line 96 and the high voltage coil 23 may be not less than 0.1 µm and not more than 1 µm, not less than 1 µm and not more than 2 µm, not less than 2 µm and not more than 3 µm, not less than 3 µm and not more than 4 µm, or not less than 4 µm and not more than 5 µm. The pitch between the first outer peripheral line 96 and the high voltage coil 23 is preferably not less than 1 µm and not more than 3 µm.

The width of the first outer peripheral line 96 is preferably equal to the width of the high voltage coil 23. That the width of the first outer peripheral line 96 is equal to the width of the high voltage coil 23 means that the width of the first outer peripheral line 96 falls in a range of within ±20% of the width of the high voltage coil 23.

The pitch between the first outer peripheral line 96 and the high voltage coil 23 is preferably equal to the winding pitch of the high voltage coil 23. That the pitch between the first outer peripheral line 96 and the high voltage coil 23 is equal to the winding pitch of the high voltage coil 23 means that the pitch between the first outer peripheral line 96 and the high voltage coil 23 falls in a range of within ±20% of the winding pitch of the high voltage coil 23. These structures are effective in terms of suppressing imbalance in the electric fields in the insulating laminated structure 51.

In this embodiment, the second outer peripheral line 97 is formed in a ring shape having an open portion in the first region 89 in plan view. A width of the open portion of the second outer peripheral line 97 is less than the width of the high voltage coil 23 in the second direction Y. The open portion of the second outer peripheral line 97 opposes the open portion of the first outer peripheral line 96 along the first direction X.

A width of the second outer peripheral line 97 may be not less than 0.1 µm and not more than 5 µm. The width of the second outer peripheral line 97 is defined by a width in a direction orthogonal to a direction in which the second outer peripheral line 97 extends. The width of the second outer peripheral line 97 may be not less than 0.1 µm and not more than 1 µm, not less than 1 µm and not more than 2 µm, not less than 2 µm and not more than 3 µm, not less than 3 µm and not more than 4 µm, or not less than 4 µm and not more than 5 µm. The width of the second outer peripheral line 97 is preferably not less than 1 µm and not more than 3 µm.

A pitch between the second outer peripheral line 97 and the high voltage coil 23 (the second transformer 21B) may be not less than 0.1 µm and not more than 5 µm. The pitch between the second outer peripheral line 97 and the high voltage coil 23 may be not less than 0.1 µm and not more than 1 µm, not less than 1 µm and not more than 2 µm, not less than 2 µm and not more than 3 µm, not less than 3 µm and not more than 4 µm, or not less than 4 µm and not more than 5 µm. The pitch between the second outer peripheral line 97 and the high voltage coil 23 is preferably not less than 1 µm and not more than 3 µm.

The width of the second outer peripheral line 97 is preferably equal to the width of the high voltage coil 23. That the width of the second outer peripheral line 97 is equal to the width of the high voltage coil 23 means that the width of the second outer peripheral line 97 falls in a range of within ±20% of the width of the high voltage coil 23.

The pitch between the second outer peripheral line 97 and the high voltage coil 23 is preferably equal to the winding pitch of the high voltage coil 23. That the pitch between the second outer peripheral line 97 and the high voltage coil 23 is equal to the winding pitch of the high voltage coil 23 means that the pitch between the second outer peripheral line 97 and the high voltage coil 23 falls in a range of within ±20% of the winding pitch of the high voltage coil 23. These structures are effective in terms of suppressing the imbalance in the electric fields in the insulating laminated structure 51.

The plurality of first intermediate lines 98 extend as bands in a region of the first region 89 between the first outer peripheral line 96 and the second outer peripheral line 97. The plurality of first intermediate lines 98 include at least one (one in this embodiment) first connection line 99 that electrically connects the first outer peripheral line 96 and the second outer peripheral line 97.

From a standpoint of preventing the forming of a loop circuit of current, the plurality of first intermediate lines 98 preferably include just one first connection line 99. The position of the first connection line 99 is arbitrary and is not restricted to a specific location.

A slit 100 that interrupts a loop circuit of current is formed in at least one of the plurality of first intermediate lines 98. The position of the slit 100 is adjusted as appropriate by design of the plurality of first intermediate lines 98 and is not restricted to a specific location.

The plurality of first intermediate lines 98 are preferably formed as bands extending along a direction of opposing of the plurality of high voltage coils 23. In this embodiment, the plurality of first intermediate lines 98 are respectively formed as bands extending along the first direction X and are formed at intervals in the second direction Y. The plurality of first intermediate lines 98 are formed as stripes extending along the first direction X as a whole in plan view.

In this embodiment, the plurality of first intermediate lines 98 include a plurality of first lead-out portions 101 and a plurality of second lead-out portions 102. The plurality of first lead-out portions 101 are led out as stripes from the first outer peripheral line 96 toward the second outer peripheral line 97. Tip portions of the plurality of first lead-out portions 101 are formed at intervals to the second outer peripheral line 97 side from the first outer peripheral line 96.

The plurality of second lead-out portions 102 are led out as stripes from the second outer peripheral line 97 toward the first outer peripheral line 96. Tip portions of the plurality of second lead-out portions 102 are formed at intervals to the first outer peripheral line 96 side from the second outer peripheral line 97.

In this embodiment, the plurality of second lead-out portions 102 are formed alternately with and at intervals from the plurality of first lead-out portions 101 along the second direction Y in a mode of sandwiching one first lead-out portion 101 in the second direction Y.

The plurality of second lead-out portions 102 may sandwich the plurality of first lead-out portions 101. Also, the plurality of second lead-out portions 102 may be formed such as to be adjacent to the plurality of first lead-out portions 101. The slit 100, the plurality of first lead-out portions 101, and the plurality of second lead-out portions 102 suppress the forming of a loop circuit of current in the first pattern 93.

A width of each first intermediate line 98 in regard to the second direction Y may be not less than 0.1 μm and not more than 5 μm. The width of the first intermediate line 98 may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. The width of the first intermediate line 98 is preferably not less than 1 μm and not more than 3 μm.

Pitches between two mutually adjacent first intermediate lines 98 may be not less than 0.1 μm and not more than 5 μm. Each pitch of the first intermediate lines 98 is defined by a distance between mutually adjacent ones of the plurality of first intermediate lines 98 in regard to the second direction Y. The pitches of the first intermediate lines 98 may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. The pitches of the first intermediate lines 98 are preferably not less than 1 μm and not more than 3 μm.

The width of each first intermediate line 98 is preferably equal to the width of each high voltage coil 23. That the width of each first intermediate line 98 is equal to the width of each high voltage coil 23 means that the width of each first intermediate line 98 falls in a range of within ±20% of the width of each high voltage coil 23.

The pitches between the first intermediate lines 98 are preferably equal to each other. That the pitches between the first intermediate lines 98 are equal to each other means that the pitches between the first intermediate lines 98 fall in a range of within ±20% of the pitches.

The pitches of the first intermediate lines 98 are preferably equal to the winding pitch of each high voltage coil 23. That the pitches of the first intermediate lines 98 are equal to the winding pitch of each high voltage coil 23 means that the pitches of the first intermediate lines 98 fall in a range of within ±20% of the winding pitch of each high voltage coil 23. These structures are effective in terms of suppressing the imbalance in the electric fields in the insulating laminated structure 51.

Referring to FIG. 7 and FIG. 11, the second pattern 94 is electrically connected to the high voltage pads 12 via the first high voltage wiring 33. In this embodiment, the second pattern 94 is electrically connected to the first high voltage wiring 33 (fifth high voltage pads 12E) via the second outer peripheral line 97 of the first pattern 93. The second pattern 94 is routed in a form of dense lines such as to cover and hide the second region 90.

The second pattern 94 includes the second outer peripheral line 97 described above, a third outer peripheral line 103, and a plurality of second intermediate lines 104. The third outer peripheral line 103 is a portion that extends as a band along a periphery of the high voltage coil 23 of the third transformer 21C. The second intermediate lines 104 are portions extending as bands in the second region 90.

In this embodiment, the third outer peripheral line 103 is formed in a ring shape having an open portion in the third region 91 in plan view. A width of the open portion of the third outer peripheral line 103 is less than a width along the second direction Y of the high voltage coil 23 of the third transformer 21C.

A width of the third outer peripheral line 103 may be not less than 0.1 μm and not more than 5 μm. The width of the third outer peripheral line 103 is defined by a width in a direction orthogonal to a direction in which the third outer peripheral line 103 extends. The width of the third outer peripheral line 103 may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. The width of the third outer peripheral line 103 is preferably not less than 1 μm and not more than 3 μm.

A pitch between the third outer peripheral line 103 and the high voltage coil 23 (the third transformer 21C) may be not less than 0.1 μm and not more than 5 μm. The pitch between the third outer peripheral line 103 and the high voltage coil 23 may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. The pitch between the third outer peripheral line 103 and the high voltage coil 23 is preferably not less than 1 μm and not more than 3 μm.

The width of the third outer peripheral line 103 is preferably equal to the width of the high voltage coil 23. That the width of the third outer peripheral line 103 is equal to the width of the high voltage coil 23 means that the width of the third outer peripheral line 103 falls in a range of within ±20% of the width of the high voltage coil 23.

The pitch between the third outer peripheral line 103 and the high voltage coil 23 is preferably equal to the winding pitch of the high voltage coil 23. That the pitch between the third outer peripheral line 103 and the high voltage coil 23 is equal to the winding pitch of the high voltage coil 23 means that the pitch between the third outer peripheral line 103 and the high voltage coil 23 falls in a range of within ±20% of the winding pitch of the high voltage coil 23. These structures are effective in terms of suppressing the imbalance in the electric fields in the insulating laminated structure 51.

The plurality of second intermediate lines 104 extend as bands in a region of the second region 90 between the second outer peripheral line 97 and the third outer peripheral line 103. The plurality of second intermediate lines 104 include at least one (one in this embodiment) second connection line 105 that electrically connects the second outer peripheral line 97 and the third outer peripheral line 103.

From the standpoint of preventing the forming of a loop circuit of current, the plurality of second intermediate lines 104 preferably include just one second connection line 105. The second connection line 105 may have a width exceeding a width of the other second intermediate lines 104. The position of the second connection line 105 is arbitrary and is not restricted to a specific location.

A slit 106 that interrupts a loop circuit of current is formed in at least one of the plurality of second intermediate lines 104. The position of the slit 106 is adjusted as appropriate by design of the plurality of second intermediate lines 104 and is not restricted to a specific location.

The plurality of second intermediate lines 104 are preferably formed as bands extending along the direction of opposing of the plurality of high voltage coils 23. In this embodiment, the plurality of second intermediate lines 104 are respectively formed as bands extending along the first direction X and are formed at intervals in the second direction Y. The plurality of second intermediate lines 104 are formed as stripes extending along the first direction X as a whole in plan view.

In this embodiment, the plurality of second intermediate lines 104 include a plurality of third lead-out portions 107 and a plurality of fourth lead-out portions 108. The plurality of third lead-out portions 107 are led out as stripes from the second outer peripheral line 97 toward the third outer peripheral line 103. Tip portions of the plurality of third lead-out portions 107 are formed at intervals to the second outer peripheral line 97 side from the third outer peripheral line 103.

The plurality of fourth lead-out portions 108 are led out as stripes from the third outer peripheral line 103 toward the second outer peripheral line 97. Tip portions of the plurality of fourth lead-out portions 108 are formed at intervals to the third outer peripheral line 103 side from the second outer peripheral line 97.

In this embodiment, the plurality of fourth lead-out portions 108 are formed alternately with and at intervals from the plurality of third lead-out portions 107 along the second direction Y in a mode of sandwiching one third lead-out portion 107 in the second direction Y.

The plurality of fourth lead-out portions 108 may sandwich the plurality of third lead-out portions 107. Also, the plurality of fourth lead-out portions 108 may be formed such as to be adjacent to the plurality of third lead-out portions 107. The slit 106, the plurality of third lead-out portions 107, and the plurality of fourth lead-out portions 108 suppress the forming of a loop circuit of current in the second pattern 94.

The width of each second intermediate line 104 in regard to the second direction Y may be not less than 0.1 µm and not more than 5 µm. The width of the second intermediate line 104 may be not less than 0.1 µm and not more than 1 µm, not less than 1 µm and not more than 2 µm, not less than 2 µm and not more than 3 µm, not less than 3 µm and not more than 4 µm, or not less than 4 µm and not more than 5 µm. The width of the second intermediate line 104 is preferably not less than 1 µm and not more than 3 µm.

Pitches between two mutually adjacent second intermediate lines 104 may be not less than 0.1 µm and not more than 5 µm. Each pitch between the second intermediate lines 104 is defined by a distance between mutually adjacent ones of the plurality of second intermediate lines 104 in regard to the second direction Y. The pitches between the second intermediate lines 104 may be not less than 0.1 µm and not more than 1 µm, not less than 1 µm and not more than 2 µm, not less than 2 µm and not more than 3 µm, not less than 3 µm and not more than 4 µm, or not less than 4 µm and not more than 5 µm. The pitches between the second intermediate lines 104 are preferably not less than 1 µm and not more than 3 µm.

The width of each second intermediate line 104 is preferably equal to the width of each high voltage coil 23. That the width of each second intermediate line 104 is equal to the width of each high voltage coil 23 means that the width of each second intermediate line 104 falls in a range of within ±20% of the width of each high voltage coil 23.

The pitches between the second intermediate lines 104 are preferably equal to each other. That the pitches between the second intermediate lines 104 are equal to each other means that the pitches between the second intermediate lines 104 fall in a range of within ±20% of the pitches.

The pitches between the second intermediate lines 104 are preferably equal to the winding pitch of each high voltage coil 23. That the pitches between the second intermediate lines 104 are equal to the winding pitch of each high voltage coil 23 means that the pitches between the second intermediate lines 104 fall in a range of within ±20% of the winding pitch of each high voltage coil 23. These structures are effective in terms of suppressing the imbalance in the electric fields in the insulating laminated structure 51.

Referring to FIG. 7 and FIG. 12, the third pattern 95 is electrically connected to the first high voltage wiring 33. In this embodiment, the third pattern 95 is electrically connected to the first high voltage wiring 33 via the second pattern 94 and the first pattern 93.

The third pattern 95 is routed in a form of dense lines such as to cover and hide a region of a portion of the third region 91. The third pattern 95 is formed in the third region 91 at intervals from the high voltage pads 12 (the sixth high voltage pads 12F) in plan view. That is, the third pattern 95 does not overlap with the high voltage pads 12 in plan view.

The third pattern 95 is formed at intervals from the corresponding low voltage connection wirings 72 in plan view. That is, the third pattern 95 does not overlap with the low voltage connection wirings 72 in plan view. An insulation distance between the third pattern 95 and the low voltage connection wirings 72 can thereby be increased in regard to the normal direction Z and the dielectric withstand voltage of the insulating laminated structure 51 can thus be increased.

The third pattern 95 includes the third outer peripheral line 103 described above, a fourth outer peripheral line 109, and a plurality of third intermediate lines 110. The fourth outer peripheral line 109 is a portion that extends as a band along a periphery of the high voltage coil 23 of the fourth transformer 21D. The third intermediate lines 110 are portions extending as bands in the third region 91.

In this embodiment, the fourth outer peripheral line 109 is formed in a ring shape having an open portion in the third region 91 in plan view. A width of the open portion of the fourth outer peripheral line 109 is less than the width along the second direction Y of each high voltage coil 23 of the fourth transformer 21D. The open portion of the fourth outer peripheral line 109 opposes the open portion of the third outer peripheral line 103 along the first direction X.

A width of the fourth outer peripheral line 109 may be not less than 0.1 µm and not more than 5 µm. The width of the fourth outer peripheral line 109 is defined by a width in a direction orthogonal to a direction in which the fourth outer peripheral line 109 extends. The width of the fourth outer peripheral line 109 may be not less than 0.1 µm and not more than 1 µm, not less than 1 µm and not more than 2 µm, not less than 2 µm and not more than 3 µm, not less than 3 µm and not more than 4 µm, or not less than 4 µm and not more than 5 µm. The width of the fourth outer peripheral line 109 is preferably not less than 1 µm and not more than 3 µm.

A pitch between the fourth outer peripheral line 109 and the high voltage coil 23 (the fourth transformer 21D) may be not less than 0.1 µm and not more than 5 µm. The pitch between the fourth outer peripheral line 109 and the high voltage coil 23 may be not less than 0.1 µm and not more than 1 µm, not less than 1 µm and not more than 2 µm, not less than 2 µm and not more than 3 µm, not less than 3 µm and not more than 4 µm, or not less than 4 µm and not more than 5 µm. The pitch between the fourth outer peripheral line 109 and the high voltage coil 23 is preferably not less than 1 μm and not more than 3 μm.

The width of the fourth outer peripheral line 109 is preferably equal to the width of the high voltage coil 23. That the width of the fourth outer peripheral line 109 is equal to the width of the high voltage coil 23 means that the width of the fourth outer peripheral line 109 falls in a range of within ±20% of the width of the high voltage coil 23.

The pitch of the fourth outer peripheral line 109 and the high voltage coil 23 means to be equal to the winding pitch of the high voltage coil 23. That the pitch of the fourth outer peripheral line 109 and the high voltage coil 23 is equal to the winding pitch of the high voltage coil 23 means that the pitch of the fourth outer peripheral line 109 and the high voltage coil 23 falls in a range of within ±20% of the winding pitch of the high voltage coil 23. These structures are effective in terms of suppressing the imbalance in the electric fields in the insulating laminated structure 51.

The plurality of third intermediate lines 110 extend as bands in a region of the third region 91 between the third outer peripheral line 103 and the fourth outer peripheral line 109. The plurality of third intermediate lines 110 include at least one (one in this embodiment) third connection line 111 that electrically connects the third outer peripheral line 103 and the fourth outer peripheral line 109.

From a standpoint of preventing the forming of a loop circuit of current, the plurality of third intermediate lines 110 preferably include just one third connection line 111. The position of the third connection line 111 is arbitrary and is not restricted to a specific location.

A slit 112 that interrupts a loop circuit of current is formed in at least one of the plurality of third intermediate lines 110. The position of the slit 112 is adjusted as appropriate by design of the plurality of third intermediate lines 110 and is not restricted to a specific location.

The plurality of third intermediate lines 110 are preferably formed as bands extending along the direction of opposing of the plurality of high voltage coils 23. In this embodiment, the plurality of third intermediate lines 110 are respectively formed as bands extending along the first direction X and are formed at intervals in the second direction Y. The plurality of third intermediate lines 110 are formed as stripes as a whole in plan view.

In this embodiment, the plurality of third intermediate lines 110 include a plurality of fifth lead-out portions 113 and a plurality of sixth lead-out portions 114. The plurality of fifth lead-out portions 113 are led out as stripes from the third outer peripheral line 103 toward the fourth outer peripheral line 109. Tip portions of the plurality of fifth lead-out portions 113 are formed at intervals to the third outer peripheral line 103 side from the fourth outer peripheral line 109.

The plurality of sixth lead-out portions 114 are led out as stripes from the fourth outer peripheral line 109 toward the third outer peripheral line 103. Tip portions of the plurality of sixth lead-out portions 114 are formed at intervals to the fourth outer peripheral line 109 side from the third outer peripheral line 103.

In this embodiment, the plurality of sixth lead-out portions 114 are formed alternately with and at intervals from the plurality of fifth lead-out portions 113 along the second direction Y in a mode of sandwiching one fifth lead-out portion 113 in the second direction Y.

The plurality of sixth lead-out portions 114 may sandwich the plurality of fifth lead-out portions 113. Also, the plurality of sixth lead-out portions 114 may be formed such as to be adjacent to the plurality of fifth lead-out portions 113. The slit 112, the plurality of fifth lead-out portions 113, and the plurality of sixth lead-out portions 114 suppress the forming of a loop circuit of current in the third pattern 95.

A width of each third intermediate line 110 in regard to the second direction Y may be not less than 0.1 μm and not more than 5 μm. The width of the third intermediate line 110 may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. The width of the third intermediate line 110 is preferably not less than 1 μm and not more than 3 μm.

Pitches between two mutually adjacent third intermediate lines 110 may be not less than 0.1 μm and not more than 5 μm. Each pitch between the third intermediate lines 110 is defined by a distance between mutually adjacent ones of the plurality of third intermediate lines 110 in regard to the second direction Y. The pitches between the third intermediate lines 110 may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. The pitches between the third intermediate lines 110 are preferably not less than 1 μm and not more than 3 μm.

The width of each third intermediate line 110 is preferably equal to the width of each high voltage coil 23. That the width of each third intermediate line 110 is equal to the width of each high voltage coil 23 means that the width of each third intermediate line 110 falls in a range of within ±20% of the width of each high voltage coil 23.

The pitches between the third intermediate lines 110 are preferably equal to each other. That the pitches between the third intermediate lines 110 are equal to each other means that the pitches between the third intermediate lines 110 fall in a range of within ±20% of the pitches.

The pitches between the third intermediate lines 110 are preferably equal to the winding pitch of each high voltage coil 23. That the pitches between the third intermediate lines 110 are equal to the winding pitch of each high voltage coil 23 means that the pitches between the third intermediate lines 110 fall in a range of within ±20% of the winding pitch of each high voltage coil 23. These structures are effective in terms of suppressing the imbalance in the electric fields in the insulating laminated structure 51.

Referring to FIG. 7 to FIG. 12, in this embodiment, the second high voltage dummy pattern 88 is electrically connected via the first high voltage dummy pattern 87 to the high voltage pads 12. More specifically, the second high voltage dummy pattern 88 includes a second connection portion 115 connected to the first high voltage dummy pattern 87. The position of the second connection portion 115 is arbitrary. The second high voltage dummy pattern 88 is thereby fixed at the same potential as the plurality of high voltage coils 23.

The second high voltage dummy pattern 88 suppresses the electric fields leaking out to the upper sides of the high voltage coils 23 and suppresses the electric field concentration with respect to the plurality of high voltage coils 23 in a region outside the first region 89, the second region 90, and the third region 91.

In this embodiment, the second high voltage dummy pattern 88 entirely surrounds a region including the plurality of high voltage coils 23 and the plurality of high voltage pads 12A to 12F in plan view. In this embodiment, the second high voltage dummy pattern 88 is formed to an oval annular shape (elliptical annular shape) in plan view.

The second high voltage dummy pattern 88 is thereby interposed in a region between the plurality of low voltage pads 11A to 11F and the plurality of high voltage coils 23 in plan view. Also, the second high voltage dummy pattern 88 is interposed in a region between the plurality of low voltage pads 11A to 11F and the plurality of high voltage pads 12A to 12F in plan view.

Also, the second high voltage dummy pattern 88 is interposed in a region between the field electrode 61 and the plurality of high voltage coils 23 in plan view. Also, the second high voltage dummy pattern 88 is interposed in a region between the field electrode 61 and the plurality of high voltage pads 12A to 12F.

In this embodiment, the second high voltage dummy pattern 88 includes a plurality (six in this embodiment) of high voltage lines 116A, 116B, 116C, 116D, 116E, and 116F. The number of high voltage lines is adjusted in accordance with the electric fields to be relaxed and is not restricted to a specific value. The plurality of high voltage lines 116A to 116F are formed at intervals in that order in directions away from the plurality of high voltage coils 23.

The plurality of high voltage lines 116A to 116F entirely surround the plurality of high voltage coils 23 in plan view. More specifically, the plurality of high voltage lines 116A to 116F entirely surround a region including the plurality of high voltage coils 23 and the plurality of high voltage pads 12A to 12F in plan view. In this embodiment, the plurality of high voltage lines 116A to 116F are formed to oval annular shapes (elliptical annular shapes) in plan view.

The plurality of high voltage lines 116A to 116F each have a slit 117 formed therein that interrupts a loop circuit of current. The positions of the slits 117 are adjusted as appropriate by design of the plurality of high voltage lines 116A to 116F and are not restricted to specific locations.

A width of each of the high voltage lines 116A to 116F may be not less than 0.1 μm and not more than 5 μm. The width of each of the high voltage lines 116A to 116F is defined by a width in a direction orthogonal to a direction in which the high voltage lines 116A to 116F extend. The width of each of the high voltage lines 116A to 116F may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. The width of each of the high voltage lines 116A to 116F is preferably not less than 1 μm and not more than 3 μm.

Pitches between two mutually adjacent ones of the high voltage lines 116A to 116F may be not less than 0.1 μm and not more than 5 μm. The pitches between the high voltage lines 116A to 116F may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. The pitches between the high voltage lines 116A to 116F are preferably not less than 1 μm and not more than 3 μm.

A pitch between the first high voltage dummy pattern 87 and the second high voltage dummy pattern 88 that are mutually adjacent may be not less than 0.1 μm and not more than 5 μm. The pitch between the first high voltage dummy pattern 87 and the second high voltage dummy pattern 88 may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. The pitch between the first high voltage dummy pattern 87 and the second high voltage dummy pattern 88 is preferably not less than 1 μm and not more than 3 μm.

The width of each of the high voltage lines 116A to 116F is preferably equal to the width of each high voltage coil 23. That the width of each of the high voltage lines 116A to 116F is equal to the width of each high voltage coil 23 means that the width of each of the high voltage lines 116A to 116F falls in a range of within ±20% of the width of each high voltage coil 23.

The pitches between the high voltage lines 116A to 116F are preferably equal to each other. That the pitches between the high voltage lines 116A to 116F are equal to each other means that the pitches between the high voltage lines 116A to 116F fall in a range of within ±20% of the pitches.

The pitches between the high voltage lines 116A to 116F are preferably equal to the winding pitch of each high voltage coil 23. That the pitches between the high voltage lines 116A to 116F are equal to the winding pitch of each high voltage coil 23 means that the pitches between the high voltage lines 116A to 116F fall in a range of within ±20% of the winding pitch of each high voltage coil 23.

These structures are effective in terms of suppressing the imbalance in the electric fields in the insulating laminated structure 51. The number, width, and pitches of the plurality of high voltage lines 116A to 116F are adjusted in accordance with the electric fields to be relaxed and are not restricted to specific values.

Referring to FIG. 7 to FIG. 12, the shield conductor layer 85 includes a floating dummy pattern 121 that is formed in an electrically floating state in the insulating laminated structure 51 such as to be positioned in the peripheries of the transformers 21A to 21D in plan view. The floating dummy pattern 121 is formed of a pattern (discontinuous pattern) differing from the high voltage coils 23 and the low voltage coils 22 and is independent of the transformers 21A to 21D. That is, the floating dummy pattern 121 does not function as the transformers 21A to 21D.

In this embodiment, the floating dummy pattern 121 is routed in a form of dense lines such as to partially cover and partially expose regions of the peripheries of the high voltage coils 23 in plan view. The floating dummy pattern 121 may be formed to a shape having ends or to an endless shape.

In this embodiment, the floating dummy pattern 121 is routed at a line density equal to the line density of the high voltage coils 23 per unit area. That the line density of the floating dummy pattern 121 is equal to the line density of the high voltage coils 23 means that the line density of the floating dummy pattern 121 falls within a range of ±20% of the line density of the high voltage coils 23.

Also, in this embodiment, the floating dummy pattern 121 is routed at the line density equal to the line density of the high voltage dummy pattern 86 per unit area. That the line density of the floating dummy pattern 121 is equal to the line density of the high voltage dummy pattern 86 means that the line density of the floating dummy pattern 121 falls within a range of ±20% of the line density of the high voltage dummy pattern 86.

The floating dummy pattern 121 shields the electric fields between the low voltage coils 22 and the high voltage coils 23 in the transformers 21A to 21D and suppresses the electric field concentration with respect to the high voltage coils 23. More specifically, the floating dummy pattern 121 shields the electric fields between the low voltage coils 22 and the high voltage coils 23 such that the electric fields leaking out to the upper sides of the high voltage coils 23 are dispersed in directions away from the high voltage coils 23.

Electric field concentration with respect to the high voltage coils 23 can thereby be suppressed.

Even more specifically, electric fields leaking out to an upper side of the high voltage dummy pattern 86 in a periphery of the high voltage dummy pattern 86 are dispersed in directions away from the high voltage coils 23 and the high voltage dummy pattern 86 by the floating dummy pattern 121. Thereby, electric field concentration with respect to the high voltage dummy pattern 86 can be suppressed and, at the same time, the electric field concentration with respect to the high voltage coils 23 can be suppressed appropriately.

A depth position of the floating dummy pattern 121 in the interior of the insulating laminated structure 51 is arbitrary and is adjusted in accordance with the electric field strengths to be relaxed. The floating dummy pattern 121 is preferably formed in a region in closer proximity to a high voltage coil 23 than a low voltage coil 22 in regard to the normal direction Z.

That the floating dummy pattern 121 is in proximity to the high voltage coil 23 in regard to the normal direction Z means that in regard to the normal direction Z, a distance between the floating dummy pattern 121 and the high voltage coil 23 is less than a distance between the floating dummy pattern 121 and the low voltage coil 22.

In this case, the electric field concentration with respect to the high voltage coil 23 can be suppressed appropriately. The more the distance between the floating dummy pattern 121 and the high voltage coil 23 in regard to the normal direction Z is decreased, the more the electric field concentration with respect to the high voltage coil 23 can be suppressed. The floating dummy pattern 121 is preferably formed in the same interlayer insulating layer 57 as the high voltage coil 23. In this case, the electric field concentration with respect to the high voltage coil 23 can be suppressed even more appropriately.

The floating dummy pattern 121 is preferably interposed in a region between a low voltage pad 11 and a high voltage coil 23 in plan view. In this case, undesirable conduction between the low voltage pad 11 and the high voltage coil 23 due to the electric field concentration at the high voltage coil 23 can be suppressed.

The floating dummy pattern 121 is preferably interposed in a region between a low voltage pad 11 and a high voltage pad 12 in plan view. In this case, undesirable conduction between the low voltage pad 11 and the high voltage pad 12 due to the electric field concentration at the corresponding high voltage coil 23 can be suppressed.

The floating dummy pattern 121 is preferably interposed in a region between the field electrode 61 and a high voltage coil 23 in plan view. In this case, undesirable conduction between the field electrode 61 and the high voltage coil 23 due to the electric field concentration at the high voltage coil 23 can be suppressed.

The floating dummy pattern 121 is preferably interposed in a region between the field electrode 61 and a high voltage pad 12 in plan view. In this case, undesirable conduction between the field electrode 61 and the high voltage pad 12 due to the electric field concentration at the corresponding high voltage coil 23 can be suppressed.

The floating dummy pattern 121 is formed such as to be oriented along the plurality of high voltage coils 23 in plan view. More specifically, the floating dummy pattern 121 entirely surrounds a region including the plurality of high voltage coils 23 and the plurality of high voltage pads 12 in plan view. In this embodiment, the floating dummy pattern 121 entirely surrounds a region including the plurality of high voltage coils 23 and the plurality of high voltage pads 12 across the high voltage dummy pattern 86 (second high voltage dummy pattern 88) in plan view.

Thereby, the floating dummy pattern 121 is interposed in a region between the plurality of low voltage pads 11A to 11F and the plurality of high voltage coils 23 in plan view. Also, the floating dummy pattern 121 is interposed in a region between the plurality of low voltage pads 11A to 11F and the plurality of high voltage pads 12A to 12F in plan view.

Also, the floating dummy pattern 121 is interposed in a region between the field electrode 61 and the plurality of high voltage coils 23 in plan view. Also, the floating dummy pattern 121 is interposed in a region between the field electrode 61 and the plurality of high voltage pads 12A to 12F.

In this embodiment, the floating dummy pattern 121 includes a plurality (six in this embodiment) of floating lines 122A, 122B, 122C, 122D, 122E, and 122F. The number of floating lines is adjusted in accordance with the electric fields to be relaxed and is not restricted to a specific value. The plurality of floating lines 122A to 122F are formed at intervals in that order in directions away from the plurality of high voltage coils 23.

The plurality of floating lines 122A to 122F entirely surround the plurality of high voltage coils 23 in plan view. More specifically, the plurality of floating lines 122A to 122F entirely surround a region including the plurality of high voltage coils 23 and the plurality of high voltage pads 12A to 12F in plan view. In this embodiment, the plurality of floating lines 122A to 122F are formed to oval annular shapes (elliptical annular shapes) in plan view.

A width of each of the floating lines 122A to 122F may be not less than 0.1 μm and not more than 5 μm. The width of each of the floating lines 122A to 122F is defined by a width in a direction orthogonal to a direction in which the floating lines 122A to 122F extend. The width of each of the floating lines 122A to 122F may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. The width of each of the floating lines 122A to 122F is preferably not less than 1 μm and not more than 3 μm.

Pitches between two mutually adjacent ones of the floating lines 122A to 122F may be not less than 0.1 μm and not more than 5 μm. The pitches between the floating lines 122A to 122F may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. The pitches between the floating lines 122A to 122F are preferably not less than 1 μm and not more than 3 μm.

A pitch between the floating dummy pattern 121 and the high voltage dummy pattern 86 (second high voltage dummy pattern 88) may be not less than 0.1 μm and not more than 5 μm. The pitch between the floating dummy pattern 121 and the high voltage dummy pattern 86 may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. The pitch between the floating dummy pattern 121 and the high voltage dummy pattern 86 is preferably not less than 1 μm and not more than 3 μm.

The width of each of the floating lines 122A to 122F is preferably equal to the width of each high voltage coil 23.

That the width of each of the floating lines 122A to 122F is equal to the width of each high voltage coil 23 means that the width of each of the floating lines 122A to 122F falls in a range of within ±20% of the width of each high voltage coil 23.

The pitches between the floating lines 122A to 122F are preferably equal to each other. That the pitches between the floating lines 122A to 122F are equal to each other means that the pitches between the floating lines 122A to 122F fall in a range of within ±20% of the pitches.

The pitches between the floating lines 122A to 122F are preferably equal to the winding pitch of each high voltage coil 23. That the pitches between the floating lines 122A to 122F are equal to the winding pitch of each high voltage coil 23 means that the pitches between the floating lines 122A to 122F fall in a range of within ±20% of the winding pitch of each high voltage coil 23. In FIG. to FIG. 12, an example where the pitches between the floating lines 122A to 122F exceed the winding pitch of each high voltage coil 23 is shown for the sake of clarity.

The pitch between the floating dummy pattern 121 and the high voltage dummy pattern 86 is preferably equal to the winding pitch of each high voltage coil 23. That the pitch between the floating dummy pattern 121 and the high voltage dummy pattern 86 is equal to the winding pitch of each high voltage coil 23 means that the pitch between the floating dummy pattern 121 and the high voltage dummy pattern 86 falls in a range of within ±20% of the winding pitch of each high voltage coil 23.

These structures are effective in terms of suppressing the imbalance in the electric fields in the insulating laminated structure 51. The number, width, and pitches of the plurality of floating lines 122A to 122F are adjusted in accordance with the electric fields to be relaxed and are not restricted to specific values.

Referring to FIG. 8 and FIG. 9, the electronic component 5 further includes a protective insulating layer 140 formed on the insulating principal surface 52 of the insulating laminated structure 51. The protective insulating layer 140 may also be referred to as a passivation layer. The protective insulating layer 140 covers the insulating principal surface 52 and protects the insulating laminated structure 51 and the substrate 41.

In this embodiment, the protective insulating layer 140 has a laminated structure that includes a first protective layer 141 and a second protective layer 142. The first protective layer 141 may include silicon oxide. The first protective layer 141 preferably includes USG (undoped silicate glass) which is silicon oxide that is not doped with an impurity. A thickness of the first protective layer 141 may be not less than 50 nm and not more than 200 nm (for example, approximately 150 nm). The thickness of the first protective layer 141 is not restricted to the above numerical values and may be not less than 50 nm and not more than 5000 nm.

The second protective layer 142 may include silicon nitride. A thickness of the second protective layer 142 may be not less than 500 nm and not more than 1500 nm (for example, approximately 1000 nm). The thickness of the second protective layer 142 is not restricted to the above numerical values and may be not less than 500 nm and not more than 5000 nm. By increasing a total thickness of the protective insulating layer 140, a dielectric withstand voltage on the high voltage coils 23 can be increased.

In a case where the first protective layer 141 is constituted of USG and the second protective layer 142 is constituted of silicon nitride, a dielectric breakdown voltage (V/cm) of USG exceeds a dielectric breakdown voltage (V/cm) of silicon nitride. Therefore, if the protective insulating layer 140 is to be thickened, it is preferable to form a first protective layer 141 that is thicker than the second protective layer 142.

The first protective layer 141 may include at least one of either of BPSG (boron doped phosphor silicate glass) and PSG (phosphorous silicate glass) as an example of silicon oxide. However, in this case, an impurity (boron and/or phosphorus) is included in the silicon oxide and therefore, in terms of increasing the dielectric withstand voltage on the high voltage coils 23, it is especially preferable to form a first protective layer 141 that is constituted of USG. Obviously, the protective insulating layer 140 may have a single layer structure constituted of one of either of the first protective layer 141 and the second protective layer 142.

The protective insulating layer 140 has a plurality of low voltage sub pad openings 143 and a plurality of high voltage sub pad openings 144. The plurality of low voltage sub pad openings 143 respectively expose the plurality of low voltage pads 11. The plurality of high voltage sub pad openings 144 respectively expose the plurality of high voltage pads 12.

The protective insulating layer 140 may have overlap portions riding on peripheral edge portions of the low voltage pads 11. The protective insulating layer 140 may have overlap portions riding on peripheral edge portions of the high voltage pads 12.

The electronic component 5 further includes a resin layer 145 formed on the protective insulating layer 140. The resin layer 145 may include a photosensitive resin. The resin layer 145 may include a polybenzoxazole and/or a polyimide as an example of the photosensitive resin. A thickness of the resin layer 145 may be not less than 1 μm and not more than 20 μm (for example, approximately 4 μm). Obviously, the thickness of the resin layer 145 may be not less than 20 μm (for example, not less than 1 μm and not more than 50 μm). By making the resin layer 145 thick, the dielectric withstand voltage on the high voltage coils 23 can be increased appropriately.

The resin layer 145 preferably exceeds the total thickness of the protective insulating layer 140. Further, a total thickness of the protective insulating layer 140 and the resin layer 145 is preferably not less than the distance D2 between a low voltage coil 22 and the corresponding high voltage coil 23. In this case, the total thickness of the protective insulating layer 140 is preferably not less than 2 μm and not more than 10 μm. Also, the thickness of the resin layer 145 is preferably not less than 5 μm and not more than 50 μm. By these structures, thickening of the protective insulating layer 140 and the resin layer 145 can be suppressed and, at the same time, the dielectric withstand voltage on the high voltage coils 23 can be increased appropriately by a laminated film of the protective insulating layer 140 and the resin layer 145.

The resin layer 145 includes a first resin layer 146 covering a region at a low voltage side and a second resin layer 147 covering a region at a high voltage side. The first resin layer 146 covers the field electrode 61. The first resin layer 146 has a plurality of low voltage pad openings 148 that respectively expose the plurality of low voltage pads 11 (low voltage sub pad openings 143). The first resin layer 146 may have overlap portions riding on peripheral edges (overlap portions) of the low voltage sub pad openings 143.

The second resin layer 147 is formed at an interval from the first resin layer 146 and exposes the protective insulating layer 140 between itself and the first resin layer 146. The second resin layer 147 has a plurality of high voltage pad openings 149 that respectively expose the plurality of high voltage pads 12 (high voltage sub pad openings 144). The second resin layer 147 may have overlap portions riding on peripheral edges (overlap portions) of the high voltage sub pad openings 144.

The second resin layer 147 entirely covers the transformers 21A to 21D and the shield conductor layer 85. More specifically, the second resin layer 147 entirely covers the plurality of high voltage coils 23, the plurality of high voltage pads 12, the first high voltage dummy pattern 87, the second high voltage dummy pattern 88, and the floating dummy pattern 121.

If the resin layer 145 is not formed, the plurality of high voltage coils 23, the plurality of high voltage pads 12, the field electrode 61, the first high voltage dummy pattern 87, the second high voltage dummy pattern 88, and the floating dummy pattern 121 may sustain damage due to a filler included in the package main body 2 (sealing resin). This type of damage is referred to as filler attack.

The resin layer 145 protects the plurality of high voltage coils 23, the plurality of high voltage pads 12, the field electrode 61, the first high voltage dummy pattern 87, the second high voltage dummy pattern 88, and the floating dummy pattern 121 from the filler included in the package main body 2 (sealing resin).

A slit between the first resin layer 146 and the second resin layer 147 functions as an anchor portion with respect to the package main body 2 (sealing resin). A portion of the package main body 2 (sealing resin) enters into the slit between the first resin layer 146 and the second resin layer 147. An adhesion force of the package main body 2 (sealing resin) to the electronic components 5 is thereby increased.

Obviously, the first resin layer 146 and the second resin layer 147 may be formed integrally. Also, the resin layer 145 may include just one of either of the first resin layer 146 and the second resin layer 147. However, in this case, filler attack must be taken into consideration.

Figure 13:
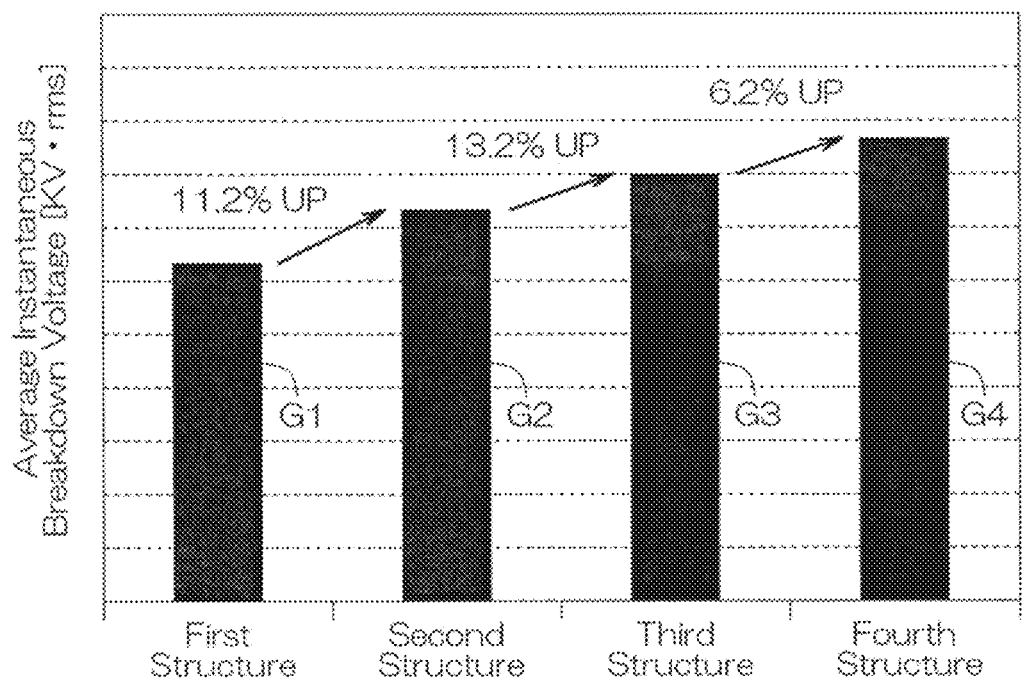
FIG. 13 is a graph of average instantaneous dielectric breakdown voltages.

FIG. 13 is a graph of average instantaneous dielectric breakdown voltages (dielectric withstand voltages). In FIG. 13, the ordinate indicates the average instantaneous dielectric breakdown voltage [KV·rms] and the abscissa indicates the item. A higher average instantaneous dielectric breakdown voltage means that the withstand voltage of the insulating laminated structure 51 is higher. A first bar G1, a second bar G2, a third bar G3, and a fourth bar G4 are shown in FIG. 13.

The first bar G1 indicates the average instantaneous dielectric breakdown voltage of the electronic component 5 according to a first structure. With the electronic component 5 according to the first structure, the shield conductor layer 85 is not formed. The second bar G2 indicates the average instantaneous dielectric breakdown voltage of the electronic component 5 according to a second structure. With the electronic component 5 according to the second structure, the shield conductor layer 85 that includes just the second high voltage dummy pattern 88 is formed.

The third bar G3 indicates the average instantaneous dielectric breakdown voltage of the electronic component 5 according to a third structure. With the electronic component 5 according to the third structure, the shield conductor layer 85 that includes just the floating dummy pattern 121 and the second high voltage dummy pattern 88 is formed.

The fourth bar G4 indicates the average instantaneous dielectric breakdown voltage of the electronic component 5 according to a fourth structure. With the electronic component 5 according to the fourth structure, the shield conductor layer 85 that includes the first high voltage dummy pattern 87, the second high voltage dummy pattern 88, and the floating dummy pattern 121 is formed.

Referring to the first bar G1 and the second bar G2, the average instantaneous dielectric breakdown voltage increased by 11.2% by forming the second high voltage dummy pattern 88. Referring to the second bar G2 and the third bar G3, the average instantaneous dielectric breakdown voltage increased by 13.2% by forming the floating dummy pattern 121 in addition to the second high voltage dummy pattern 88.

Referring to the third bar G3 and the fourth bar G4, the average instantaneous dielectric breakdown voltage increased by 6.2% by forming the first high voltage dummy pattern 87 in addition to the second high voltage dummy pattern 88 and the floating dummy pattern 121.

Referring to the first bar G1 and the fourth bar G4, the average instantaneous dielectric breakdown voltage increased by 13.37% by forming the first high voltage dummy pattern 87, the second high voltage dummy pattern 88, and the floating dummy pattern 121.

Figure 14:
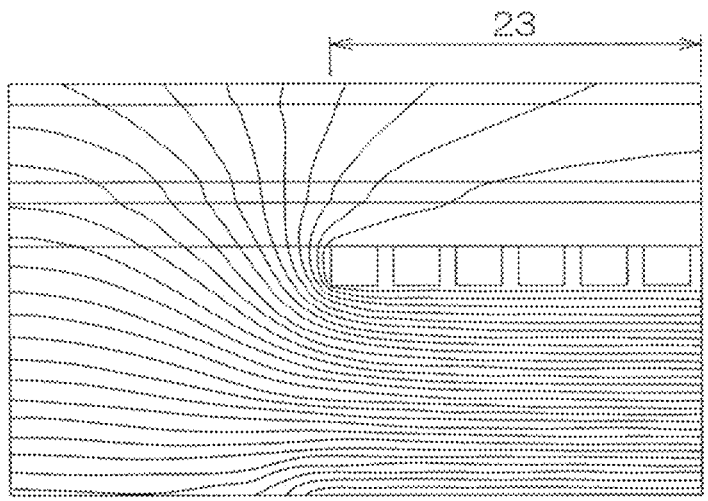
FIG. 14 is a diagram obtained by examining an electric field distribution in a vicinity of a high voltage coil by simulation.

FIG. 14 is a diagram obtained by examining equipotential lines (electric field distribution) in a vicinity of a high voltage coil 23 by simulation. The electric field distribution of the electronic component 5 according to the first structure described above is shown in FIG. 14.

Referring to FIG. 14, in the case of the electronic component 5 according to the first structure, the equipotential lines wrap around to an upper side of the high voltage coil 23 and concentrate at a peripheral edge of the high voltage coil 23. It can thus be understood that, with the electronic component 5 according to the first structure, the electric filed concentrates at the peripheral edge of the high voltage coil 23. The average instantaneous dielectric breakdown voltage is decreased by this type of electric field concentration.

Figure 15A:
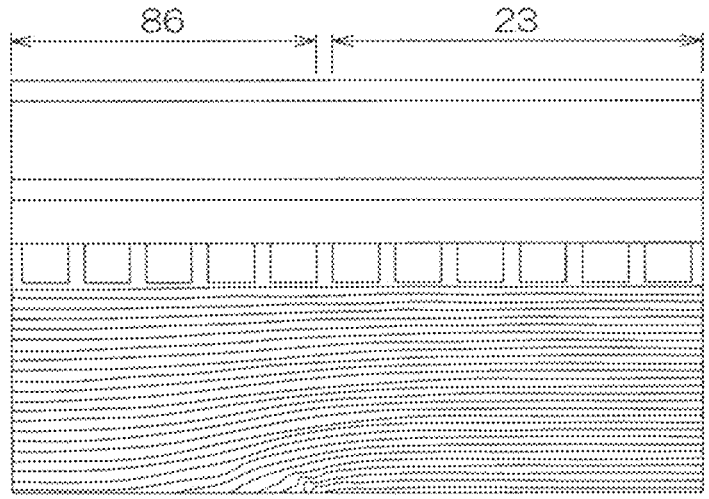
FIG. 15A is a diagram obtained by examining an electric field distribution of a first high voltage dummy pattern by simulation.

FIG. 15A is a diagram obtained by examining equipotential lines (electric field distribution) in a vicinity of the first high voltage dummy pattern 87 by simulation. The electric field distribution of the electronic component 5 according to the fourth structure described above is shown in FIG. 15A.

Referring to FIG. 15A, in the case of the electronic component 5 according to the fourth structure, the equipotential lines bypass the high voltage coil 23 and the first high voltage dummy pattern 87 and leak out to an upper side of the first high voltage dummy pattern 87. That is, in the case of the electronic component 5 according to the fourth structure, the electric field is not concentrated at the high voltage coil 23. The average instantaneous dielectric breakdown voltage can thereby be increased.

Although specific illustration is omitted, the second high voltage dummy pattern 88 also exhibits the same effect as the first high voltage dummy pattern 87. That is, in a vicinity of the second high voltage dummy pattern 88, the equipotential lines bypass the high voltage coil 23 and the second high voltage dummy pattern 88 and leak out to an upper side of the second high voltage dummy pattern 88. The electric field concentration with respect to the high voltage coil 23 can thereby be suppressed and the average instantaneous dielectric breakdown voltage can thus be increased.

Figure 15B:
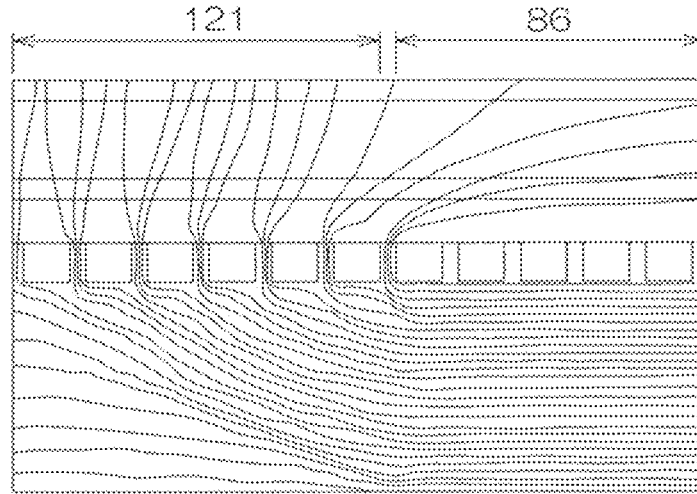
FIG. 15B is a diagram obtained by examining an electric field distribution of a floating dummy pattern by simulation.

FIG. 15B is a diagram obtained by examining an electric field distribution in a vicinity of the floating dummy pattern 121 by simulation. The electric field distribution of the electronic component 5 according to the fourth structure described above is shown in FIG. 15B.

Referring to FIG. 15B, in the case of the electronic component 5 according to the fourth structure, the equipotential lines leak out to the upper side of the high voltage coil 23 from regions between mutually adjacent portions of the floating dummy pattern 121. That is, in the case of the electronic component 5 according to the fourth structure, the electric field that leaks out to the upper side to the high voltage coil 23 is thinned out by the floating dummy pattern 121. The electric field concentration with respect to the high voltage coil 23 can thereby be suppressed and the average instantaneous dielectric breakdown voltage can thus be increased.

More specifically, the equipotential lines leak out to an upper side of the high voltage dummy pattern 86 from the regions between mutually adjacent portions of the floating dummy pattern 121. That is, in the case of the electronic component 5 according to the fourth structure, the electric field that leaks out to the upper side to the high voltage dummy pattern 86 is thinned out by the floating dummy pattern 121.

In the shield conductor layer 85 that includes the high voltage dummy pattern 86 and the floating dummy pattern 121, the high voltage dummy pattern 86 keeps the electric field leaking out to the upper side of the high voltage coil 23 away from the high voltage coil 23. On the other hand, in a region separated from the high voltage coil 23, the floating dummy pattern 121 disperses the electric field leaking out to the upper side of the high voltage dummy pattern 86 in directions away from the high voltage coil 23 and the high voltage dummy pattern 86. The electric field concentration with respect to the high voltage coil 23 can thereby be suppressed appropriately and the average instantaneous dielectric breakdown voltage can thus be increased appropriately.

It was thus found that the electric field concentration with respect to the high voltage coil 23 can be suppressed and the average instantaneous dielectric breakdown voltage can be increased by forming the shield conductor layer 85 that includes the first high voltage dummy pattern 87, the second high voltage dummy pattern 88, and the floating dummy pattern 121. It was also found from the results of FIG. 14, FIG. 15A, and FIG. 15B that it suffices that the shield conductor layer 85 include at least one among the first high voltage dummy pattern 87, the floating dummy pattern 121, and the second high voltage dummy pattern 88.

As described above, the electronic component 5 includes the shield conductor layer 85 formed in the insulating laminated structure 51 such as to be positioned in the peripheries of the high voltage coils 23 in plan view. The shield conductor layer 85 shields the electric fields formed between the low voltage coils 22 and the high voltage coils 23 and suppresses the electric field concentration with respect to the high voltage coils 23. The electric field concentration with respect to the high voltage coils 23 can thereby be suppressed and the average instantaneous dielectric breakdown voltage can thus be increased.

In this embodiment, the shield conductor layer 85 is interposed in the regions between the mutually adjacent ones of the plurality of high voltage coils 23 in plan view. The electric field concentration with respect to the plurality of high voltage coils 23 can thereby be suppressed using the regions between the mutually adjacent ones of the plurality of high voltage coils 23.

In this embodiment, the shield conductor layer 85 is interposed in the region between the low voltage pads 11 and the high voltage coils 23 in plan view. The undesirable conduction between the low voltage pads 11 and the high voltage coils 23 due to the electric field concentration at the high voltage coils 23 can thereby be suppressed.

The shield conductor layer 85 is interposed in the region between the low voltage pads 11 and the high voltage pads 12 in plan view. The undesirable conduction between the low voltage pads 11 and the high voltage pads 12 due to the electric field concentration at the high voltage coils 23 can thereby be suppressed.

The shield conductor layer 85 is interposed in the region between the field electrode 61 and the high voltage coils 23 in plan view. The undesirable conduction between the field electrode 61 and the high voltage coils 23 due to the electric field concentration at the high voltage coils 23 can thereby be suppressed.

The shield conductor layer 85 is interposed in the region between the field electrode 61 and the high voltage pads 12 in plan view. The undesirable conduction between the field electrode 61 and the high voltage pads 12 due to the electric field concentration at the high voltage coil 23 can thereby be suppressed.

The shield conductor layer 85 includes the high voltage dummy pattern 86 formed in the peripheries of the high voltage coils 23 in plan view. The electric fields leaking out to the upper sides of the high voltage coils 23 are suppressed in the regions of the peripheries of the high voltage coils 23 by the high voltage dummy pattern 86. The electric field concentration with respect to the high voltage coils 23 can thereby be suppressed appropriately in the regions of the peripheries of the high voltage coils 23.

More specifically, the shield conductor layer 85 includes the first high voltage dummy pattern 87 that is interposed in the regions between the mutually adjacent ones of the high voltage coils 23 in plan view. The first high voltage dummy pattern 87 suppresses the electric fields leaking out to the upper sides of the plurality of high voltage coils 23 in the regions between the mutually adjacent ones of the high voltage coils 23. The electric field concentration with respect to the plurality of high voltage coils 23 in the regions between the mutually adjacent ones of the high voltage coils 23 can thereby be suppressed appropriately.

Also, the shield conductor layer 85 includes the second high voltage dummy pattern 88 that is positioned in the region outside the regions between the mutually adjacent ones of the high voltage coils 23 in plan view. The second high voltage dummy pattern 88 suppresses the electric fields leaking out to the upper sides of the plurality of high voltage coils 23 in the region outside the regions between the mutually adjacent ones of the high voltage coils 23. The electric field concentration with respect to the plurality of high voltage coils 23 in the region outside the regions between the mutually adjacent ones of the high voltage coils 23 can thereby be suppressed appropriately.

Also, the shield conductor layer 85 includes the floating dummy pattern 121 that is formed in an electrically floating state in the peripheries of the high voltage coils 23 in plan view. The floating dummy pattern 121 shields the electric fields between the low voltage coils 22 and the high voltage coils 23 such as to disperse the electric fields leaking out to the upper sides of the high voltage coils 23. The electric field concentration with respect to the high voltage coils 23 can thus be suppressed.

Even more specifically, the floating dummy pattern 121 disperses the electric fields leaking out to the upper side of the high voltage dummy pattern 86 in the periphery of the high voltage dummy pattern 86. Thereby, the electric field concentration with respect to the high voltage dummy pattern 86 can be suppressed and, at the same time, the electric field concentration with respect to the high voltage coils 23 can be suppressed appropriately.

As can be understood from FIG. 14, the shield conductor layer 85 preferably includes all of the first high voltage dummy pattern 87, the floating dummy pattern 121, and the second high voltage dummy pattern 88. However, the average instantaneous dielectric breakdown voltage can be improved even with a shield conductor layer 85 that includes any one or two of the first high voltage dummy pattern 87, the floating dummy pattern 121, and the second high voltage dummy pattern 88.

That is, a shield conductor layer 85 having just the first high voltage dummy pattern 87 may be adopted. Also, a shield conductor layer 85 having just the second high voltage dummy pattern 88 may be adopted. Also, a shield conductor layer 85 having just the floating dummy pattern 121 may be adopted.

Also, a shield conductor layer 85 having just the first high voltage dummy pattern 87 and the second high voltage dummy pattern 88 may be adopted. Also, a shield conductor layer 85 having just the first high voltage dummy pattern 87 and the floating dummy pattern 121 may be adopted. Also, a shield conductor layer 85 having just the second high voltage dummy pattern 88 and the floating dummy pattern 121 may be adopted.

Also, the first high voltage dummy pattern 87 may be changed to a floating dummy pattern 121. Also, the first high voltage dummy pattern 87 and the second high voltage dummy pattern 88 may be changed to floating dummy patterns 121.

Such floating dummy patterns 121 are formed by disconnecting the first high voltage dummy pattern 87 and the second high voltage dummy pattern 88 from the high voltage connection wirings 81 (high voltage pads 12A to 12F).

With the floating dummy pattern 121, due to being formed in the electrically floating state, voltage drops with respect to the high voltage coils 23 are not formed. Therefore, with the floating dummy pattern 121, the electric field concentration with respect to the high voltage coils 23 can be suppressed while suppressing increase in electric field strength with respect to the high voltage coils 23. However, in the case of the floating dummy pattern 121, the presence of electric fields leaking out to the upper sides of the high voltage coils 23 should be taken into consideration.

Also, the floating dummy pattern 121 may be changed to a second high voltage dummy pattern 88. However, in this case, electric field strengths between the low voltage pads 11 (field electrode 61) and the second high voltage dummy pattern 88 increase as a result of distances between the low voltage pads 11 (field electrode 61) and the second high voltage dummy pattern 88 becoming close. A possibility that undesirable electric field concentration may occur at the high voltage coils 23 and at the second high voltage dummy pattern 88 when the electric field strengths increase should be taken into consideration.

Figure 16:
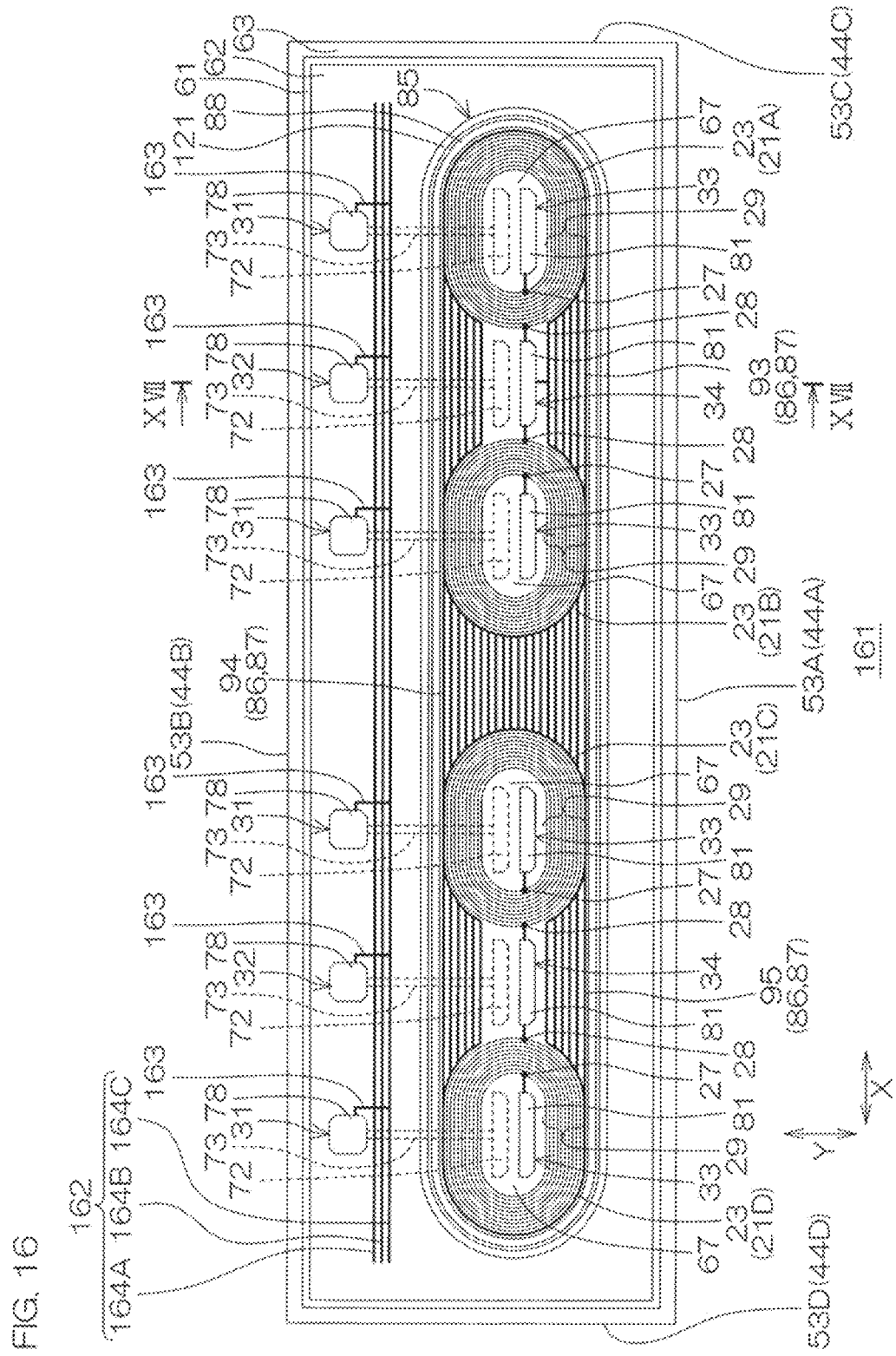
FIG. 16 is a plan view corresponding to FIG. 7 and is a plan view of an electronic component according to a second preferred embodiment of the present invention.
Figure 17:
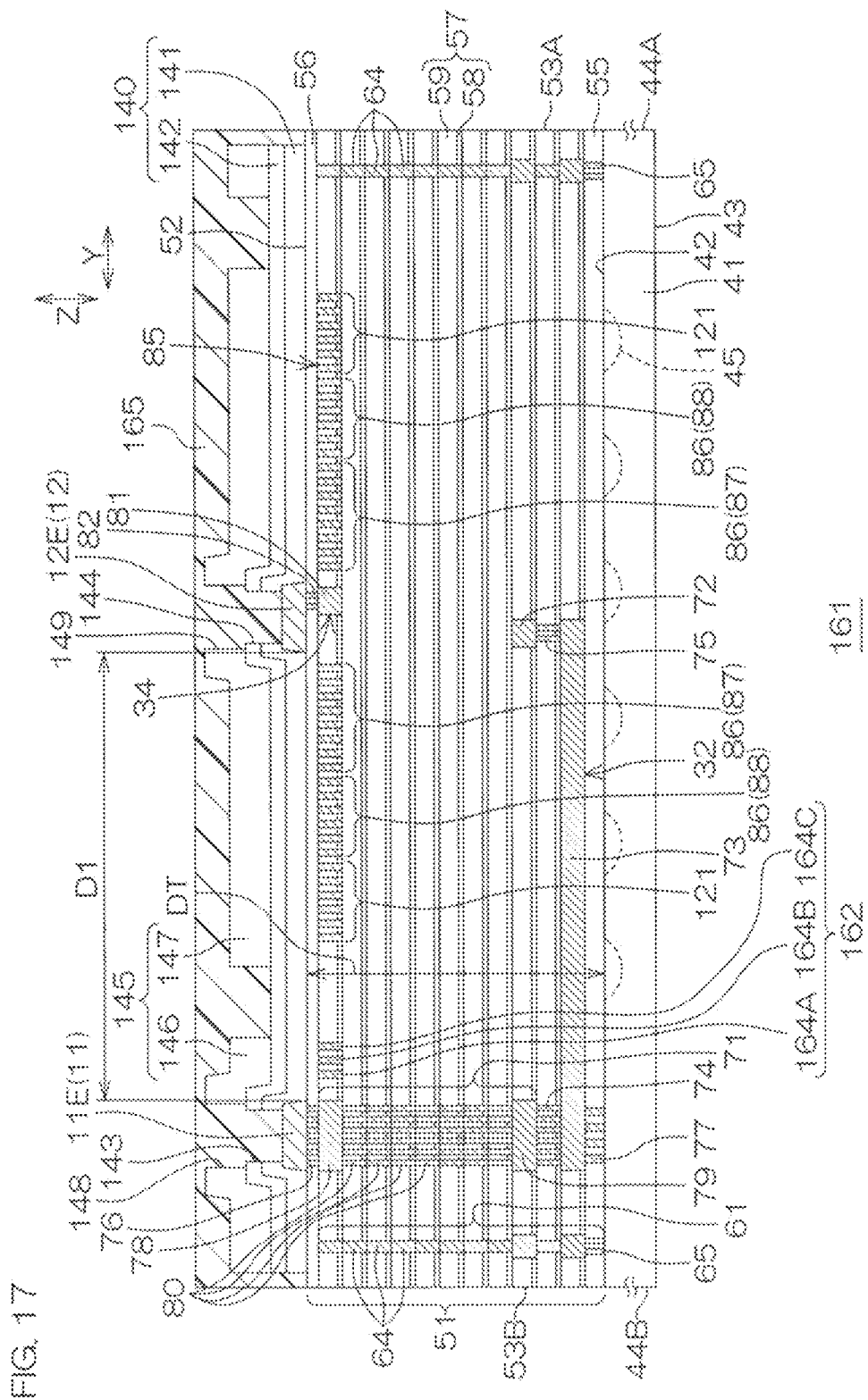
FIG. 17 is a sectional view taken along line XVII-XVII shown in FIG. 16.

FIG. 16 is a plan view corresponding to FIG. 7 and is a plan view of an electronic component 161 according to a second preferred embodiment of the present invention. FIG. 17 is a sectional view taken along line XVII-XVII shown in FIG. 16. In the following, structures corresponding to structures described with respect to the electronic component 5 are provided with the same reference symbols and description thereof is omitted.

Referring to FIG. 16 and FIG. 17, the electronic component 161 further includes a low voltage dummy pattern 162. In FIG. 16, the low voltage dummy pattern 162 is indicated by thick lines. The low voltage dummy pattern 162 is formed of a pattern (discontinuous pattern) differing from the high voltage coils 23 and the low voltage coils 22 and is independent of the transformers 21A to 21D. That is, the low voltage dummy pattern 162 does not function as the transformers 21A to 21D.

A voltage less than the voltage to be applied to the high voltage pads 12 is to be applied to the low voltage dummy pattern 162. The voltage (reference voltage) to be applied to the low voltage pads 11 is preferably to be applied to the low voltage dummy pattern 162. That is, the low voltage dummy pattern 162 is preferably made equipotential to the low voltage pads 11. The low voltage dummy pattern 162 includes a connection portion 163 connected to the second electrode layer 79. The position of the connection portion 163 is arbitrary.

The low voltage dummy pattern 162 is formed in peripheries of the low voltage pads 11 in plan view. The low voltage dummy pattern 162 is formed in a region in closer proximity to the low voltage pads 11 than the high voltage coils 23 (high voltage pads 12) in plan view.

That the low voltage dummy pattern 162 is in proximity to the low voltage pads 11 in plan view means that in plan view, a distance between the low voltage dummy pattern 162 and a low voltage pad 11 is less than a distance between the low voltage dummy pattern 162 and a high voltage coil 23 (high voltage pad 12).

A depth position of the low voltage dummy pattern 162 in an interior of the insulating laminated structure 51 is arbitrary and is adjusted in accordance with electric field strengths to be relaxed. The low voltage dummy pattern 162 is preferably formed in a region in the insulating laminated structure 51 in closer proximity to a low voltage pad 11 than a low voltage coil 22 in regard to the normal direction Z.

That the low voltage dummy pattern 162 is in proximity to the low voltage pad 11 in regard to the normal direction Z means that in regard to the normal direction Z, a distance between the low voltage dummy pattern 162 and the low voltage pad 11 is less than a distance between the low voltage dummy pattern 162 and the low voltage coil 22. The low voltage dummy pattern 162 is preferably formed in the same interlayer insulating layer 57 as a high voltage coil 23.

The low voltage dummy pattern 162 is preferably interposed in a region between a low voltage pad 11 and a high voltage coil 23 in plan view. The low voltage dummy pattern 162 is preferably interposed in a region between a low voltage pad 11 and a high voltage pad 12 in plan view.

In this embodiment, the low voltage dummy pattern 162 is routed at a line density equal to the line density of the high voltage coils 23 per unit area. That the line density of the low voltage dummy pattern 162 is equal to the line density of the high voltage coils 23 means that the line density of the low voltage dummy pattern 162 falls within a range of ±20% of the line density of the high voltage coils 23.

The low voltage dummy pattern 162 is preferably formed to a shape having ends. By this structure, forming of a loop circuit of current in the low voltage dummy pattern 162 can be suppressed appropriately. Noise due to current flowing through the low voltage dummy pattern 162 can thereby suppressed and therefore, undesirable electric field concentration due to the noise can be suppressed and, at the same time, fluctuations in the electrical characteristics of the transformers 21A to 21D can thereby be suppressed appropriately.

In this embodiment, the low voltage dummy pattern 162 is formed as a band extending along the first direction X. The low voltage dummy pattern 162 crosses the plurality of low voltage pads 11A to 11F in plan view. The low voltage dummy pattern 162 is thereby interposed in a region between the low voltage pads 11A to 11F and the plurality of high voltage coils 23 in plan view. Also, the low voltage dummy pattern 162 is interposed in a region between the low voltage pads 11A to 11F and the high voltage pads 12A to 12F in plan view.

In this embodiment, the low voltage dummy pattern 162 includes a plurality (three in this embodiment) of low voltage lines 164A, 164B, and 164C. The plurality of low voltage lines 164A to 163C are formed at intervals in that order from the low voltage pads 11A to 11F side toward the high voltage pads 12A to 12F side. The plurality of low voltage lines 164A to 163C are electrically connected to an arbitrary low voltage connection wiring 72.

The plurality of low voltage lines 164A to 163C are respectively formed as bands extending along the first direction X in plan view. That is, the plurality of low voltage lines 164A to 163C are formed as stripes extending along the first direction X as a whole in plan view.

A width of each of the low voltage lines 164A to 163C may be not less than 0.1 μm and not more than 5 μm. The width of each of the low voltage lines 164A to 163C is defined by a width in a direction orthogonal to the direction in which the low voltage lines 164A to 163C extend. The width of each of the low voltage lines 164A to 163C may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. The width of each of the low voltage lines 164A to 163C is preferably not less than 1 μm and not more than 3 μm.

Pitches between two mutually adjacent ones of the low voltage lines 164A to 163C may be not less than 0.1 μm and not more than 5 μm. The pitches between the low voltage lines 164A to 163C may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. The pitches between the low voltage lines 164A to 163C are preferably not less than 1 μm and not more than 3 μm.

The width of each of the low voltage lines 164A to 163C is preferably equal to the width of each high voltage coil 23. That the width of each of the low voltage lines 164A to 163C is equal to the width of each high voltage coil 23 means that the width of each of the low voltage lines 164A to 163C falls in a range of within ±20% of the width of each high voltage coil 23.

The pitches between the low voltage lines 164A to 163C are preferably equal to each other. That the pitches between the low voltage lines 164A to 163C are equal to each other means that the pitches between the low voltage lines 164A to 163C fall in a range of within ±20% of the pitches.

By these structures, the imbalance in the electric fields in the insulating laminated structure 51 can be suppressed and therefore, the undesirable electric field concentration can be suppressed. The number, width, and pitches of the low voltage lines 164A to 163C are adjusted in accordance with the electric fields to be relaxed and are not restricted to specific values.

The low voltage dummy pattern 162 may include at least one among titanium, titanium nitride, gold, silver, copper, aluminum, and tungsten. The low voltage dummy pattern 162 may have a laminated structure that includes a base electrode layer and a principal electrode layer.

The base electrode layer demarcates a recess space in the corresponding interlayer insulating layer 57. The base electrode layer may include at least one among titanium and titanium nitride. The principal electrode layer is embedded in the recess space demarcated by the base electrode layer. The principal electrode layer may include at least one among gold, silver, copper, aluminum, and tungsten. The principal electrode layer preferably includes copper or aluminum from standpoints of cost and mass productivity.

The low voltage dummy pattern 162 is preferably formed of the same conductive material as the high voltage coils 23. In this case, the high voltage coils 23 and the low voltage dummy pattern 162 can be formed at the same time using the same resist mask and photomask.

The electronic component 161 further includes a principal surface insulating layer 165 that covers the insulating principal surface 52 of the insulating laminated structure 51. On the insulating principal surface 52, the principal surface insulating layer 165 entirely covers the low voltage pads 11A to 11F, the high voltage pads 12A to 12F, the resin layer 145, the protective insulating layer 140 (second protective layer 142), etc.

The principal surface insulating layer 165 has a second dielectric breakdown strength BS2 that is not more than a first dielectric breakdown strength BS1 of the insulating laminated structure 51 (BS2≤BS1). More specifically, the second dielectric breakdown strength BS2 is less than the first dielectric breakdown strength BS1 (BS2<BS1).

More specifically, the insulating laminated structure 51 has the first dielectric breakdown strength BS1 of not less than 1 MV/cm and not more than 15 MV/cm due to including silicon nitride and/or silicon oxide. The first dielectric breakdown strength BS1 may be not less than 1 MV/cm and not more than 5 MV/cm, not less than 5 MV/cm and not more than 10 MV/cm, or not less than 10 MV/cm and not more than 15 MV/cm.

The first dielectric breakdown strength BS1 is preferably not less than 5 MV/cm and not more than 15 MV/cm. As long as it has the first dielectric breakdown strength BS1 of not less than 1 MV/cm, the insulating laminated structure 51 may include an insulating material besides silicon nitride and silicon oxide.

The second dielectric breakdown strength BS2 may be not less than 0.1 MV/cm and not more than 1 MV/cm. The second dielectric breakdown strength BS2 may be not less than 0.1 MV/cm and not more than 0.2 MV/cm, not less than 0.2 MV/cm and not more than 0.4 MV/cm, not less than 0.4 MV/cm and not more than 0.6 MV/cm, not less than 0.6 MV/cm and not more than 0.8 MV/cm, or not less than 0.8 MV/cm and not more than 1 MV/cm.

More specifically, the second dielectric breakdown strength BS2 is not less than 0.1 MV/cm and less than 1 MV/cm. The second dielectric breakdown strength BS2 may be not less than 0.1 MV/cm and not more than 0.5 MV/cm.

In this embodiment, the principal surface insulating layer 165 is constituted of a resin layer. The principal surface insulating layer 165 may include at least one among an epoxy resin layer, a polyimide resin layer, and a polybenzoxazole resin layer. The principal surface insulating layer 165 may be formed by a portion of the sealing resin.

If the principal surface insulating layer 165 is formed by a portion of the sealing resin, the principal surface insulating layer 165 may be formed by a portion of the package main body 2. That is, in a state of being sealed by the package main body 2, the principal surface insulating layer 165 may include a portion of the package main body 2 that covers the insulating principal surface 52 of the insulating laminated structure 51.

Electric field strengths between the low voltage pads 11A to 11F and the high voltage dummy pattern 86 are governed by the distance between the low voltage dummy pattern 162 and the high voltage dummy pattern 86. Therefore, in the insulating laminated structure 51, the electric field strengths between the low voltage pads 11A to 11F and the high voltage dummy pattern 86 are increased by the low voltage dummy pattern 162.

On the other hand, due to the increase in the electric field strengths in the insulating laminated structure 51, the electric field strengths in the principal surface insulating layer 165 decreases. That is, the low voltage dummy pattern 162 purposely increases the electric field strengths in the insulating laminated structure 51 that has the comparatively high first dielectric breakdown strength BS1 at the same time as decreasing the electric field strengths in the principal surface insulating layer 165 that has the comparatively low second dielectric breakdown strength BS2. The dielectric breakdown resistance of the principal surface insulating layer 165 can thereby be improved relatively.

With the electronic component 161 described above, the same effects as the effects described for the electronic component 5 can be exhibited. Also, with the electronic component 161, the low voltage dummy pattern 162 is included. The dielectric breakdown resistance of the principal surface insulating layer 165 can thereby be improved. The electronic component 161 that enables the withstand voltage to be increased can thus be provided.

Figure 18:
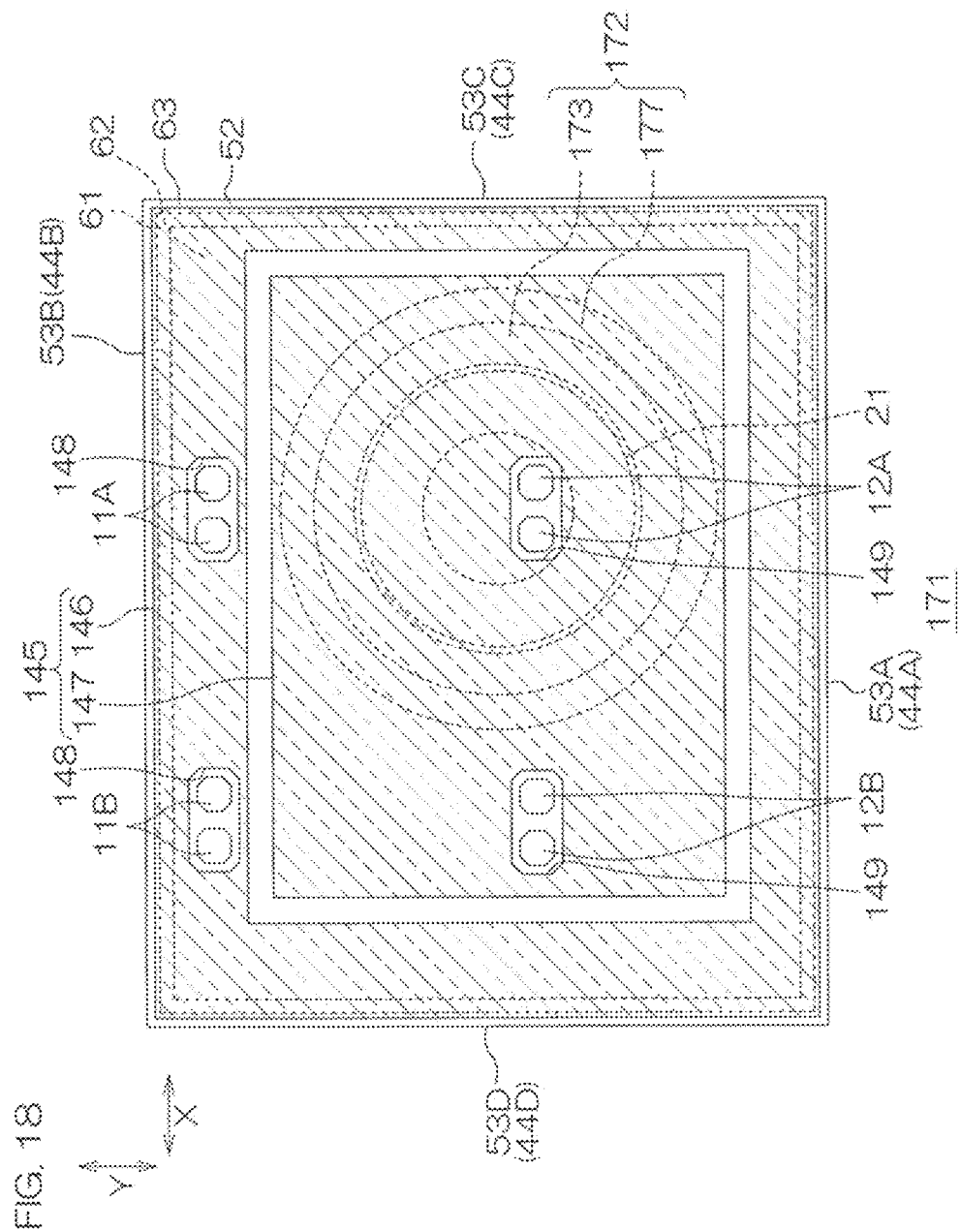
FIG. 18 is a plan view of an electronic component according to a third preferred embodiment of the present invention.
Figure 19:
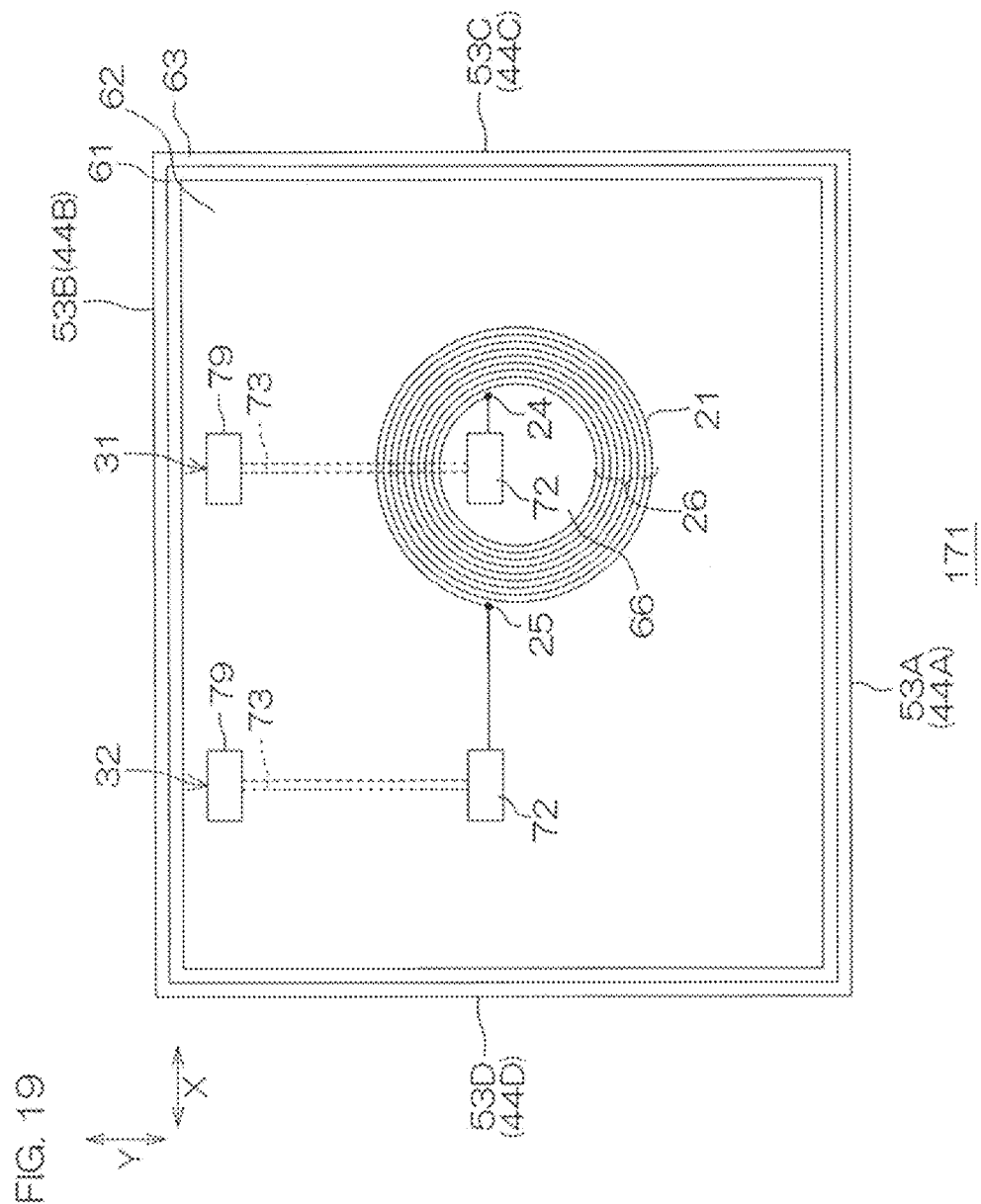
FIG. 19 is a plan view of a layer of the electronic component shown in FIG. 18 in which a low voltage coil is formed.
Figure 20:
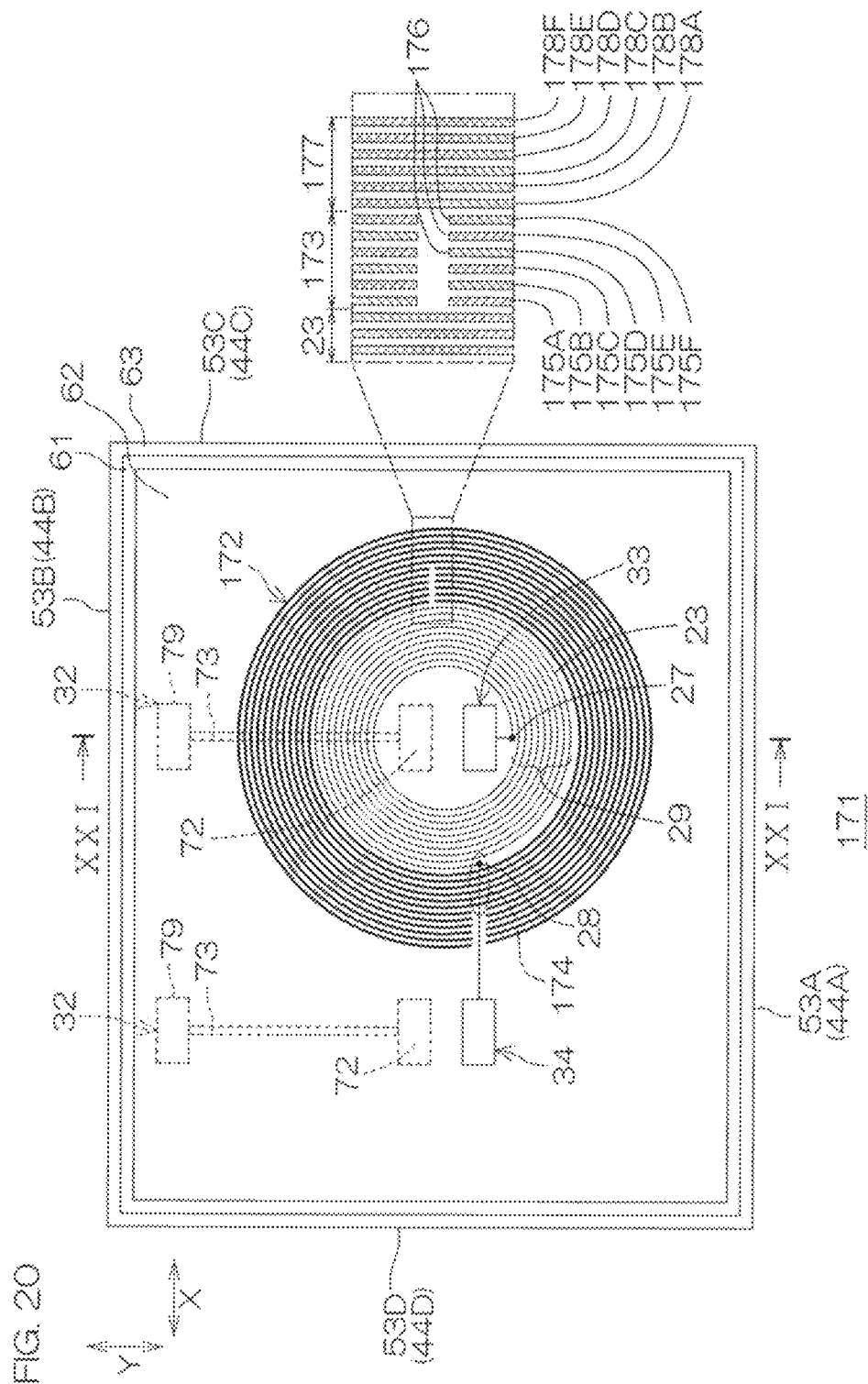
FIG. 20 is a plan view of a layer of the electronic component shown in FIG. 18 in which a high voltage coil is formed.
Figure 21:
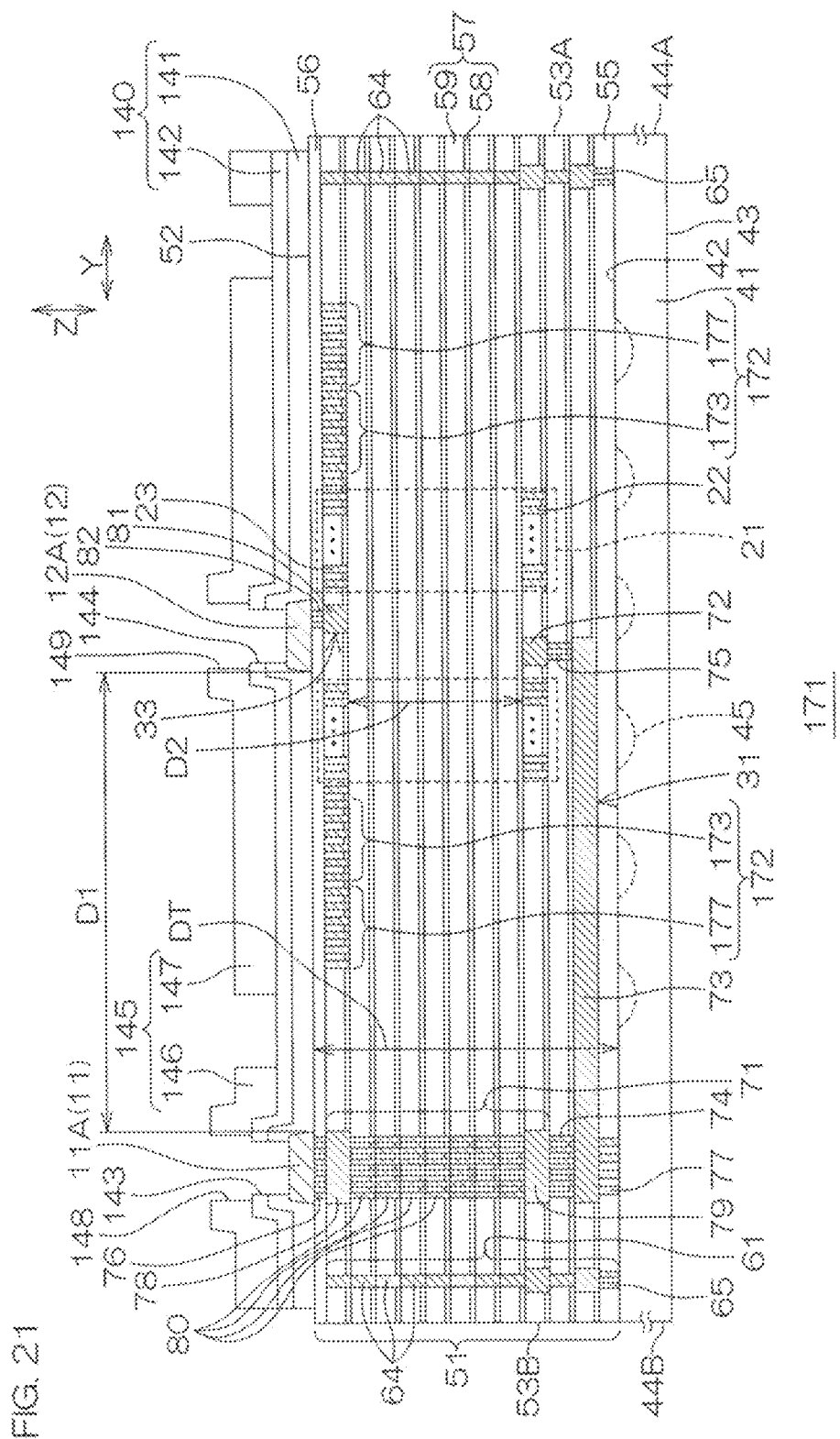
FIG. 21 is a sectional view taken along line XXI-XXI shown in FIG. 20.

FIG. 18 is a plan view of an electronic component 171 according to a third preferred embodiment of the present invention. FIG. 19 is a plan view of a layer of the electronic component 171 shown in FIG. 18 in which a low voltage coil 22 is formed. FIG. 20 is a plan view of a layer of the electronic component 171 shown in FIG. 18 in which a high voltage coil 23 is formed. FIG. 21 is a sectional view taken along line XXI-XXI shown in FIG. 20.

The electronic component 5 described above is a multichannel type device that includes the plurality of transformers 21. On the other hand, the electronic component 171 is a single channel type device that includes just one transformer 21. In the following, structures corresponding to the structures described with respect to the electronic component 5 are provided with the same reference symbols and description thereof is omitted.

Referring to FIG. 18 to FIG. 21, as with the electronic component 5, the electronic component 171 includes a plurality (four in this embodiment) of the low voltage pads 11, a plurality (four in this embodiment) of the high voltage pads 12, the transformer 21, a plurality (two in this embodiment) of the first low voltage wirings 31, a plurality (two in this embodiment) of the second low voltage wirings 32, a plurality (two in this embodiment) of the first high voltage wirings 33, a plurality (two in this embodiment) of the second high voltage wirings 34, the substrate 41, the insulating laminated structure 51, the field electrode 61, the protective insulating layer 140, and the resin layer 145.

The plurality of low voltage pads 11 are formed on the insulating principal surface 52 of the insulating laminated structure 51 in the device forming region 62. The plurality of low voltage pads 11 are formed in a region at the insulating side surface 53B side at intervals in the second direction Y from the transformer 21 and are aligned at intervals from each other along the first direction X. The positioning of the plurality of low voltage pads 11 is arbitrary and is not restricted to the positioning shown in FIG. 18.

The plurality of low voltage pads 11 include the first low voltage pads 11A and the second low voltage pads 11B. In this embodiment, the first low voltage pads 11A and the second low voltage pads 11B are respectively formed in twos. The numbers of the first low voltage pads 11A and the second low voltage pads 11B are arbitrary and are not restricted to the numbers shown in FIG. 18.

The first low voltage pads 11A oppose the transformer 21 in the second direction Y in plan view. In this embodiment, the second low voltage pads 11B do not oppose the transformer 21 in the second direction Y in plan view. The first low voltage pads 11A are electrically connected to the first inner terminal end 24 of the low voltage coil 22. The second low voltage pads 11B are electrically connected to the first outer terminal end 25 of the low voltage coil 22. The positioning of the plurality of low voltage pads 11 is arbitrary and is not restricted to the positioning shown in FIG. 18.

The plurality of high voltage pads 12 are formed on the insulating principal surface 52 of the insulating laminated structure 51 at intervals from the plurality of low voltage pads 11 in the device forming region 62. The plurality of high voltage pads 12 are formed in a region at the insulating side surface 53A side at intervals in the second direction Y from the plurality of low voltage pads 11 and are aligned at intervals from each other along the first direction X.

The plurality of high voltage pads 12 are formed in a region in proximity to the transformer 21 in plan view. That the plurality of high voltage pads 12 are in proximity to the transformer 21 in plan view means that in plan view, a distance between a high voltage pad 12 and the transformer 21 is less than a distance between a low voltage pad 11 and the high voltage pad 12.

More specifically, the plurality of high voltage pads 12 are formed at intervals along the first direction X such as to oppose the transformer 21 along the first direction X in plan view. Even more specifically, the plurality of high voltage pads 12 are formed at intervals along the first direction X such as to be positioned in the second inner region 67 of the high voltage coil 23 and a region outside the high voltage coil 23 in plan view. The plurality of high voltage pads 12 and the transformers 21 are thereby aligned in a single column along the first direction X in plan view.

The plurality of high voltage pads 12 include the first high voltage pads 12A and the second high voltage pads 12B. In this embodiment, the first high voltage pads 12A and the second high voltage pads 12B are respectively formed in twos. The numbers of the first high voltage pads 12A and the second high voltage pads 12B are arbitrary and are not restricted to the numbers shown in FIG. 18.

The first high voltage pads 12A are formed in the second inner region 67 of the high voltage coil 23 in plan view. The second high voltage pads 12B are formed in a region outside the transformer 21 in plan view. In this embodiment, the second high voltage pads 12B are formed in a region between the transformer 21 and the insulating side surface 53D in plan view.

The first high voltage pads 12A are electrically connected to the second inner terminal end 27 of the high voltage coil 23. The second high voltage pads 12B are electrically connected to the second outer terminal end 28 of the high voltage coil 23. The positioning of the plurality of high voltage pads 12 is arbitrary and is not restricted to the positioning shown in FIG. 18.

Referring to FIG. 19 and FIG. 21, a first low voltage wiring 31 is electrically connected to the low voltage pads 11A and the first inner terminal end 24 of the low voltage coil 22. As in the electronic component 5, the first low voltage wiring 31 includes a penetrating wiring 71, a low voltage connection wiring 72, a lead-out wiring 73, a first connecting plug electrode 74, a second connecting plug electrode 75, a pad plug electrode 76, and a substrate plug electrode 77.

On the other hand, a second low voltage wiring 32 is electrically connected to the low voltage pads 11B and the first outer terminal end 25 of the low voltage coil 22. As in the electronic component 5, the second low voltage wiring 32 includes a penetrating wiring 71, a low voltage connection wiring 72, a lead-out wiring 73, a first connecting plug electrode 74, a second connecting plug electrode 75, a pad plug electrode 76, and a substrate plug electrode 77.

Referring to FIG. 20 and FIG. 21, a first high voltage wiring 33 is electrically connected to the high voltage pads 12A and the first inner terminal end 24 of the high voltage coil 23. As in the electronic component 5, the first high voltage wiring 33 includes a high voltage connection wiring 81 and a pad plug electrode 82.

On the other hand, a second high voltage wiring 34 is electrically connected to the high voltage pads 12B and the second outer terminal end 28 of the high voltage coil 23. As in the electronic component 5, the second high voltage wiring 34 includes a high voltage connection wiring 81 and a pad plug electrode 82.

The distance D1 between a low voltage pad 11 and a corresponding high voltage pad 12 preferably exceeds the distance D2 between the low voltage coil 22 and the high voltage coil 23 (D2<D1). Also, the distance D1 preferably exceeds the total thickness DT of the plurality of interlayer insulating layers 57 (DT<D1).

The ratio D2/D1 of the distance D2 with respect to the distance D1 may be not less than 0.01 and not more than 0.1. The ratio D2/D1 may be not less than 0.01 and not more than 0.025, not less than 0.025 and not more than 0.05, not less than 0.05 and not more than 0.075, or not less than 0.075 and not more than 0.1. The distance D1 may be not less than 100 μm and not more than 500 μm. The distance D1 may be not less than 100 μm and not more than 200 μm, not less than 200 μm and not more than 300 μm, not less than 300 μm and not more than 400 μm, or not less than 400 μm and not more than 500 μm. The distance D2 may be not less than 1 μm and not more than 50 μm. The distance D2 is preferably not less than 5 μm and not more than 25 μm. The values of the distance D1 and the distance D1 are arbitrary and are adjusted as appropriate in accordance with the dielectric breakdown resistance to be realized.

Referring to FIG. 20 and FIG. 21, the electronic component 171 includes a shield conductor layer 172 formed in the insulating laminated structure 51 such as to be positioned in a periphery of the transformer 21 in plan view. In FIG. 20, the shield conductor layer 172 is indicated by thick lines.

The shield conductor layer 172 is formed of a pattern (discontinuous pattern) differing from the high voltage coil 23 and the low voltage coil 22 and is independent of the transformer 21. That is, the shield conductor layer 172 does not function as the transformer 21. The shield conductor layer 172 shields an electric field between the low voltage coil 22 and the high voltage coil 23 in the transformer 21 and suppresses electric field concentration with respect to the high voltage coil 23.

In this embodiment, the shield conductor layer 172 is routed in a form of dense lines such as to partially cover and partially expose a region of a periphery of the high voltage coil 23 in plan view. In this embodiment, the shield conductor layer 172 is routed at a line density equal to a line density of the high voltage coil 23 per unit area. That the line density of the shield conductor layer 172 is equal to the line density of the high voltage coil 23 means that the line density of the shield conductor layer 172 falls within a range of ±20% of the line density of the high voltage coil 23.

The shield conductor layer 172 is preferably formed in a region in closer proximity to the high voltage coil 23 than a low voltage pad 11 in plan view. That the shield conductor layer 172 is in proximity to the high voltage coil 23 in plan view means that a distance between the shield conductor layer 172 and the high voltage coil 23 is less than a distance between the shield conductor layer 172 and the low voltage pad 11.

A depth position of the shield conductor layer 172 in the interior of the insulating laminated structure 51 is arbitrary and is adjusted in accordance with the electric field strength to be relaxed. The shield conductor layer 172 is preferably formed in a region in closer proximity to the high voltage coil 23 than the low voltage coil 22 in regard to the normal direction Z.

That the shield conductor layer 172 is in proximity to the high voltage coil 23 in regard to the normal direction Z means that in regard to the normal direction Z, a distance between the shield conductor layer 172 and the high voltage coil 23 is less than a distance between the shield conductor layer 172 and the low voltage coil 22.

In this case, the electric field concentration with respect to the high voltage coil 23 can be suppressed appropriately. The more the distance between the shield conductor layer 172 and the high voltage coil 23 in regard to the normal direction Z is decreased, the more the electric field concentration with respect to the high voltage coil 23 can be suppressed. The shield conductor layer 172 is preferably formed in the same interlayer insulating layer 57 as the high voltage coil 23. In this case, the electric field concentration with respect to the high voltage coil 23 can be suppressed even more appropriately.

The shield conductor layer 172 is preferably interposed in a region between a low voltage pad 11 and the high voltage coil 23 in plan view. In this case, undesirable conduction between the low voltage pad 11 and the high voltage coil 23 due to the electric field concentration at the high voltage coil 23 can be suppressed.

The shield conductor layer 172 is preferably interposed in a region between a low voltage pad 11 and a high voltage pad 12 in plan view. In this case, undesirable conduction between the low voltage pad 11 and the high voltage pad 12 due to the electric field concentration at the high voltage coil 23 can be suppressed.

The shield conductor layer 172 is preferably interposed in a region between the field electrode 61 and the high voltage coil 23 in plan view. In this case, undesirable conduction between the field electrode 61 and the high voltage coil 23 due to the electric field concentration at the high voltage coil 23 can be suppressed.

The shield conductor layer 172 is preferably interposed in a region between the field electrode 61 and a high voltage pad 12 in plan view. In this case, undesirable conduction between the field electrode 61 and the high voltage pad 12 due to the electric field concentration at the high voltage coil 23 can be suppressed.

In this embodiment, the shield conductor layer 172 is formed such as to be oriented along the high voltage coil 23. Even more specifically, the shield conductor layer 172 surrounds the high voltage coil 23 in plan view.

Thereby, the shield conductor layer 172 is interposed in a region between the plurality of low voltage pads 11A and 11B and the high voltage coil 23 in plan view. Also, the shield conductor layer 172 is interposed in a region between the plurality of low voltage pads 11A and 11B and the high voltage pads 12A in plan view.

Also, the shield conductor layer 172 is interposed in a region between the field electrode 61 and the high voltage coil 23 in plan view. Also, the shield conductor layer 172 is interposed in a region between the field electrode 61 and the high voltage pads 12A in plan view.

The shield conductor layer 172 may include at least one among titanium, titanium nitride, gold, silver, copper, aluminum, and tungsten. The shield conductor layer 172 may have a laminated structure that includes a base electrode layer and a principal electrode layer.

The base electrode layer demarcates a recess space in the corresponding interlayer insulating layer 57. The base electrode layer may include at least one among titanium and titanium nitride. The principal electrode layer is embedded in the recess space demarcated by the base electrode layer. The principal electrode layer may include at least one among gold, silver, copper, aluminum, and tungsten. The principal electrode layer preferably includes copper or aluminum from standpoints of cost and mass productivity.

The shield conductor layer 172 is preferably formed of the same conductive material as the high voltage coil 23. In this case, the high voltage coil 23 and the shield conductor layer 172 can be formed at the same time using the same resist mask and photomask.

In this embodiment, the shield conductor layer 172 includes a plurality of dummy patterns differing from each other in electrical state. The forms of the dummy patterns shall now be described with reference to FIG. 20 and FIG. 21.

Referring to FIG. 20 and FIG. 21, the shield conductor layer 172 includes a high voltage dummy pattern 173. The high voltage dummy pattern 173 is formed in the insulating laminated structure 51 such as to be positioned in the periphery of the transformer 21 in plan view. The high voltage dummy pattern 173 is formed of a pattern (discontinuous pattern) differing from the high voltage coil 23 and the low voltage coil 22 and is independent of the transformer 21. That is, the high voltage dummy pattern 173 does not function as the transformer 21.

In this embodiment, the high voltage dummy pattern 173 is routed in a form of dense lines such as to partially cover and partially expose a region of the periphery of the high voltage coil 23 in plan view. In this embodiment, the high voltage dummy pattern 173 is routed at a line density equal to the line density of the high voltage coil 23 per unit area. That the line density of the high voltage dummy pattern 173 is equal to the line density of the high voltage coil 23 means that the line density of the high voltage dummy pattern 173 falls within a range of ±20% of the line density of the high voltage coil 23.

The high voltage dummy pattern 173 shields the electric field between the low voltage coil 22 and the high voltage coil 23 in the transformer 21 and suppresses the electric field concentration with respect to the high voltage coil 23. More specifically, the high voltage dummy pattern 173 shields the electric field between the low voltage coil 22 and the high voltage coil 23 to keep an electric field leaking out to an upper side of the high voltage coil 23 away from the high voltage coil 23. Electric field concentration at the high voltage coil 23 due to the electric field leaking out to the upper side of the high voltage coil 23 is thereby suppressed.

A voltage exceeding the voltage to be applied to the low voltage coil 22 is to be applied to the high voltage dummy pattern 173. A voltage drop between the high voltage coil 23 and the high voltage dummy pattern 173 can thereby be suppressed and therefore, the electric field concentration with respect to the high voltage coil 23 can be suppressed.

Preferably, the voltage to be applied to the high voltage coil 23 is to be applied to the high voltage dummy pattern 173. That is, the high voltage dummy pattern 173 is preferably made equipotential to the high voltage coil 23. The voltage drop between the high voltage coil 23 and the high voltage dummy pattern 173 can thereby be suppressed reliably and therefore, the electric field concentration with respect to the high voltage coil 23 can be suppressed appropriately.

In this embodiment, the high voltage dummy pattern 173 is electrically connected via the first high voltage wiring 33 to high voltage pads 12 (the second high voltage pads 12B). More specifically, the high voltage dummy pattern 173 includes a connection portion 174 connected to the first high voltage wiring 33. The position of the first connection portion 174 is arbitrary. The high voltage dummy pattern 173 is thereby fixed at the same potential as the high voltage coil 23.

A depth position of the high voltage dummy pattern 173 in the interior of the insulating laminated structure 51 is arbitrary and is adjusted in accordance with the electric field strength to be relaxed. The high voltage dummy pattern 173 is preferably formed in a region in closer proximity to the high voltage coil 23 than the low voltage coil 22 in regard to the normal direction Z.

That the high voltage dummy pattern 173 is in proximity to the high voltage coil 23 in regard to the normal direction Z means that in regard to the normal direction Z, a distance between the high voltage dummy pattern 173 and the high voltage coil 23 is less than a distance between the high voltage dummy pattern 173 and the low voltage coil 22.

In this case, the electric field concentration with respect to the high voltage coil 23 can be suppressed appropriately. The more the distance between the high voltage dummy pattern 173 and the high voltage coil 23 in regard to the normal direction Z is decreased, the more the electric field concentration with respect to the high voltage coil 23 can be suppressed. The high voltage dummy pattern 173 is preferably formed in the same interlayer insulating layer 57 as the high voltage coil 23. In this case, the electric field concentration with respect to the high voltage coil 23 can be suppressed even more appropriately.

The high voltage dummy pattern 173 is preferably formed in a region in closer proximity to the high voltage coil 23 than a low voltage pad 11 in plan view. That the high voltage dummy pattern 173 is in proximity to the high voltage coil 23 in plan view means that a distance between the high voltage dummy pattern 173 and the high voltage coil 23 is less than a distance between the high voltage dummy pattern 173 and the low voltage pad 11.

The high voltage dummy pattern 173 is preferably interposed in a region between a low voltage pad 11 and the high voltage coil 23 in plan view. In this case, undesirable conduction between the low voltage pad 11 and the high voltage coil 23 due to the electric field concentration at the high voltage coil 23 can be suppressed.

The high voltage dummy pattern 173 is preferably interposed in a region between a low voltage pad 11 and a high voltage pad 12 in plan view. In this case, undesirable conduction between the low voltage pad 11 and the high voltage pad 12 due to the electric field concentration at the high voltage coil 23 can be suppressed.

The high voltage dummy pattern 173 is preferably interposed in a region between the field electrode 61 and the high voltage coil 23 in plan view. In this case, undesirable conduction between the field electrode 61 and the high voltage coil 23 due to the electric field concentration at the high voltage coil 23 can be suppressed.

The high voltage dummy pattern 173 is preferably interposed in a region between the field electrode 61 and a high voltage pad 12 in plan view. In this case, undesirable conduction between the field electrode 61 and the high voltage pad 12 due to the electric field concentration at the high voltage coil 23 can be suppressed.

In this embodiment, the high voltage dummy pattern 173 is formed such as to be oriented along the high voltage coil 23 in plan view. More specifically, the high voltage dummy pattern 173 surrounds the high voltage coil 23 in plan view.

Thereby, the high voltage dummy pattern 173 is interposed in a region between the plurality of low voltage pads 11A and 11B and the high voltage coil 23 in plan view. Also, the high voltage dummy pattern 173 is interposed in a region between the plurality of low voltage pads 11A and 11B and the high voltage pads 12A in plan view.

Also, the high voltage dummy pattern 173 is interposed in a region between the field electrode 61 and the high voltage coil 23 in plan view. Also, the high voltage dummy pattern 173 is interposed in a region between the field electrode 61 and the high voltage pads 12A.

In the region outside the high voltage coil 23 in plan view, the high voltage dummy pattern 173 exposes a region directly below the high voltage pads 12B. A portion of the high voltage dummy pattern 173 may oppose the high voltage pads 12B in the normal direction Z.

In this case, the high voltage pads 12B, like the high voltage dummy pattern 173, shields the electric field to suppress the electric field leaking out to the upper side of the high voltage coil 23. That is, the high voltage pads 12B are formed as shield conductor layers that suppress the electric field concentration with respect to the high voltage coil 23.

The high voltage dummy pattern 173 is preferably formed to a shape having ends. In this case, forming of a loop circuit (closed circuit) of current in the high voltage dummy pattern 173 can be suppressed. Noise due to current flowing through the high voltage dummy pattern 173 is thereby suppressed. Consequently, undesirable electric field concentration due to the noise can be suppressed and, at the same time, fluctuations in electrical characteristics of the transformer 21 can be suppressed.

In this embodiment, the high voltage dummy pattern 173 includes a plurality (six in this embodiment) of high voltage lines 175A, 175B, 175C, 175D, 175E, and 175F. The number of high voltage lines is adjusted in accordance with the electric field to be relaxed and is not restricted to a specific value. The plurality of high voltage lines 175A to 175F are formed at intervals in that order in directions away from the transformer 21.

The plurality of high voltage lines 175A to 175F surround the transformer 21 in plan view. In this embodiment, the plurality of high voltage lines 175A to 175F are respectively formed to circular annular shapes in plan view.

The plurality of high voltage lines 175A to 175F each have a slit 176 formed therein that interrupts a loop circuit of current. The positions of the slits 176 are adjusted as appropriate by design of the plurality of high voltage lines 175A to 175F and are not restricted to specific locations.

A width of each of the high voltage lines 175A to 175F may be not less than 0.1 µm and not more than 5 µm. The width of each of the high voltage lines 175A to 175F is defined by a width in a direction orthogonal to a direction in which the high voltage lines 175A to 175F extend. The width of each of the high voltage lines 175A to 175F may be not less than 0.1 µm and not more than 1 µm, not less than 1 µm and not more than 2 µm, not less than 2 µm and not more than 3 µm, not less than 3 µm and not more than 4 µm, or not less than 4 µm and not more than 5 µm. The width of each of the high voltage lines 175A to 175F is preferably not less than 1 µm and not more than 3 µm.

Pitches between two mutually adjacent ones of the high voltage lines 175A to 175F may be not less than 0.1 µm and not more than 5 µm. The pitches between the high voltage lines 175A to 175F may be not less than 0.1 µm and not more than 1 µm, not less than 1 µm and not more than 2 µm, not less than 2 µm and not more than 3 µm, not less than 3 µm and not more than 4 µm, or not less than 4 µm and not more than 5 µm. The pitches between the high voltage lines 175A to 175F are preferably not less than 1 µm and not more than 3 µm.

A pitch between the high voltage dummy pattern 173 and the high voltage coil 23 may be not less than 0.1 µm and not more than 5 µm. The pitch between the high voltage dummy pattern 173 and the high voltage coil 23 may be not less than 0.1 µm and not more than 1 µm, not less than 1 µm and not more than 2 µm, not less than 2 µm and not more than 3 µm, not less than 3 µm and not more than 4 µm, or not less than 4 µm and not more than 5 µm. The pitch between the high voltage dummy pattern 173 and the high voltage coil 23 is preferably not less than 1 µm and not more than 3 µm.

The width of each of the high voltage lines 175A to 175F is preferably equal to the width of the high voltage coil 23. That the width of each of the high voltage lines 175A to 175F is equal to the width of the high voltage coil 23 means that the width of each of the high voltage lines 175A to 175F falls in a range of within ±20% of the width of the high voltage coil 23.

The pitches between the high voltage lines 175A to 175F are preferably equal to each other. That the pitches between the high voltage lines 175A to 175F are equal to each other means that the pitches between the high voltage lines 175A to 175F fall in a range of within ±20% of the pitches.

The pitches between the high voltage lines 175A to 175F are preferably equal to the winding pitch of the high voltage coil 23. That the pitches between the high voltage lines 175A to 175F are equal to the winding pitch of the high voltage coil 23 means that the pitches between the high voltage lines 175A to 175F fall in a range of within ±20% of the winding pitch of the high voltage coil 23.

The pitch between the high voltage dummy pattern 173 and the high voltage coil 23 is preferably equal to the winding pitch of the high voltage coil 23. That the pitch between the high voltage dummy pattern 173 and the high voltage coil 23 is equal to the winding pitch of the high voltage coil 23 means that the pitch between the high voltage dummy pattern 173 and the high voltage coil 23 falls in a range of within ±20% of the winding pitch of the high voltage coil 23.

These structures are effective in terms of suppressing the imbalance in the electric fields in the insulating laminated structure 51. The number, width, and pitches of the plurality of high voltage lines 175A to 175F are adjusted in accordance with the electric fields to be relaxed and are not restricted to specific values.

The shield conductor layer 172 includes a floating dummy pattern 177 that is formed in an electrically floating state in the insulating laminated structure 51 such as to be positioned in the periphery of the transformer 21 in plan view. The floating dummy pattern 177 is formed of a pattern (discontinuous pattern) differing from the high voltage coil 23 and the low voltage coil 22 and is independent of the transformer 21. That is, the floating dummy pattern 177 does not function as the transformer 21.

In this embodiment, the floating dummy pattern 177 is routed in a form of dense lines such as to partially cover and partially expose a region of the periphery of the high voltage coil 23 in plan view. More specifically, the floating dummy pattern 177 is formed in a region of a periphery of the high voltage dummy pattern 173 in plan view. The floating dummy pattern 177 may be formed to a shape having ends or to an endless shape.

In this embodiment, the floating dummy pattern 177 is routed at a line density equal to the line density of the high voltage coil 23 per unit area. That the line density of the floating dummy pattern 177 is equal to the line density of the high voltage coil 23 means that the line density of the floating dummy pattern 177 falls within a range of ±20% of the line density of the high voltage coil 23.

Also, in this embodiment, the floating dummy pattern 177 is routed at the line density equal to the line density of the high voltage dummy pattern 173 per unit area. That the line density of the floating dummy pattern 177 is equal to the line density of the high voltage dummy pattern 173 means that the line density of the floating dummy pattern 177 falls within a range of ±20% of the line density of the high voltage dummy pattern 173.

The floating dummy pattern 177 shields the electric field between the low voltage coil 22 and the high voltage coil 23 in the transformer 21 and suppresses the electric field concentration with respect to the high voltage coil 23. More specifically, the floating dummy pattern 177 shields the electric field between the low voltage coil 22 and the high voltage coil 23 such that the electric field leaking out to the upper side of the high voltage coil 23 is dispersed in directions away from the high voltage coil 23. Electric field concentration with respect to the high voltage coil 23 can thereby be suppressed.

Even more specifically, an electric field leaking out to an upper side of the high voltage dummy pattern 173 in the periphery of the high voltage dummy pattern 86 is dispersed in directions away from the high voltage dummy pattern 173 by the floating dummy pattern 177. Thereby, electric field concentration with respect to the high voltage dummy pattern 173 can be suppressed and, at the same time, the electric field concentration with respect to the high voltage coil 23 can be suppressed appropriately.

A depth position of the floating dummy pattern 177 in the interior of the insulating laminated structure 51 is arbitrary and is adjusted in accordance with the electric field strength to be relaxed. The floating dummy pattern 177 is preferably formed in a region in closer proximity to the high voltage coil 23 than the low voltage coil 22 in regard to the normal direction Z.

That the floating dummy pattern 177 is in proximity to the high voltage coil 23 in regard to the normal direction Z means that in regard to the normal direction Z, a distance between the floating dummy pattern 177 and the high voltage coil 23 is less than a distance between the floating dummy pattern 177 and the low voltage coil 22.

In this case, the electric field concentration with respect to the high voltage coil 23 can be suppressed appropriately. The more the distance between the floating dummy pattern 177 and the high voltage coil 23 in regard to the normal direction Z is decreased, the more the electric field concentration with respect to the high voltage coil 23 can be suppressed. The floating dummy pattern 177 is preferably formed in the same interlayer insulating layer 57 as the high voltage coil 23. In this case, the electric field concentration with respect to the high voltage coil 23 can be suppressed even more appropriately.

The floating dummy pattern 177 is preferably interposed in a region between a low voltage pad 11 and the high voltage coil 23 in plan view. In this case, undesirable conduction between the low voltage pad 11 and the high voltage coil 23 due to the electric field concentration at the high voltage coil 23 can be suppressed.

The floating dummy pattern 177 is preferably interposed in a region between a low voltage pad 11 and a high voltage pad 12 in plan view. In this case, undesirable conduction between the low voltage pad 11 and the high voltage pad 12 due to the electric field concentration at the high voltage coil 23 can be suppressed.

The floating dummy pattern 177 is preferably interposed in a region between the field electrode 61 and the high voltage coil 23 in plan view. In this case, undesirable conduction between the field electrode 61 and the high voltage coil 23 due to the electric field concentration at the high voltage coil 23 can be suppressed.

The floating dummy pattern 177 is preferably interposed in a region between the field electrode 61 and a high voltage pad 12 in plan view. In this case, undesirable conduction between the field electrode 61 and the high voltage pad 12 due to the electric field concentration at the high voltage coil 23 can be suppressed.

The floating dummy pattern 177 is formed such as to be oriented along the high voltage coil 23 in plan view. More specifically, the floating dummy pattern 177 surrounds the high voltage coil 23 in plan view. In this embodiment, the floating dummy pattern 177 surrounds a region including the high voltage coil 23 across the high voltage dummy pattern 173 in plan view.

Thereby, the floating dummy pattern 177 is interposed in a region between the plurality of low voltage pads 11A and 11B and the high voltage coil 23 in plan view. Also, the floating dummy pattern 177 is interposed in a region between the plurality of low voltage pads 11A and 11B and the high voltage pads 12A in plan view.

Also, the floating dummy pattern 177 is interposed in a region between the field electrode 61 and the high voltage coil 23 in plan view. Also, the floating dummy pattern 177 is interposed in a region between the field electrode 61 and the high voltage pads 12A in plan view.

In this embodiment, the floating dummy pattern 177 includes a plurality (six in this embodiment) of floating lines 178A, 178B, 178C, 178D, 178E, and 178F. The number of floating lines is adjusted in accordance with the electric field to be relaxed and is not restricted to a specific value. The plurality of floating lines 178A to 178F are formed at intervals in that order in directions away from the high voltage coil 23.

The plurality of floating lines 178A to 178F surround the high voltage coil 23 in plan view. In this embodiment, the plurality of floating lines 178A to 178F are respectively formed to circular annular shapes in plan view.

A width of each of the floating lines 178A to 178F may be not less than 0.1 µm and not more than 5 µm. The width of each of the floating lines 178A to 178F is defined by a width in a direction orthogonal to a direction in which the floating lines 178A to 178F extend. The width of each of the floating lines 178A to 178F may be not less than 0.1 µm and not more than 1 µm, not less than 1 µm and not more than 2 µm, not less than 2 µm and not more than 3 µm, not less than 3 µm and not more than 4 µm, or not less than 4 µm and not more than 5 µm. The width of each of the floating lines 178A to 178F is preferably not less than 1 µm and not more than 3 µm.

Pitches between two mutually adjacent ones of the floating lines 178A to 178F may be not less than 0.1 µm and not more than 5 µm. The pitches between the floating lines 178A to 178F may be not less than 0.1 µm and not more than 1 µm, not less than 1 µm and not more than 2 µm, not less than 2 µm and not more than 3 µm, not less than 3 µm and not more than 4 µm, or not less than 4 µm and not more than 5 µm. The pitches between the floating lines 178A to 178F are preferably not less than 1 µm and not more than 3 µm.

A pitch between the floating dummy pattern 177 and the high voltage dummy pattern 173 may be not less than 0.1 µm and not more than 5 µm. The pitch between the floating dummy pattern 177 and the high voltage dummy pattern 173 may be not less than 0.1 µm and not more than 1 µm, not less than 1 µm and not more than 2 µm, not less than 2 µm and not more than 3 µm, not less than 3 µm and not more than 4 µm, or not less than 4 µm and not more than 5 µm. The pitch between the floating dummy pattern 177 and the high voltage dummy pattern 173 is preferably not less than 1 µm and not more than 3 µm.

The width of each of the floating lines 178A to 178F is preferably equal to the width of the high voltage coil 23. That the width of each of the floating lines 178A to 178F is equal to the width of the high voltage coil 23 means that the width of each of the floating lines 178A to 178F falls in a range of within ±20% of the width of the high voltage coil 23.

The pitches between the floating lines 178A to 178F are preferably equal to each other. That the pitches between the floating lines 178A to 178F are equal to each other means that the pitches between the floating lines 178A to 178F fall in a range of within ±20% of the pitches.

The pitches between the floating lines 178A to 178F are preferably equal to the winding pitch of the high voltage coil 23. That the pitches between the floating lines 178A to 178F are equal to the winding pitch of the high voltage coil 23 means that the pitches between the floating lines 178A to 178F fall in a range of within ±20% of the winding pitch of the high voltage coil 23.

The pitch between the floating dummy pattern 177 and the high voltage dummy pattern 173 is preferably equal to the winding pitch of the high voltage coil 23. That the pitch between the floating dummy pattern 177 and the high voltage dummy pattern 173 is equal to the winding pitch of the high voltage coil 23 means that the pitch between the floating dummy pattern 177 and the high voltage dummy pattern 173 falls in a range of within ±20% of the winding pitch of the high voltage coil 23.

These structures are effective in terms of suppressing the imbalance in the electric fields in the insulating laminated structure 51. The number, width, and pitches of the plurality of floating lines 178A to 178F are adjusted in accordance with the electric fields to be relaxed and are not restricted to specific values.

Referring to FIG. 21, the protective insulating layer 140 has a plurality of the low voltage sub pad openings 143 and a plurality of the high voltage sub pad openings 144. The plurality of low voltage sub pad openings 143 respectively expose the plurality of low voltage pads 11. The plurality of high voltage sub pad openings 144 respectively expose the plurality of high voltage pads 12.

The resin layer 145 includes the first resin layer 146 covering a region at a low voltage side and the second resin layer 147 covering a region at a high voltage side. The first resin layer 146 covers the field electrode 61. The first resin layer 146 has a plurality of the low voltage pad openings 148 that respectively expose the plurality of low voltage pads 11 (low voltage sub pad openings 143).

The second resin layer 147 is formed at an interval from the first resin layer 146. The second resin layer 147 has a plurality of the high voltage pad openings 149 that respectively expose the plurality of high voltage pads 12 (high voltage sub pad openings 144).

The second resin layer 147 entirely covers the transformer 21 and the shield conductor layer 172. More specifically, the second resin layer 147 entirely covers the high voltage coil 23, the plurality of high voltage pads 12, the high voltage dummy pattern 173, and the floating dummy pattern 177.

Even with the electronic component 171 described above, the same effects as the effects described for the electronic component 5 can be exhibited. The electronic component 171 may also include the low voltage dummy pattern 162 according to the second preferred embodiment.

As with the electronic component 5, the electric field concentration with respect to the high voltage coil 23 can be suppressed with the electronic component 171 by forming at least one of the high voltage dummy pattern 173 and the floating dummy pattern 177. An average instantaneous dielectric breakdown voltage can thereby be increased.

The floating dummy pattern 177 may be changed to a high voltage dummy pattern 173. However, in this case, electric field strengths between the low voltage pads 11 and the high voltage dummy pattern 173 increase as a result of distances between the low voltage pads 11 and the high voltage dummy pattern 173 becoming close. A possibility that undesirable electric field concentration may occur at the high voltage coil 23 and at the high voltage dummy pattern 173 when the electric field strengths increase should be taken into consideration.

The high voltage dummy pattern 173 may be changed to a floating dummy pattern 177. Such a floating dummy pattern 177 is formed by disconnecting the high voltage dummy pattern 173 from the high voltage connection wiring 81 (high voltage pads 12B). With the floating dummy pattern 177, the electric field concentration with respect to the high voltage coil 23 can be suppressed while suppressing increase in electric field strengths between the low voltage pads 11 and the high voltage coil 23. However, in the case of the floating dummy pattern 177, the presence of an electric field leaking out to the upper side of the high voltage coil 23 should be taken into consideration.

Figure 22:
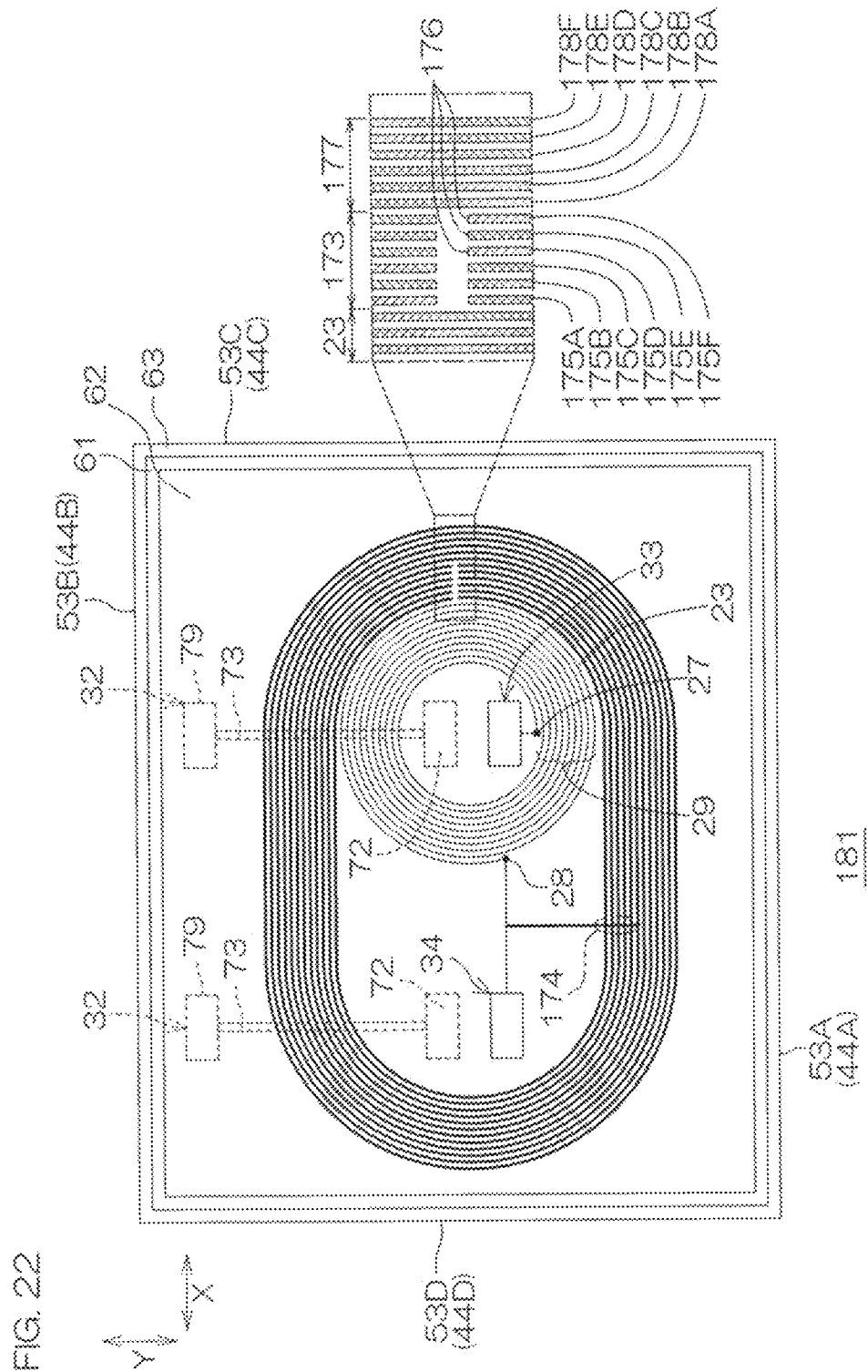
FIG. 22 is a plan view corresponding to FIG. 20 and is a plan view of an electronic component according to a fourth preferred embodiment of the present invention.

FIG. 22 is a plan view corresponding to FIG. 20 and is a plan view of an electronic component 181 according to a fourth preferred embodiment of the present invention. In the following, structures corresponding to structures described with respect to the electronic component 171 are provided with the same reference symbols and description thereof is omitted.

With the electronic component 171, the high voltage dummy pattern 173 surrounds just the first high voltage pads 12A among the first high voltage pads 12A and the second high voltage pads 12B in plan view.

On the other hand, with the electronic component 181, the high voltage dummy pattern 173 surrounds both the first high voltage pads 12A and the second high voltage pads 12B. Also, the floating dummy pattern 177 is formed along an outer periphery of the high voltage dummy pattern 173 in plan view and surrounds both the first high voltage pads 12A and the second high voltage pads 12B.

Even with the electronic component 181 described above, the same effects as the effects described for the electronic component 5 can be exhibited. The electronic component 181 may also include the low voltage dummy pattern 162 according to the second preferred embodiment.

Figure 23:
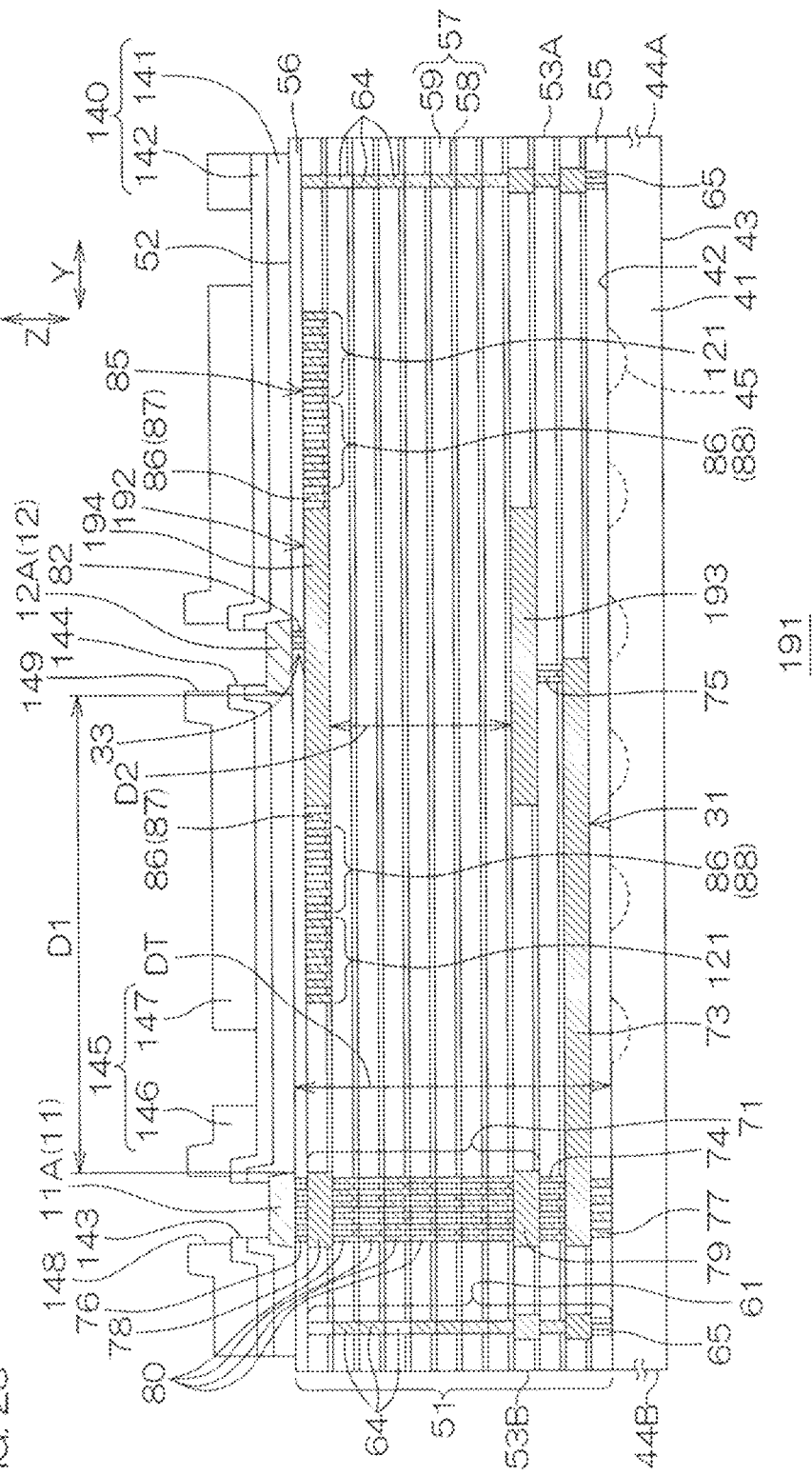
FIG. 23 is a sectional view of a region corresponding to FIG. 8 and is a sectional view of an electronic component according to a fifth preferred embodiment of the present invention.

FIG. 23 is a sectional view of a region corresponding to FIG. 8 and is a sectional view of an electronic component 191 according to a fifth preferred embodiment of the present invention. In the following, structures corresponding to the structures described with respect to the electronic component 5 are provided with the same reference symbols and description thereof is omitted.

The electronic component 5 described above has the plurality of transformers 21A to 21D each having a low voltage coil 22 and a high voltage coil 23. On the other hand, the electronic component 191 includes a plurality of capacitors 192 in place of the plurality of transformers 21A to 21D. The positioning of the plurality of capacitors 192 is the same as the positioning of the plurality of transformers 21A to 21D. In FIG. 23, just one capacitor 192 is shown.

In place of a low voltage coil 22 and a high voltage coil 23, the capacitors 192 each include a low voltage electrode 193 (low voltage pattern) of flat plate shape and a high voltage electrode 194 (high voltage pattern) of flat plate shape. The low voltage electrode 193 is electrically connected to low voltage pads 11 via a low voltage wiring 31. The low voltage electrode 193 is electrically connected to the lead-out wiring 73 via the second connection plug 75.

A planar shape of the low voltage electrode 193 is arbitrary. The low voltage electrode 193 may be formed to a polygonal shape such as a triangular shape, a quadrilateral shape, etc., or a circular shape or an elliptical shape in plan view. The low voltage electrode 193 is electrically connected to the corresponding low voltage pads 11 via the corresponding low voltage wiring 31.

The high voltage electrode 194 opposes the low voltage electrode 193 in the normal direction Z and accumulates charge with the low voltage electrode 193. The high voltage electrode 194 is electrically connected to high voltage pads 12 via a first high voltage wiring 33. The high voltage electrode 194 is electrically connected to the high voltage pads 12 via the pad plug electrode 82.

A planar shape of the high voltage electrode 194 is arbitrary. The high voltage electrode 194 may be formed to a polygonal shape such as a triangular shape, a quadrilateral shape, etc., or a circular shape or an elliptical shape in plan view. The high voltage electrode 194 is electrically connected to the corresponding high voltage pads 12 via the corresponding high voltage wiring 33.

With the electronic component 191 described above, the same effects as the effects described for the electronic component 5 can be exhibited. The electronic component 191 may also include the low voltage dummy pattern 162 according to the second preferred embodiment. Also, a structure that includes a capacitor 192 in place of a transformer 21 can be applied to the third preferred embodiment and the fourth preferred embodiment.

The preferred embodiments of the present invention can be implemented in yet other embodiments.

With each of the preferred embodiments described above, an example where the field electrode 61 is formed in the insulating laminated structure 51 was described. However, the field electrode 61 does not have to be formed necessarily and may be removed as necessary.

With each of the preferred embodiments described above, an example where the high voltage dummy pattern 86 or 173 is routed in the form of dense lines was described. However, the high voltage dummy pattern 86 or 173 may instead be formed as single wide conductor layer. In this case, the high voltage dummy pattern 86 or 173 is preferably formed to a shape having ends.

With each of the preferred embodiments described above, an example where the floating dummy pattern 121 or 177 is routed in the form of dense lines was described. However, the floating dummy pattern 121 or 177 may instead be formed as single wide conductor layer.

With each of the first preferred embodiment, the second preferred embodiment, and the fifth preferred embodiment described above, an example where the first high voltage dummy pattern 87 is routed in the form of dense lines was described. However, the first high voltage dummy pattern 87 may instead be formed as single wide conductor layer. In this case, the first high voltage dummy pattern 87 is preferably formed to a shape having ends.

With each of the first preferred embodiment, the second preferred embodiment, and the fifth preferred embodiment described above, an example where the second high voltage dummy pattern 88 is routed in the form of dense lines was described. However, the second high voltage dummy pattern 88 may instead be formed as single wide conductor layer. In this case, the second high voltage dummy pattern 88 is preferably formed to a shape having ends.

In each of the first preferred embodiment, the second preferred embodiment, and the fifth preferred embodiment described above, the low voltage coils 22 of the transformers 21A to 21D may respectively be formed at mutually different depth positions in the insulating laminated structure 51. For example, the low voltage coils 22 of the transformers 21A to 21D may be formed in any of the plurality of interlayer insulating layers 57 positioned in the first layer to the fifth layer as counted from the lowermost insulating layer 55. In consideration of the withstand voltage of the insulating laminated structure 51 and imbalance in the electric fields, the plurality of low voltage coils 22 are preferably formed in the same interlayer insulating layer 57.

In each of the first preferred embodiment, the second preferred embodiment, and the fifth preferred embodiment described above, the high voltage coils 23 of the transformers 21A to 21D may respectively be formed at mutually different depth positions in the insulating laminated structure 51. For example, the high voltage coils 23 of the transformers 21A to 21D may be formed in any of the plurality of interlayer insulating layers 57 positioned in the first layer to the fifth layer as counted from the uppermost insulating layer 56. In consideration of the withstand voltage of the insulating laminated structure 51 and imbalance in the electric fields, the plurality of high voltage coils 23 are preferably formed in the same interlayer insulating layer 57.

In each of the first preferred embodiment, the second preferred embodiment, and the fifth preferred embodiment described above, the first high voltage dummy pattern 87 may be formed in an upper layer or a lower layer with respect to a high voltage coil 23 in accordance with the positioning of the high voltage coil 23. For example, the first high voltage dummy pattern 87 may be formed in an interlayer insulating layer 57 that is one layer to three layers above or in an interlayer insulating layer 57 that is one layer to three layers below with respect to the high voltage coil 23.

In each of the first preferred embodiment, the second preferred embodiment, and the fifth preferred embodiment described above, the first high voltage dummy pattern 87 may have the first pattern 93, the second pattern 94, and the third pattern 95 that are formed in mutually different interlayer insulating layers 57 in accordance with the positioning of a high voltage coil 23.

The first pattern 93 may be formed in an upper layer or a lower layer with respect to a high voltage coil 23. For example, the first pattern 93 may be formed in an interlayer insulating layer 57 that is one layer to three layers above or in an interlayer insulating layer 57 that is one layer to three layers below with respect to the high voltage coil 23.

The second pattern 94 may be formed in an upper layer or a lower layer with respect to a high voltage coil 23. For example, the second pattern 94 may be formed in an interlayer insulating layer 57 that is one layer to three layers above or in an interlayer insulating layer 57 that is one layer to three layers below with respect to the high voltage coil 23.

The third pattern 95 may be formed in an upper layer or a lower layer with respect to a high voltage coil 23. For example, the third pattern 95 may be formed in an interlayer insulating layer 57 that is one layer to three layers above or in an interlayer insulating layer 57 that is one layer to three layers below with respect to the high voltage coil 23.

In each of the first preferred embodiment, the second preferred embodiment, and the fifth preferred embodiment described above, the floating dummy pattern 121 may be formed in an upper layer or a lower layer with respect to a high voltage coil 23 in accordance with the positioning of the high voltage coil 23. For example, the floating dummy pattern 121 may be formed in an interlayer insulating layer 57 that is one layer to three layers above or in an interlayer insulating layer 57 that is one layer to three layers below with respect to the high voltage coil 23.

In each of the first preferred embodiment, the second preferred embodiment, and the fifth preferred embodiment described above, the floating dummy pattern 121 may have the plurality of floating lines 122A to 122F that are formed in mutually different interlayer insulating layers 57 in accordance with the positioning of a high voltage coil 23. The plurality of floating lines 122A to 122F may be formed in upper layers or lower layers with respect to the high voltage coil 23. For example, the plurality of floating lines 122A to 122F may be formed in interlayer insulating layers 57 that are one layer to three layers above or in interlayer insulating layers 57 that are one layer to three layers below with respect to the high voltage coil 23.

In each of the first preferred embodiment, the second preferred embodiment, and the fifth preferred embodiment described above, the second high voltage dummy pattern 88 may be formed in an upper layer or a lower layer with respect to a high voltage coil 23 in accordance with the positioning of the high voltage coil 23. For example, the second high voltage dummy pattern 88 may be formed in an interlayer insulating layer 57 that is one layer to three layers above or in an interlayer insulating layer 57 that is one layer to three layers below with respect to the high voltage coil 23.

In each of the first preferred embodiment, the second preferred embodiment, and the fifth preferred embodiment described above, the second high voltage dummy pattern 88 may have the plurality of high voltage lines 116A to 116F that are formed in mutually different interlayer insulating layers 57 in accordance with the positioning of a high voltage coil 23. The plurality of high voltage lines 116A to 116F may be formed in upper layers or lower layers with respect to the high voltage coil 23. For example, the plurality of high voltage lines 116A to 116F may be formed in interlayer insulating layers 57 that are one layer to three layers above or in interlayer insulating layers 57 that are one layer to three layers below with respect to the high voltage coil 23.

In the second preferred embodiment described above, the low voltage dummy pattern 162 may be formed in an upper layer or a lower layer with respect to a high voltage coil 23 in accordance with the positioning of the high voltage coil 23. For example, the low voltage dummy pattern 162 may be formed in an interlayer insulating layer 57 that is one layer to three layers above or in an interlayer insulating layer 57 that is one layer to three layers below with respect to the high voltage coil 23.

In the second preferred embodiment described above, the low voltage dummy pattern 162 may have the plurality of low voltage lines 164A to 163C that are formed in mutually different interlayer insulating layers 57. The plurality of low voltage lines 164A to 163C may be formed in upper layers or lower layers with respect to the high voltage coil 23. For example, the plurality of low voltage lines 164A to 163C may be formed in interlayer insulating layers 57 that are one layer to three layers above or in interlayer insulating layers 57 that are one layer to three layers below with respect to the high voltage coil 23.

In each of the third preferred embodiment and the fourth preferred embodiment described above, the high voltage dummy pattern 173 may be formed in an upper layer or a lower layer with respect to the high voltage coil 23 in accordance with the positioning of the high voltage coil 23. For example, the high voltage dummy pattern 173 may be formed in an interlayer insulating layer 57 that is one layer to three layers above or in an interlayer insulating layer 57 that is one layer to three layers below with respect to the high voltage coil 23.

In each of the third preferred embodiment and the fourth preferred embodiment described above, the high voltage dummy pattern 173 may have the plurality of high voltage lines 175A to 175F that are formed in mutually different interlayer insulating layers 57 in accordance with the positioning of the high voltage coil 23. The plurality of high voltage lines 175A to 175F may be formed in upper layers or lower layers with respect to the high voltage coil 23. For example, the plurality of high voltage lines 175A to 175F may be formed in interlayer insulating layers 57 that are one layer to three layers above or in interlayer insulating layers 57 that are one layer to three layers below with respect to the high voltage coil 23.

In each of the third preferred embodiment and the fourth preferred embodiment described above, the floating dummy pattern 177 may be formed in an upper layer or a lower layer with respect to the high voltage coil 23 in accordance with the positioning of the high voltage coil 23. For example, the floating dummy pattern 177 may be formed in an interlayer insulating layer 57 that is one layer to three layers above or in an interlayer insulating layer 57 that is one layer to three layers below with respect to the high voltage coil 23.

In each of the third preferred embodiment and the fourth preferred embodiment described above, the floating dummy pattern 177 may have the plurality of floating lines 178A to 178F that are formed in mutually different interlayer insulating layers 57 in accordance with the positioning of the high voltage coil 23. The plurality of floating lines 178A to 178F may be formed in upper layers or lower layers with respect to the high voltage coil 23. For example, the plurality of floating lines 178A to 178F may be formed in interlayer insulating layers 57 that are one layer to three layers above or in interlayer insulating layers 57 that are one layer to three layers below with respect to the high voltage coil 23.

With each of the first preferred embodiment, the second preferred embodiment, and the fifth preferred embodiment described above, an example where the first pattern 93, the second pattern 94, and the third pattern 95 include the plurality of first intermediate lines 98, the plurality of second intermediate lines 104, and the plurality of third intermediate lines 110 that extend as bands along the first direction X was described.

However, the forms of the first pattern 93, the second pattern 94, and the third pattern 95 are not restricted to the forms shown in FIG. 10 to FIG. 12 as long as the electric field concentration with respect to the high voltage coils 23 can be suppressed. The first pattern 93, the second pattern 94, and the third pattern 95 may, for example, have the forms shown in FIG. 24A and FIG. 24B.

FIG. 24A is an enlarged view of a region corresponding to FIG. 11 and is a diagram of the first high voltage dummy pattern 87 according to a first modification example. Although the second pattern 94 is shown as an example in FIG. 24A, the same structure can be applied to the first pattern 93 and the third pattern 95. In the following, structures corresponding to the structures described with respect to the electronic component 5 are provided with the same reference symbols and description thereof is omitted.

Referring to FIG. 24A, in this configuration example, the second pattern 94 includes a plurality of the second intermediate lines 104 that extend in a direction that intersects the direction of opposing of mutually adjacent high voltage coils 23 (first direction X). In this embodiment, the plurality of second intermediate lines 104 are formed at intervals along the first direction X and respectively extend as bands in the second direction Y.

The plurality of second intermediate lines 104 are formed as stripes extending along the second direction Y as a whole in plan view. Connection modes of the second outer peripheral line 97 and the third outer peripheral line 103 with respect to the plurality of second intermediate lines 104 are arbitrary and not restricted to a specific form.

Even in a case where the first high voltage dummy pattern 87 having such a form is formed, the same effects as the effects described for the electronic component 5 can be exhibited.

FIG. 24B is an enlarged view of a region corresponding to FIG. 11 and is a diagram of the first high voltage dummy pattern 87 according to a second modification example. Although the second pattern 94 is shown as an example in FIG. 24B, the same structure can be applied to the first pattern 93 and the third pattern 95. In the following, structures corresponding to the structures described with respect to the electronic component 5 are provided with the same reference symbols and description thereof is omitted.

Referring to FIG. 24B, the second pattern 94 is formed, in plan view, in a meandering shape that integrally includes the second outer peripheral line 97, the third outer peripheral line 103, and the plurality of second intermediate lines 104. In this embodiment, the plurality of second intermediate lines 104 are formed at intervals along the second direction Y and respectively extend as bands along the first direction X.

The plurality of second intermediate lines 104 are formed as stripes extending along the first direction X as a whole in plan view. That is, the second pattern 94 is formed in a meandering shape extending along the first direction X as a whole in plan view.

The second pattern 94 may instead be formed in a meandering shape extending along the second direction Y as a whole in plan view. In this case, the plurality of second intermediate lines 104 may be formed at intervals along the first direction X and respectively extend as bands along the second direction Y. That is, the plurality of second intermediate lines 104 may be formed as stripes extending along the second direction Y as a whole in plan view.

Even in a case where the first high voltage dummy pattern 87 having such a form is formed, the same effects as the effects described for the electronic component 5 can be exhibited.

With each of the first preferred embodiment and the second preferred embodiment described above, an example where the electronic component 5 or 161 includes four transformers 21 was described. However, the electronic component 5 or 161 may include just two transformers 21 instead. Also, the electronic component 5 or 161 may include just three transformers 21 instead.

With the fifth preferred embodiment described above, an example where the electronic component 191 includes four capacitors 192 was described. However, the electronic component 191 may include just two capacitors 192 instead. Also, the electronic component 191 may include just three capacitors 192 instead.

Figure 25:
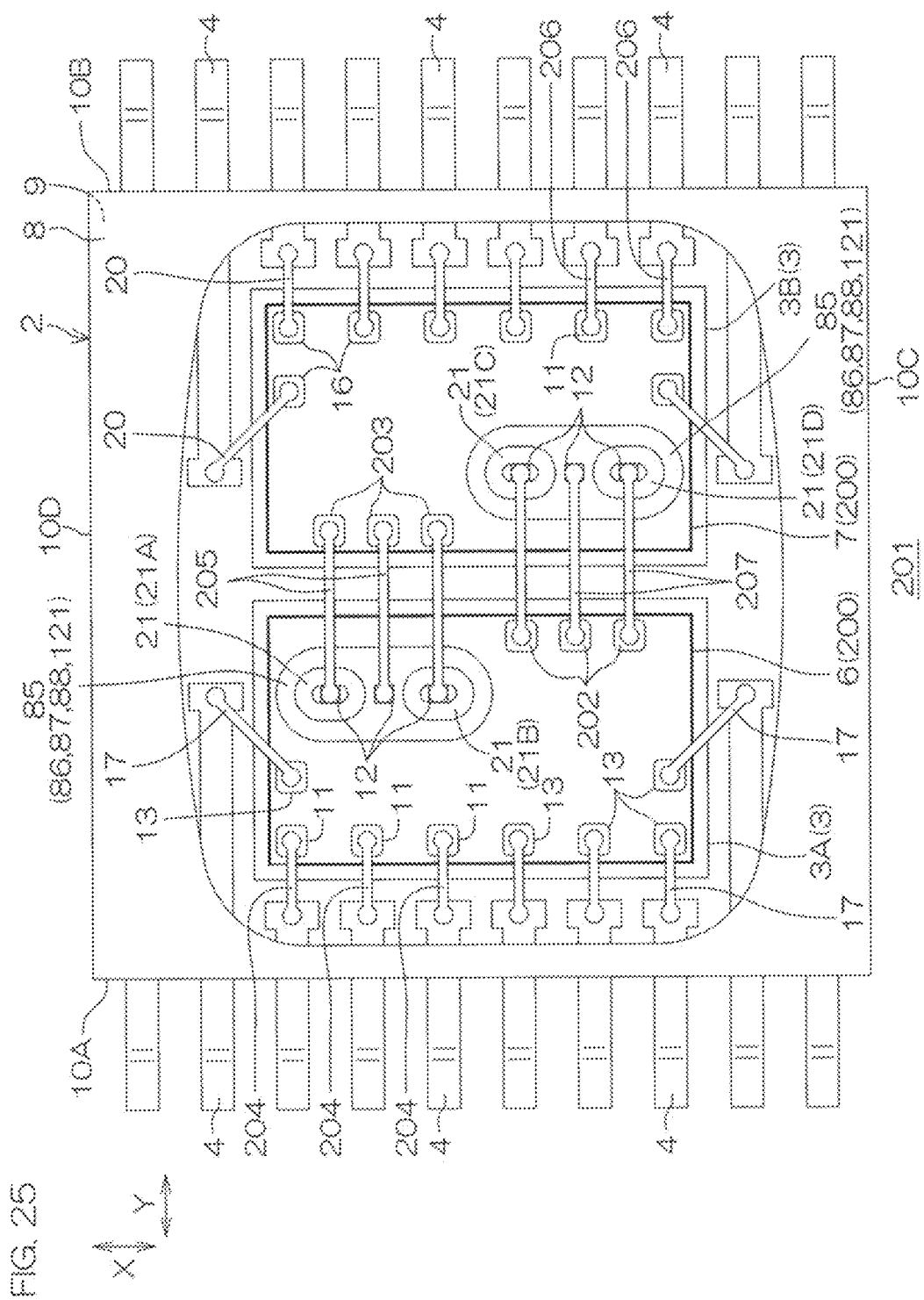
FIG. 25 is a plan view of an electronic component module in which an electronic component according to a modification example is incorporated.

FIG. 25 is a plan view of an electronic component module 201 in which an electronic component 200 according to a modification example is incorporated. In the following, structures corresponding to structures described with respect to the electronic component module 1 (see FIG. 1) are provided with the same reference symbols and description thereof is omitted.

The electronic component module 1 described above includes the electronic component 5, the controller IC chip 6, and the driver IC chip 7. On the other hand, the electronic component module 201 includes a plurality of electronic components 200. The plurality of electronic components 200 include the controller IC chip 6 in which two transformers 21 (the first transformer 21A and the second transformer 21B) are incorporated and the driver IC chip 7 in which two transformers 21 (the third transformer 21C and the fourth transformer 21D) are incorporated.

Although specific illustration shall be omitted, the controller IC chip 6 includes a plurality of the low voltage pads 11, a plurality of the high voltage pads 12, a plurality of the first low voltage wirings 31, a plurality of the second low voltage wirings 32, a plurality of the first high voltage wirings 33, and a plurality of the second high voltage wirings 34 for the first transformer 21A and the second transformer 21B.

Also, the controller IC chip 6 includes at least one (preferably all) of the first high voltage dummy pattern 87, the floating dummy pattern 121, and the second high voltage dummy pattern 88. Also, the controller IC chip 6 further includes a plurality of high voltage pads 202 for the third transformer 21C and the fourth transformer 21D.

Also, although specific illustration shall be omitted, the driver IC chip 7 includes a plurality of the low voltage pads 11, a plurality of the high voltage pads 12, a plurality of the first low voltage wirings 31, a plurality of the second low voltage wirings 32, a plurality of the first high voltage wirings 33, and a plurality of the second high voltage wirings 34 for the third transformer 21C and the fourth transformer 21D.

Also, the driver IC chip 7 includes at least one (preferably all) of the first high voltage dummy pattern 87, the floating dummy pattern 121, and the second high voltage dummy pattern 88. Also, the driver IC chip 7 further includes a plurality of high voltage pads 203 for the first transformer 21A and the fourth transformer 21B.

The plurality of low voltage pads 11 of the controller IC chip 6 are electrically connected via low voltage wires 204 to arbitrary lead terminals 4 used as ground terminals. The plurality of high voltage pads 12 of the controller IC chip 6 are electrically connected via high voltage wires 205 to the plurality of high voltage pads 203 of the driver IC chip 7.

The plurality of low voltage pads 11 of the driver IC chip 7 are electrically connected via low voltage wires 206 to arbitrary lead terminals 4 used as ground terminals. The plurality of high voltage pads 12 of the driver IC chip 7 are electrically connected via high voltage wires 207 to the plurality of high voltage pads 202 of the controller IC chip 6.

Even when the controller IC chip 6 (electronic component 200) with the first transformer 21A and the second transformer 21B incorporated therein is adopted, the same effects as the effects described for the electronic component 5 can be exhibited. Also, even when the driver IC chip 7 (electronic component 200) with the third transformer 21C and the fourth transformer 21D incorporated therein is adopted, the same effects as the effects described for the electronic component 5 can be exhibited.

Examples of features extracted from the present description and drawings are indicated below.

[A1] An electronic component comprising: an insulating layer that has a principal surface; a passive device that includes a low voltage pattern that is formed in the insulating layer and a high voltage pattern that is formed in the insulating layer such as to oppose the low voltage pattern in a normal direction to the principal surface and to which a voltage exceeding a voltage to be applied to the low voltage pattern is to be applied; and a shield conductor layer that is formed in the insulating layer such as to be positioned in a periphery of the high voltage pattern in plan view, shields an electric field formed between the low voltage pattern and the high voltage pattern, and suppresses electric field concentration with respect to the high voltage pattern.

[A2] The electronic component according to A1, wherein the shield conductor layer is formed of a pattern differing from the high voltage pattern.

[A3] The electronic component according to A1 or A2, wherein the shield conductor layer is formed in a region in closer proximity to the high voltage pattern than the low voltage pattern in the insulating layer.

[A4] The electronic component according to any one of A1 to A3, wherein the shield conductor layer includes a high voltage dummy pattern that is formed in the insulating layer such as to be positioned in a periphery of the high voltage pattern in plan view and to which a voltage exceeding the voltage to be applied to the low voltage pattern is to be applied.

[A5] The electronic component according to A4, wherein the high voltage dummy pattern surrounds the high voltage pattern in plan view.

[A6] The electronic component according to A4 or A5, wherein the high voltage dummy pattern is formed to a shape having ends.

[A7] The electronic component according to any one of A1 to A3, wherein the shield conductor layer includes a floating dummy pattern formed in an electrically floating state such as to be positioned in a periphery of the high voltage pattern in the insulating layer in plan view.

[A8] The electronic component according to A7, wherein the floating dummy pattern surrounds the high voltage pattern in plan view.

[A9] The electronic component according to any one of A1 to A3, wherein the shield conductor layer includes a high voltage dummy pattern that is formed in the insulating layer such as to be positioned in a periphery of the high voltage pattern in plan view and to which a voltage exceeding the voltage to be applied to the low voltage pattern is to be applied and a floating dummy pattern that is formed in an electrically floating state such as to be positioned in a periphery of the high voltage dummy pattern in the insulating layer in plan view.

[A10] The electronic component according to A9, wherein the high voltage dummy pattern surrounds the high voltage pattern in plan view.

[A11] The electronic component according to A10, wherein the floating dummy pattern surrounds the high voltage dummy pattern in plan view.

[A12] The electronic component according to any one of A9 to A11, wherein the high voltage dummy pattern is formed to a shape having ends.

[A13] The electronic component according to any one of A1 to A12, further comprising: a low voltage pad formed on the principal surface; and wherein the high voltage pattern is formed at an interval from the low voltage pad in plan view, a voltage exceeding a voltage to be applied to the low voltage pad is to be applied to the high voltage pattern, and the shield conductor layer is interposed in a region between the low voltage pad and the high voltage pattern in plan view.

[A14] The electronic component according to A13, wherein the low voltage pattern is electrically connected to the low voltage pad.

[A15] The electronic component according to any one of A1 to A12, further comprising: a field electrode formed in the insulating layer and along a peripheral edge of the insulating layer; and wherein the high voltage pattern is formed at an interval from the field electrode in plan view, a voltage exceeding a voltage to be applied to the field electrode is to be applied to the high voltage pattern, and the shield conductor layer is interposed in a region between the field electrode and the high voltage pattern in plan view.

[A16] The electronic component according to A15, wherein the low voltage pattern is electrically connected to the field electrode.

[A17] The electronic component according to any one of A1 to A12, further comprising: a field electrode formed in the insulating layer and along a peripheral edge of the insulating layer; and a low voltage pad formed on the principal surface; and wherein the high voltage pattern is formed at intervals from the field electrode and the low voltage pad in plan view, a voltage exceeding a voltage to be applied to the field electrode and a voltage to be applied to the low voltage pad is to be applied to the high voltage pattern, and the shield conductor layer is interposed in a region between the field electrode and the high voltage pattern in plan view and a region between the low voltage pad and the high voltage pattern in plan view.

[A18] The electronic component according to A17, wherein the low voltage pattern is electrically connected to the field electrode and the low voltage pad.

[A19] The electronic component according to any one of A1 to A18, wherein the shield conductor layer surrounds the high voltage pattern in plan view.

[A20] An electronic component comprising: an insulating layer that has a principal surface; a plurality of passive devices that are formed in the insulating layer at an interval from each other and each include a low voltage pattern that is formed in the insulating layer and a high voltage pattern that is formed in the insulating layer such as to oppose the low voltage pattern in a normal direction to the principal surface and to which a voltage exceeding a voltage to be applied to the low voltage pattern is to be applied; and a high voltage dummy pattern that is formed in peripheries of a plurality of the high voltage patterns such as to be interposed in a region between mutually adjacent ones of the plurality of high voltage patterns in the insulating layer and to which a voltage exceeding the voltage to be applied to the low voltage patterns is to be applied.

[A21] The electronic component according to A20, wherein the high voltage dummy pattern is formed of a pattern differing from the plurality of high voltage patterns.

[A22] The electronic component according to A20 or A21, wherein the high voltage dummy pattern is formed to a shape having ends.

[A23] The electronic component according to any one of A20 to A22, wherein the high voltage dummy pattern includes a first high voltage dummy pattern that is interposed in the region between the mutually adjacent ones of the plurality of high voltage patterns and a second high voltage dummy pattern that is formed such as to be oriented along at least one of the high voltage patterns in a region outside the region between the mutually adjacent ones of the plurality of high voltage patterns.

[A24] The electronic component according to A23, wherein the first high voltage dummy pattern includes a portion extending along a direction of opposing of the mutually adjacent ones of the plurality of high voltage patterns in plan view.

[A25] The electronic component according to A23 or A24, wherein the second high voltage dummy pattern is formed integral to the first high voltage dummy pattern.

[A26] The electronic component according to any one of A20 to A25, further comprising: a floating dummy pattern formed in an electrically floating state in the insulating layer such as to be oriented along a periphery of at least one of the high voltage patterns in plan view.

[A27] The electronic component according to A26, wherein the floating dummy pattern is formed in a region outside the region between the mutually adjacent ones of the plurality of high voltage patterns in plan view.

[A28] The electronic component according to A27, wherein the high voltage dummy pattern includes a portion oriented along at least one of the high voltage patterns in a region outside the region between the mutually adjacent ones of the plurality of high voltage patterns in plan view and the floating dummy pattern opposes the high voltage pattern across the high voltage dummy pattern in plan view.

[A29] The electronic component according to A27 or A28, wherein the floating dummy pattern entirely surrounds the plurality of high voltage patterns and the high voltage dummy pattern in plan view.

[A30] The electronic component according to any one of A1 to A29, wherein the passive device is a transformer that includes a low voltage coil as the low voltage pattern and a high voltage coil as the high voltage pattern.

[A31] The electronic component according to any one of A1 to A29, wherein the passive device is a capacitor that includes a low voltage electrode as the low voltage pattern and a high voltage electrode as the high voltage pattern.

The present application claims priority based on Japanese Patent Application No. 2019-043036 filed in the Japan Patent Office on Mar. 8, 2019 and the entire disclosure of this application is incorporated herein by reference.

While preferred embodiments of the present invention have been described in detail, these are merely specific examples used to clarify the technical contents of the present invention and the present invention should not be interpreted as being limited to these specific examples and the scope of the present invention is to be limited only by the appended claims.

DESCRIPTION OF SYMBOLS 5 electronic component
11 low voltage pad
11A low voltage pad
11B low voltage pad
11C low voltage pad
11D low voltage pad
11E low voltage pad
11F low voltage pad
21 transformer
21A first transformer
21B second transformer
21C third transformer
21D fourth transformer
22 low voltage coil
23 high voltage coil
51 insulating laminated structure
52 insulating principal surface
61 field electrode
85 shield conductor layer
86 high voltage dummy pattern
87 first high voltage dummy pattern
88 second high voltage dummy pattern
121 floating dummy pattern
161 electronic component
171 electronic component
181 electronic component
191 electronic component
192 capacitor
193 low voltage electrode
194 high voltage electrode
200 electronic component

The invention claimed is:

1. An electronic component comprising:
an insulating layer that has a principal surface;
a passive device that includes a low voltage pattern that is formed in the insulating layer and a high voltage pattern that is formed in the insulating layer such as to oppose the low voltage pattern in a normal direction to the principal surface and to which a voltage exceeding a voltage to be applied to the low voltage pattern is to be applied; and
a shield conductor layer that is formed in the insulating layer such as to be positioned in a periphery of the high voltage pattern in plan view, shields an electric field formed between the low voltage pattern and the high voltage pattern, and suppresses electric field concentration with respect to the high voltage pattern.

2. The electronic component according to claim 1, wherein
the shield conductor layer is formed of a pattern differing from the high voltage pattern.

3. The electronic component according to claim 1, wherein
the shield conductor layer is formed in a region in closer proximity to the high voltage pattern than the low voltage pattern in the insulating layer.

4. The electronic component according to claim 1, wherein
the shield conductor layer includes a high voltage dummy pattern that is formed in the insulating layer such as to be positioned in a periphery of the high voltage pattern in plan view and to which a voltage exceeding the voltage to be applied to the low voltage pattern is to be applied.

5. The electronic component according to claim 4, wherein
the high voltage dummy pattern surrounds the high voltage pattern in plan view.

6. The electronic component according to claim 5, wherein
the high voltage dummy pattern is formed to a shape having ends.

7. The electronic component according to claim 1, wherein
the shield conductor layer includes a floating dummy pattern formed in an electrically floating state such as to be positioned in a periphery of the high voltage pattern in the insulating layer in plan view.

8. The electronic component according to claim 7, wherein
the floating dummy pattern surrounds the high voltage pattern in plan view.

9. The electronic component according to claim 1, wherein
the shield conductor layer includes a high voltage dummy pattern that is formed in the insulating layer such as to be positioned in a periphery of the high voltage pattern in plan view and to which a voltage exceeding the voltage to be applied to the low voltage pattern is to be applied and a floating dummy pattern that is formed in an electrically floating state such as to be positioned in a periphery of the high voltage dummy pattern in the insulating layer in plan view.

10. The electronic component according to claim 9, wherein
the high voltage dummy pattern surrounds the high voltage pattern in plan view.

11. The electronic component according to claim 10, wherein
the floating dummy pattern surrounds the high voltage dummy pattern in plan view.

12. The electronic component according to claim 9, wherein
the high voltage dummy pattern is formed to a shape having ends.

13. The electronic component according to claim 1, further comprising:
a low voltage pad formed on the principal surface; and
wherein the high voltage pattern is formed at an interval from the low voltage pad in plan view,
a voltage exceeding a voltage to be applied to the low voltage pad is to be applied to the high voltage pattern, and
the shield conductor layer is interposed in a region between the low voltage pad and the high voltage pattern in plan view.

14. The electronic component according to claim 13, wherein
the low voltage pattern is electrically connected to the low voltage pad.

15. The electronic component according to claim 1, further comprising:
a field electrode formed in the insulating layer along a peripheral edge of the insulating layer; and
wherein the high voltage pattern is formed at an interval from the field electrode in plan view,
a voltage exceeding a voltage to be applied to the field electrode is to be applied to the high voltage pattern, and
the shield conductor layer is interposed in a region between the field electrode and the high voltage pattern in plan view.

16. The electronic component according to claim 15, wherein
the low voltage pattern is electrically connected to the field electrode.

17. The electronic component according to claim 1, further comprising:
a field electrode formed in the insulating layer along a peripheral edge of the insulating layer, and
a low voltage pad formed on the principal surface; and
wherein the high voltage pattern is formed at intervals from the field electrode and the low voltage pad in plan view,
a voltage exceeding a voltage to be applied to the field electrode and a voltage to be applied to the low voltage pad is to be applied to the high voltage pattern, and
the shield conductor layer is interposed in a region between the field electrode and the high voltage pattern in plan view and a region between the low voltage pad and the high voltage pattern in plan view.

18. The electronic component according to claim 17, wherein
the low voltage pattern is electrically connected to the field electrode and the low voltage pad.

19. The electronic component according to claim 18, wherein
the shield conductor layer surrounds the high voltage pattern in plan view.

20. An electronic component comprising:
an insulating layer that has a principal surface;
a plurality of passive devices that are formed in the insulating layer at an interval from each other and each include a low voltage pattern that is formed in the insulating layer and a high voltage pattern that is formed in the insulating layer such as to oppose the low voltage pattern in a normal direction to the principal surface and to which a voltage exceeding a voltage to be applied to the low voltage pattern is to be applied; and
a high voltage dummy pattern that is formed in peripheries of a plurality of the high voltage patterns such as to be interposed in a region between mutually adjacent ones of the plurality of high voltage patterns in the insulating layer and to which a voltage exceeding the voltage to be applied to the low voltage patterns is to be applied.

21. The electronic component according to claim 20, wherein
the high voltage dummy pattern is formed of a pattern differing from the plurality of high voltage patterns.

22. The electronic component according to claim 21, wherein
the high voltage dummy pattern is formed to a shape having ends.

23. The electronic component according to claim 22, wherein
the high voltage dummy pattern includes a first high voltage dummy pattern that is interposed in the region between the mutually adjacent ones of the plurality of high voltage patterns and a second high voltage dummy pattern that is formed such as to be oriented along at least one of the high voltage patterns in a region outside the region between the mutually adjacent ones of the plurality of high voltage patterns.

24. The electronic component according to claim 23, wherein
the first high voltage dummy pattern includes a portion extending along a direction of opposing of the mutually adjacent ones of the plurality of high voltage patterns in plan view.

25. The electronic component according to claim 24, wherein
the second high voltage dummy pattern is formed integral to the first high voltage dummy pattern.

26. The electronic component according to claim 25, further comprising:
a floating dummy pattern formed in an electrically floating state in the insulating layer such as to be oriented along a periphery of at least one of the high voltage patterns in plan view.

27. The electronic component according to claim 26, wherein
the floating dummy pattern is formed in a region outside the region between the mutually adjacent ones of the plurality of high voltage patterns in plan view.

28. The electronic component according to claim 27, wherein
the high voltage dummy pattern includes a portion oriented along at least one of the high voltage patterns in a region outside the region between the mutually adjacent ones of the plurality of high voltage patterns in plan view and
the floating dummy pattern opposes the high voltage pattern across the high voltage dummy pattern in plan view.

29. The electronic component according to claim 28, wherein
the floating dummy pattern entirely surrounds the plurality of high voltage patterns and the high voltage dummy pattern in plan view.

30. The electronic component according to claim 1, wherein
the passive device is a transformer that includes a low voltage coil as the low voltage pattern and a high voltage coil as the high voltage pattern.

31. The electronic component according to claim 1, wherein
the passive device is a capacitor that includes a low voltage electrode as the low voltage pattern and a high voltage electrode as the high voltage pattern.

* * * * *